United States Patent
Man et al.

(10) Patent No.: US 9,682,854 B2
(45) Date of Patent: Jun. 20, 2017

(54) WAFER LEVEL CHIP SCALE PACKAGED MICRO-ELECTRO-MECHANICAL-SYSTEM (MEMS) DEVICE AND METHODS OF PRODUCING THEREOF

(71) Applicant: MEMSIC, INC., Andover, MA (US)

(72) Inventors: Piu Francis Man, Lexington, MA (US); Anru Andrew Cheng, Cupertino, CA (US)

(73) Assignee: MEMSIC, INC, Andover, MA (US)

(*) Notice: Subject to any disclaimer, the term of this patent is extended or adjusted under 35 U.S.C. 154(b) by 17 days.

(21) Appl. No.: 14/683,444

(22) Filed: Apr. 10, 2015

(65) Prior Publication Data

US 2016/0297674 A1 Oct. 13, 2016

(51) Int. Cl.
*B81B 7/00* (2006.01)
*B81C 1/00* (2006.01)

(52) U.S. Cl.
CPC ........ *B81B 7/0077* (2013.01); *B81C 1/00333* (2013.01); *B81B 2207/012* (2013.01); *B81B 2207/095* (2013.01); *B81C 2203/0109* (2013.01); *B81C 2203/0145* (2013.01); *B81C 2203/0792* (2013.01)

(58) Field of Classification Search
CPC ............ B81B 7/0077; B81B 2207/012; B81B 2207/095
See application file for complete search history.

(56) References Cited

U.S. PATENT DOCUMENTS

| | | | |
|---|---|---|---|
| 6,972,480 B2 | 12/2005 | Zilber et al. | |
| 7,262,622 B2 | 8/2007 | Zhao | |
| 7,295,029 B2 | 11/2007 | Zhao | |
| 7,442,570 B2 | 10/2008 | Nasiri et al. | |
| 7,495,462 B2 | 2/2009 | Hua et al. | |
| 7,968,958 B2* | 6/2011 | Fujii | B81B 7/007 257/415 |
| 2005/0170656 A1* | 8/2005 | Nasiri | B81C 1/00238 438/700 |
| 2008/0277258 A1* | 11/2008 | Foster | H01H 59/0009 200/512 |
| 2010/0258950 A1* | 10/2010 | Li | B81C 1/00269 257/777 |
| 2016/0130137 A1* | 5/2016 | Huang | B81B 7/02 257/415 |

* cited by examiner

*Primary Examiner* — Peniel M Gumedzoe
(74) *Attorney, Agent, or Firm* — Preti Flaherty Beliveau & Pachios

(57) ABSTRACT

Packaged MEMS devices are described. One such device includes a substrate having an active surface with an integrated circuit. Two substrate pads are formed on the substrate; one pad is a closed ring pad. The device also includes a cap wafer with two wafer pads. One of these wafer pads is also a closed ring pad. A hermetic seal ring is formed by a first bonding between the two ring pads. The device has a gap between the substrate and the cap wafer. This gap may be filled with a pressurized gas. An electrical connection is formed by a second bonding between one substrate pad and one wafer pad. An electrical contact is disposed over the cap wafer. The device also includes an insulation layer between the electrical contact and the cap wafer. Methods of producing the packaged MEMS devices are also described.

15 Claims, 62 Drawing Sheets

Eutectic bonding

Si wet etch

307

Passivation layer deposition

308

Via reveal: wet or dry etch

RDL deposition and pattern

Top passivation layer deposition

Via reveal: wet or dry etch

Top metal pad deposition

Integrated circuit wafer with bottom metal pads

DRIE Si etch

501

Liner oxide 502

Conductive material filling 503

Chemical mechanical polish/remove top side filling

Top metal pad deposition

504

505

Silicon Wet/Dry Etch

Integrated circuit substrate — 506

Eutectic bonding

Si wet etch

507

DRIE Si etch

601

Via liner oxide

602

Conductive material filling

603

Chemical Mechanical Polish

Top metal deposition

Silicon Wet Etch

Integrated circuit substrate with bottom metal pad

Eutectic bonding

Passivation layer deposition

Via reveal: wet or dry etch

Metal deposition and pattern

Passivation layer deposition

705

Via reveal: wet or dry etch

706

Top metal pads deposition

707

Integrated circuit wafer with bottom metal pads

Eutectic bonding

RDL

Wet Si Etch

DRIE Si Etch

Via liner oxide

Conductive material filling

Top metal deposition

Integrated circuit substrate with bottom metal pad

Eutectic Bonding

Chemical Mechanical Polish

Passivation layer deposition and via reveal

Top metal deposition and pattern

Wet Si Etch

DRIE Si Etch

Via liner oxide

Conductive material filling

Top metal pad deposition

Integrated circuit substrate with bottom metal pad

Eutectic Bonding

Chemical Mechanical Polish

Passivation layer deposition and via reveal

RDL

Top passivation layer deposition

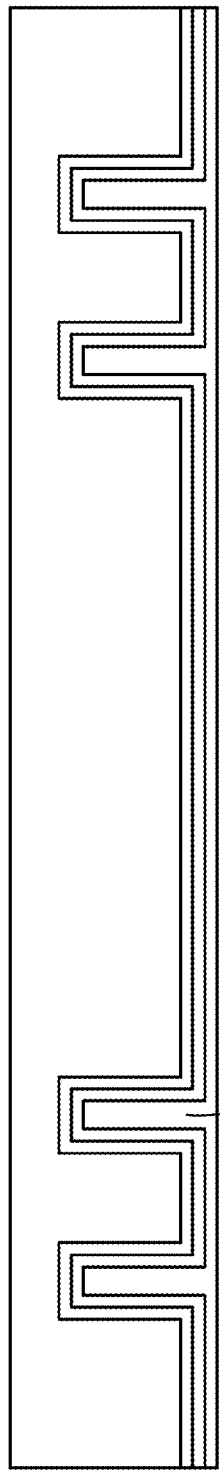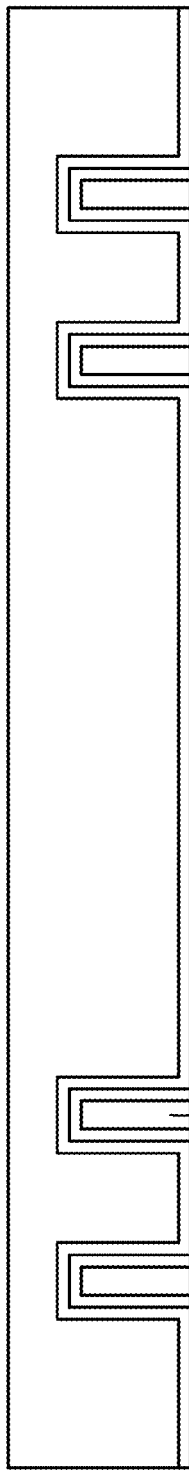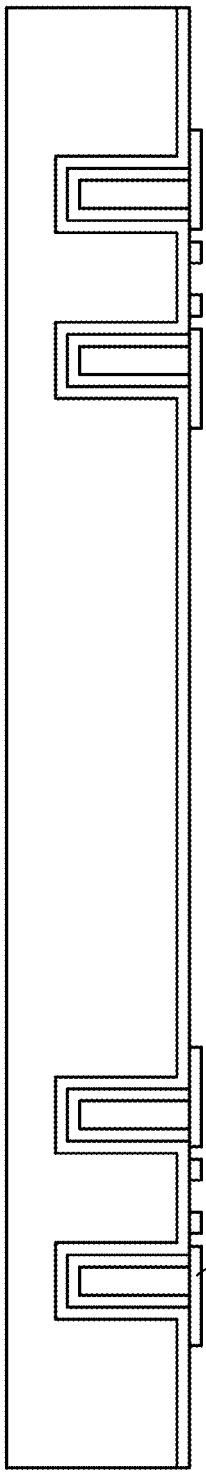

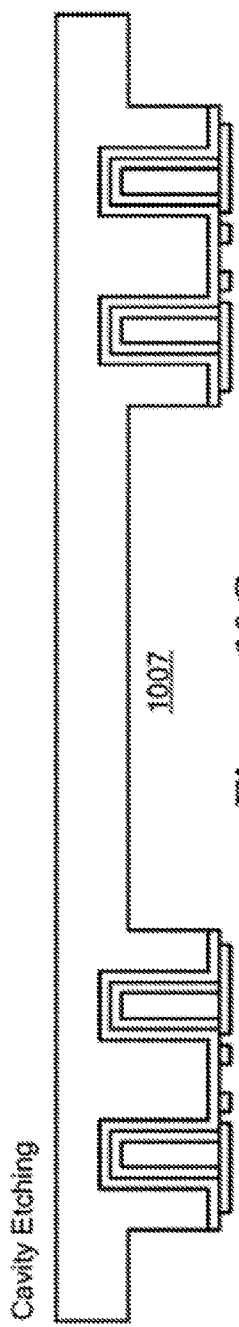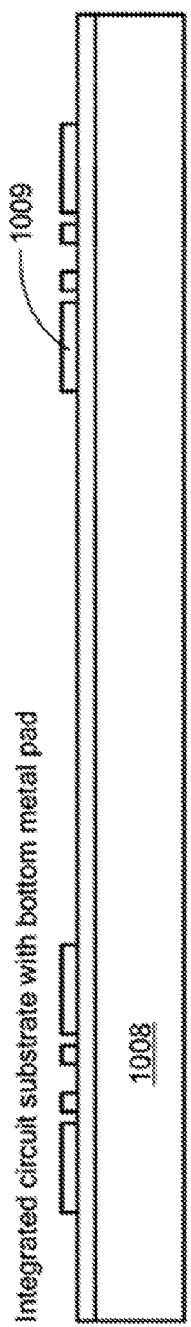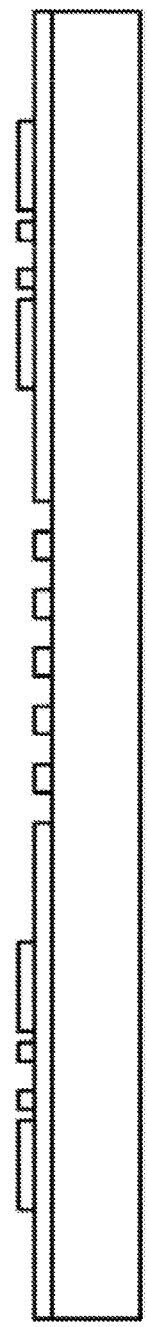

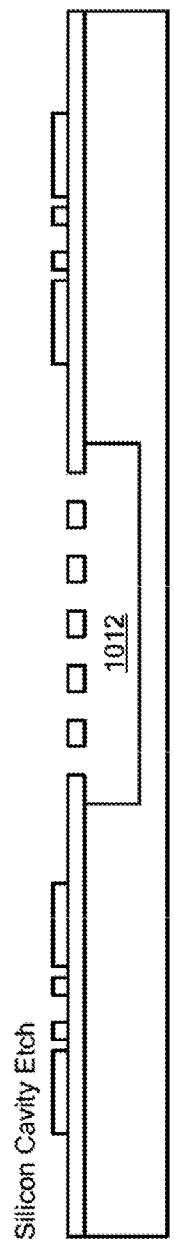
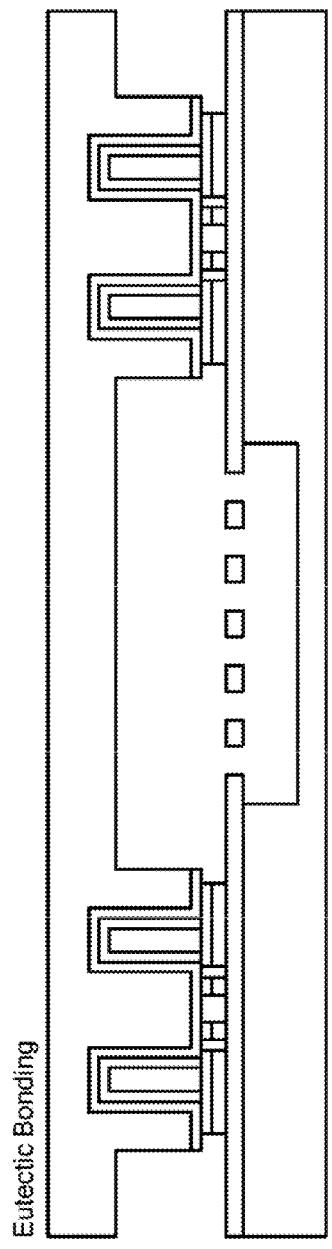
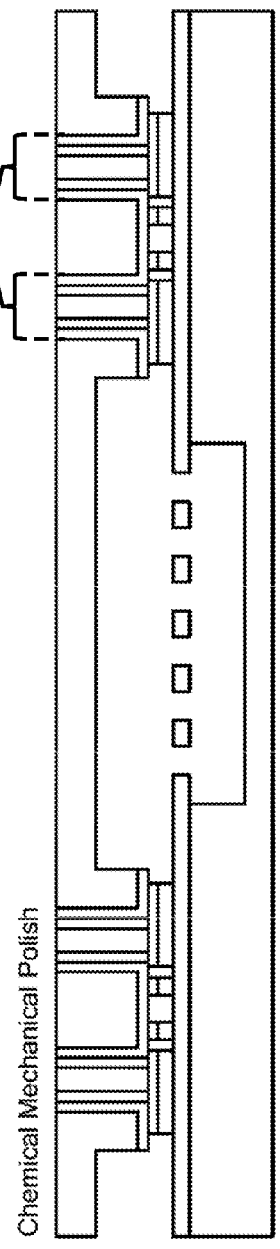
Figure 10J
Figure 10K
Figure 10L

Cavity etch

Cap wafer

Bonding

TSV Conductive Material Deposition

Chemical Mechanical Polish

Metal pad deposition and pattern

Passivation layer deposition

Cavity etch hole formation

Silicon Cavity Etch

Cavity etch

Bonding

Chemical Mechanical Polish

WAFER LEVEL CHIP SCALE PACKAGED MICRO-ELECTRO-MECHANICAL-SYSTEM (MEMS) DEVICE AND METHODS OF PRODUCING THEREOF

STATEMENT REGARDING FEDERALLY SPONSORED RESEARCH OR DEVELOPMENT

N/A

BACKGROUND

Field of the Technology

Various embodiments relate generally to wafer level chip scale packaging integrated circuit device. Particularly, embodiments may relate to wafer level chip scale packaging micro-electro-mechanical-system (MEMS) devices integrated with integrated circuit.

Background

Wafer-level chip scale packaging (WLCSP) is commonly used in integrated circuit, complementary metal-oxide-semiconductor (CMOS) imager, and MEMS industry. Since WLCSP does not require lead frame and wire bonding, its cost to packaging becomes very attractive. One of the technical requirements of WLCSP is the ability of connecting electrical contact(s) from one side of the substrate to contact(s) on the other side of the substrate. To date, there are two technologies that enable WLCSP: bulk WLCSP (through silicon vias (TSV)) and surface WLCSP (see U.S. Pat. No. 6,972,480 originally assigned to Shellcase).

Bulk WLCSP: Conventionally, TSVs makes vias and connects through a chip scale packaging layer which is typically a silicon substrate. The conductors run through the bulk of the substrate. Such a packaging scheme is termed bulk WLCSP. Common TSV formation processes include etching into a silicon substrate to form TSV trench followed by deposition of an insulation layer covering the bottom and the sidewall of the silicon trench. The TSV trench is then filled with a conductive material typically in-situ doped poly-silicon or copper. However, TSV requires deep silicon etching which is costly. The cost of deep silicon etching is proportional to how deep it etches. In addition, voids start to form as trench depth increases and conductive materials cannot fill the silicon trench completely. Such voids may cause reliability issues. The deeper the silicon trench, the easier voids are formed. Typically, TSV reaches up to 250 um. In some MEMS structures, thicker TSV is desirable. Therefore, what is needed is a wafer level chip scale packaging technology that allows electrical connections between both sides of a thick chip scale packaging layer.

Surface WLCSP: Shellcase Ltd. of Israel developed a WLCSP technology that allows electrical connections to extend along the slanted side of the chip scale packaging layer coupling electrical connections on both sides of the packaging layer, typically silicon substrate. As seen in FIGS. 1A-1B, the Shellcase package 10 comprises at least one chip scale packaging layer plate 42 of packaging layer 20 formed on an integrated circuit substrate 22. Conductors 12 are formed directly over an insulation layer 18 overlying at least one chip scale packaging layer plate 42 overlying an integrated circuit device 22 having an active surface 24. Conductors 12 are electrically connected from solders 28 which are formed on top of the planar surface 26 the packaging layer plate 42, runs over the slanted side 25 of the packaging layer plate 42 and finally coupled to pads 16 which are connected to the integrated circuit on the active surface 24. It is noted that the conductors 12 are formed entirely over the insulation layer 18 and packaging layer plate 42. Since conductors 12 run over the top of the packaging layer, this packaging scheme is termed surface WLCSP. This Shellcase technology is capable of running leads along the sidewall of a thicker substrate, however, it yields reliability issues as delamination may occur among surfaces of conductors 12, insulation layer 18 and packaging layer plate 42.

Details of the process of Shellcase are shown in FIGS. 2A-2J. The Shellcase process starts with wafer 40 which has a plurality of dies 22 defined by a dicing street (see FIG. 2A). Each die has multiple electrical pads 16 on the active surfaces 24. The Shellcase package is then formed by bonding the chip scale packaging layer plate 42 with bonding layer 32 which is opposite the top surface 46. What is needed is a simpler wafer level chip scale packaging device using a bonding which serves both as a bonding layer and as electrical conductor pads.

As shown in FIG. 2C, the package, which is typically silicon, is then patterned by lithography and etched along the dicing street. This etching step etches through the packaging layer plate 42 and bonding layer 32 forming etched channels 52 and exposing pads 16. After that, the package is coated (see FIG. 2D) with an insulation layer 18. Openings 56 (see FIG. 2E) are formed in the insulation layer 18 exposing pads 16. FIG. 2F shows formation of a conductive layer 58 that covers insulation layer 18 and extends into openings 56, followed by patterning a conductive layer using conventional photolithographic techniques (see FIG. 2G). After that, the package is coated with protective layer 30 and patterned to define apertures 60. Next, solder bumps 28 are formed at apertures 60 thereby in electrical contact with conducting pads 12. Finally, the Shellcase package is then diced along lines 64. Since the Shellcase conductor 12 runs along the entire slanted side of the silicon trench, a much larger footprint of active surface 24 on wafer 40 is needed compared with the area of the top side of the packaging layer plate 42. With such a substantial increase in active area, the cost per die increases significantly. In order to reduce the footprint of the active area the length that the conductor 12 runs needs to be reduced. Therefore, what is needed is a smaller footprint wafer level chip scale packaging device.

BRIEF SUMMARY

The below summary is merely representative and non-limiting. The above problems are overcome, and other advantages may be realized, by the use of the embodiments.

Various embodiments provide a packaged MEMS device comprising: 1) a silicon substrate having a first general planar surface; 2) an active surface with an integrated circuit formed on said first general planar surface; 3) at least two pads formed on said first general planar surface, wherein at least one pad is a closed ring pad; 4) at least one silicon cap wafer having a second general planar surface with at least two pads, wherein at least one pad is a closed ring pad; said at least one silicon cap wafer also having a third slanted surface with an angle to said second general planar surface, said at least one silicon cap wafer also having a fourth general planar surface; 5) at least one hermetic seal ring formed between the first general planar surface and the second general planar surface by a bonding between said at least one closed ring pad formed on said first general planar surface and said at least one closed ring pad formed on said second general planar surface (such as eutectic or metal diffusion bonding); 6) at least one gap formed between said substrate and said at least one silicon cap wafer, wherein said gap is filled with a pressurized gaseous species; 7) at least one electrical connection formed by a bonding between at least one pad formed on the first general planar surface and at least one pad formed on said second general planar surface (such as another eutectic or metal diffusion bonding); 8) at least one electrical contact entirely formed over said at least one silicon cap wafer, wherein a first portion of said at least one electrical contact is formed over said fourth general planar surface, a second portion of said at least one electrical contact is formed over said third slanted surface, and a third portion of said at least one electrical contact is formed over said at least one electrical connection; and 9) an insulation layer formed between said at least one electrical contact and said at least one silicon cap wafer.

The at least two pads on the substrate and the at least one chip scale packaging layer could be aluminum, copper, gold, silicon, titanium, tin, indium, or germanium. The pressure of the gas in the gap could range from 1 to 10 bar. The pressure of the gas in the gap could also range from 1 to 5 bar or from 1 to 3 bar. The gaseous species could be sulphur hexafluoride, carbon dioxide, xenon or 2,3,3,3-Tetrafluoropropene (HFO1234yf), or propane. The insulation layer could be epoxy, silicon nitride, silicon oxide, silicon oxynitride, a solder mask, polyimide, benzocyclobutene (BCB), parylene, polynaphthalenes, fluorocarbons and acrylates.

In one embodiment, the third slanted surface is formed external to the at least one silicon cap wafer. In another embodiment, the third slanted surface is formed internal to the at least one silicon cap wafer. In a further embodiment, a gap is formed as a recess in the substrate Various embodiments also provide a method of producing packaged MEMS devices comprising the steps of providing a silicon substrate having 1) a first general planar surface; 2) an active surface with an integrated circuit formed on said first general planar surface; 3) at least two pads formed on said first general planar surface, wherein at least one pad is a closed ring pad; 4) at least one silicon cap wafer having a second general planar surface with at least two pads, wherein at least one pad is a closed ring pad; said at least one silicon cap wafer also having a third slanted surface with an angle to said second general planar surface, said at least one silicon cap wafer also having a fourth general planar surface; 5) at least one hermetic seal ring formed between the first general planar surface and the second general planar surface by a bonding between said at least one closed ring pad formed on said first general planar surface and said at least one closed ring pad formed on said second general planar surface; 6) at least one gap formed between said substrate and said at least one silicon cap wafer, wherein said gap is filled with a pressurized gaseous species; 7) at least one electrical connection formed by a bonding between at least one pad formed on first general planar surface and at least one pad formed on said second general planar surface; 8) at least one electrical contact entirely formed over said at least one silicon cap wafer, wherein a first portion of said at least one electrical contact formed over said fourth general planar surface, a second portion of said at least one electrical contact formed over said third slanted surface, and a third portion of said at least one electrical contact formed over said at least one electrical connection; and 9) an insulation layer formed between said at least one electrical contact and said at least one silicon cap wafer.

Various embodiments may also provide a packaged MEMS device comprising 1) a substrate having a first general planar surface; 2) an active surface with integrated circuit formed on said first general planar surface; 3) at least two pads formed on said first general planar surface, wherein at least one pad is a closed ring pad; 4) at least one chip scale packaging layer having a second general planar surface with at least two pads, wherein at least one pad is a closed ring pad; said at least one chip scale packaging layer also having a third slanted surface with an angle to said second general planar surface, said at least one chip scale packaging layer also having a fourth general planar surface; 5) at least one hermetic seal ring formed between the first general planar surface and the second general planar surface by a bonding between said at least one closed ring pad formed on said first general planar surface and said at least one closed ring pad formed on said second general planar surface; 6) at least one gap formed between said substrate and said at least one chip scale packaging layer; 7) at least one electrical connection formed by a bonding between at least one pad formed on first general planar surface and at least one pad formed on said second general planar surface; 8) at least one TSV formed through the at least one chip scale packaging layer; wherein said TSV having filled with conductive material; 9) at least one electrical contact partly formed over and partly formed through said at least one chip scale packaging layer, wherein one portion of said at least one electrical contact formed over said fourth general planar surface, one portion of said at least one electrical contact formed over said third slanted surface, one portion of said at least one electrical contact formed through TSV, and one portion of said at least one electrical contact formed over said at least one electrical connection; and 10) an insulation layer formed between said at least one electrical contact and said at least one chip scale packaging layer.

The substrate and at least one chip scale packaging layer could be silicon. The insulation layer could be epoxy, silicon nitride, silicon oxide, silicon oxynitride, a solder mask, polyimide, BCB, parylene, polynaphthalenes, fluorocarbons and acrylates. The at least two pads on the substrate and on the at least one chip scale packaging layer could be aluminum, copper, gold, silicon, titanium, tin, indium, or germanium. The conductive material filling of said TSV could be in-situ doped polysilicon or copper. The gap could be pressurized with gaseous species. The pressure of the gap could range from 1 to 10 bar or from 1 to 5 bar. The pressure of the gap could also range from 1 to 3 bar. The gaseous species could be sulphur hexafluoride, carbon dioxide or xenon or 2,3,3,3-Tetrafluoropropene (HFO1234yf), or propane. The pressure of the gap could also range from 0.1 to 1 bar. The pressure of the gap could range from $10^{-5}$ to 0.1 bar. Hermetic bonding may be done by a conventional bonding machine such as a Suss MicroTec SB81 or SB8L; or EV GROUP EVG 520 wafer bonder under controlled bonding temperature, high pressure, force and time. Bonding is not limited to metal diffusion bonding such as copper-copper, gold-gold, silicon-titanium, and eutectic bonding such as gold-tin, copper-tin, gold-silicon, gold-indium, gold-germanium, and aluminum-germanium.

In one embodiment, the third slanted surface is formed external to the at least one chip scale packaging layer. In a further embodiment, the third slanted surface is formed internal to the at least one chip scale packaging layer. In another embodiment, a packaged MEMS device also includes a gap formed as a recess in the substrate.

Various embodiments also provide a method of producing packaged MEMS devices comprising the steps of providing 1) a substrate having a first general planar surface; 2) an active surface with an integrated circuit formed on said first general planar surface; 3) at least two pads formed on said first general planar surface, wherein at least one pad is a closed ring pad; 4) at least one chip scale packaging layer having a second general planar surface with at least two pads, wherein at least one pad is a closed ring pad; said at least one chip scale packaging layer also having a third slanted surface with an angle to said second general planar surface, said at least one chip scale packaging layer also having a fourth general planar surface; 5) at least one hermetic seal ring formed between the first general planar surface and the second general planar surface by a bonding between said at least one closed ring pad formed on said first general planar surface and said at least one closed ring pad formed on said second general planar surface; 6) at least one gap formed between said substrate and said at least one chip scale packaging layer; 7) at least one electrical connection formed by a bonding between at least one pad formed on the first general planar surface and at least one pad formed on said second general planar surface; 8) at least one TSV formed through the at least one chip scale packaging layer; wherein said TSV being filled with conductive material; 9) at least one electrical contact partly formed over and partly formed through said at least one chip scale packaging layer, wherein one portion of said at least one electrical contact formed over said fourth general planar surface, one portion of said at least one electrical contact formed over said third slanted surface, one portion of said at least one electrical contact formed through a TSV, and one portion of said at least one electrical contact formed over said at least one electrical connection; and 10) an insulation layer formed between said at least one electrical contact and said at least one chip scale packaging layer.

BRIEF DESCRIPTION OF THE SEVERAL VIEWS OF THE DRAWINGS

Various embodiments are illustrated by way of example, and not by way of limitation, in the Figures of the accompanying drawings and in which like reference numerals refer to similar elements and in which.

DETAILED DESCRIPTION

Various embodiments are described in detail with reference to a few examples thereof as illustrated in the accompanying drawing. In the following description, numerous specific details are set forth in order to provide a thorough understanding of this disclosure. It will be apparent, however, to one skilled in the art, that additional embodiments may be practiced without some or all of these specific details. Additionally, some details may be replaced with other well-known equivalents. In other instances, well-known process steps have not been described in detail in order to not unnecessarily obscure the present disclosure.

Example #1: External Surface WLCSP

Figure 1A:
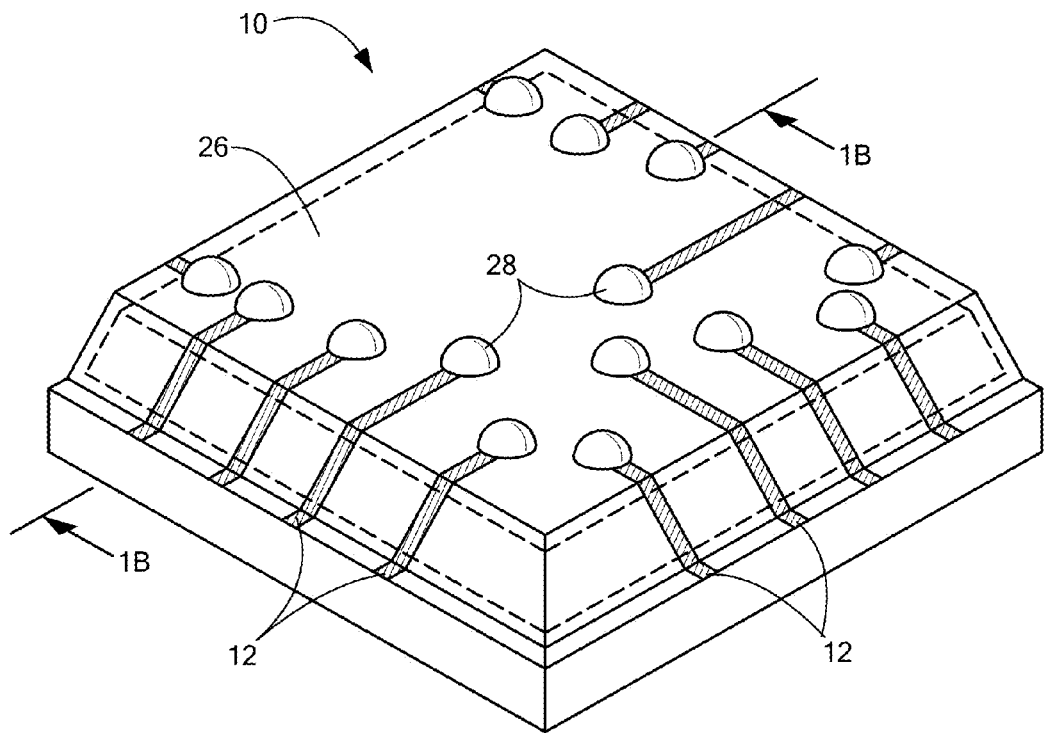
FIGS. 1A-1B, collectively referred to as FIG. 1, are simplified pictorial illustrations and a cross-sectional views of the prior art Shellcase packaging technology.
Figure 1B:
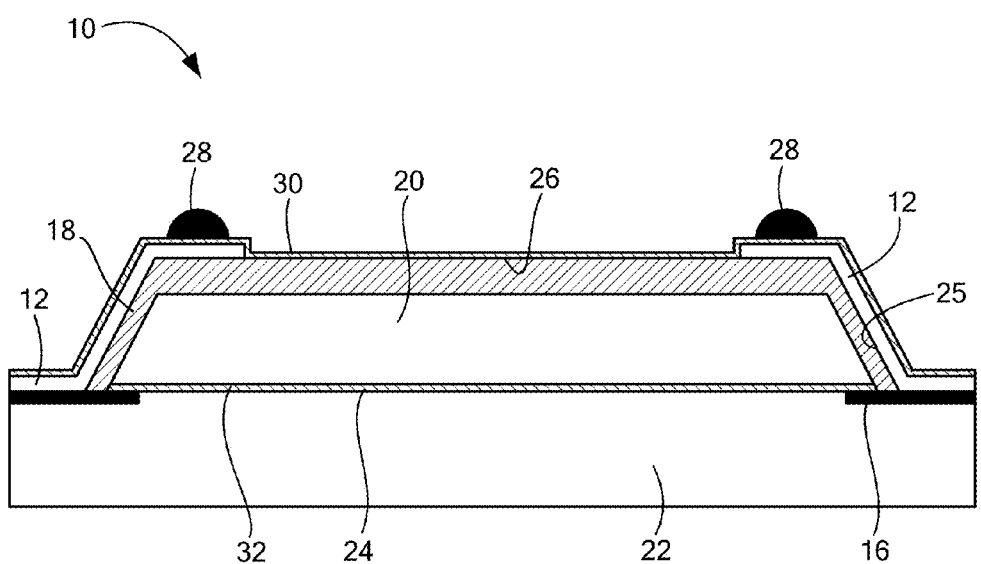
Figure 2A:
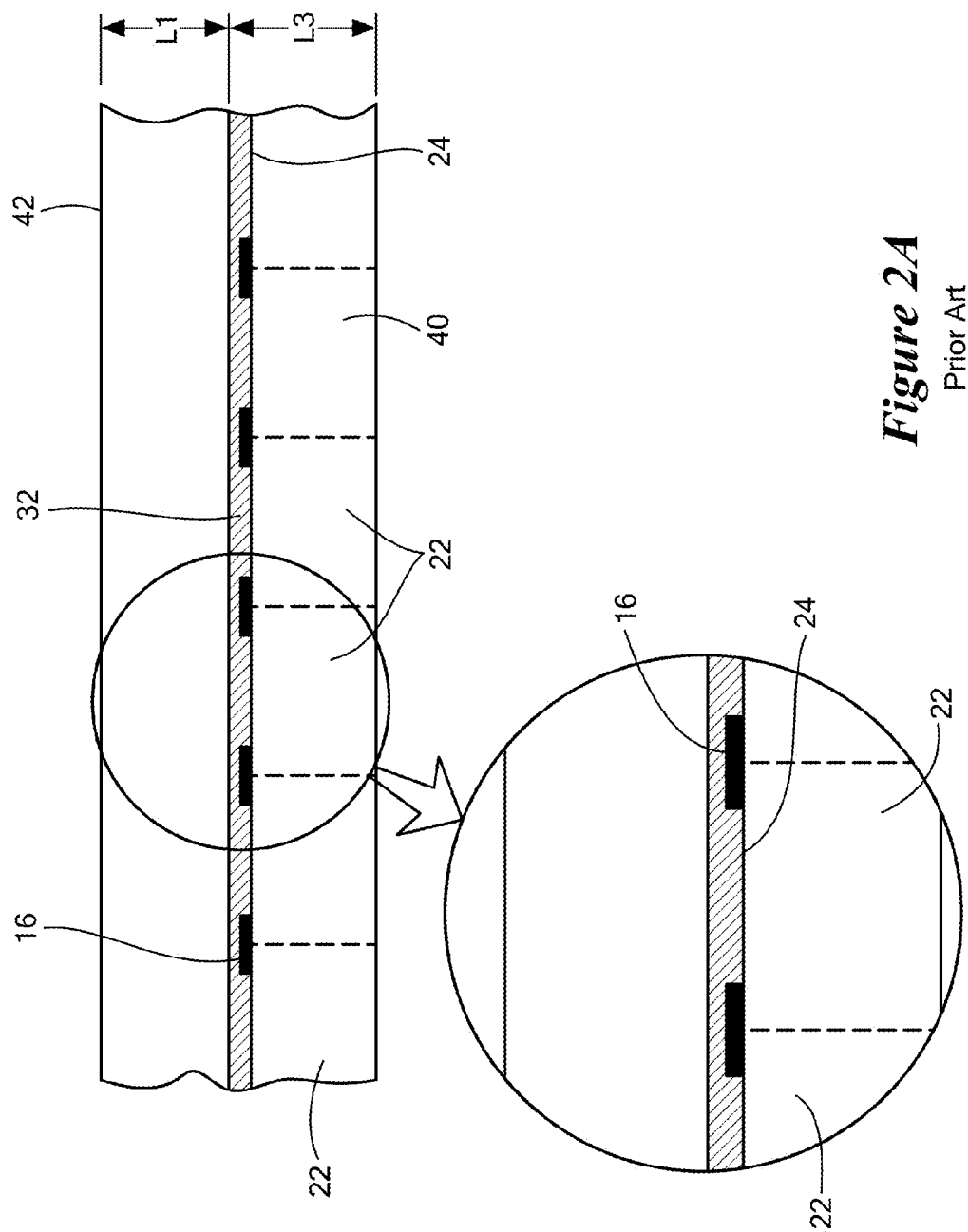
FIGS. 2A-2J, collectively referred to as FIG. 2, illustrate a detailed diagrammatic cross-sectional process flow of the prior art Shellcase packaging technology.
Figure 2B:
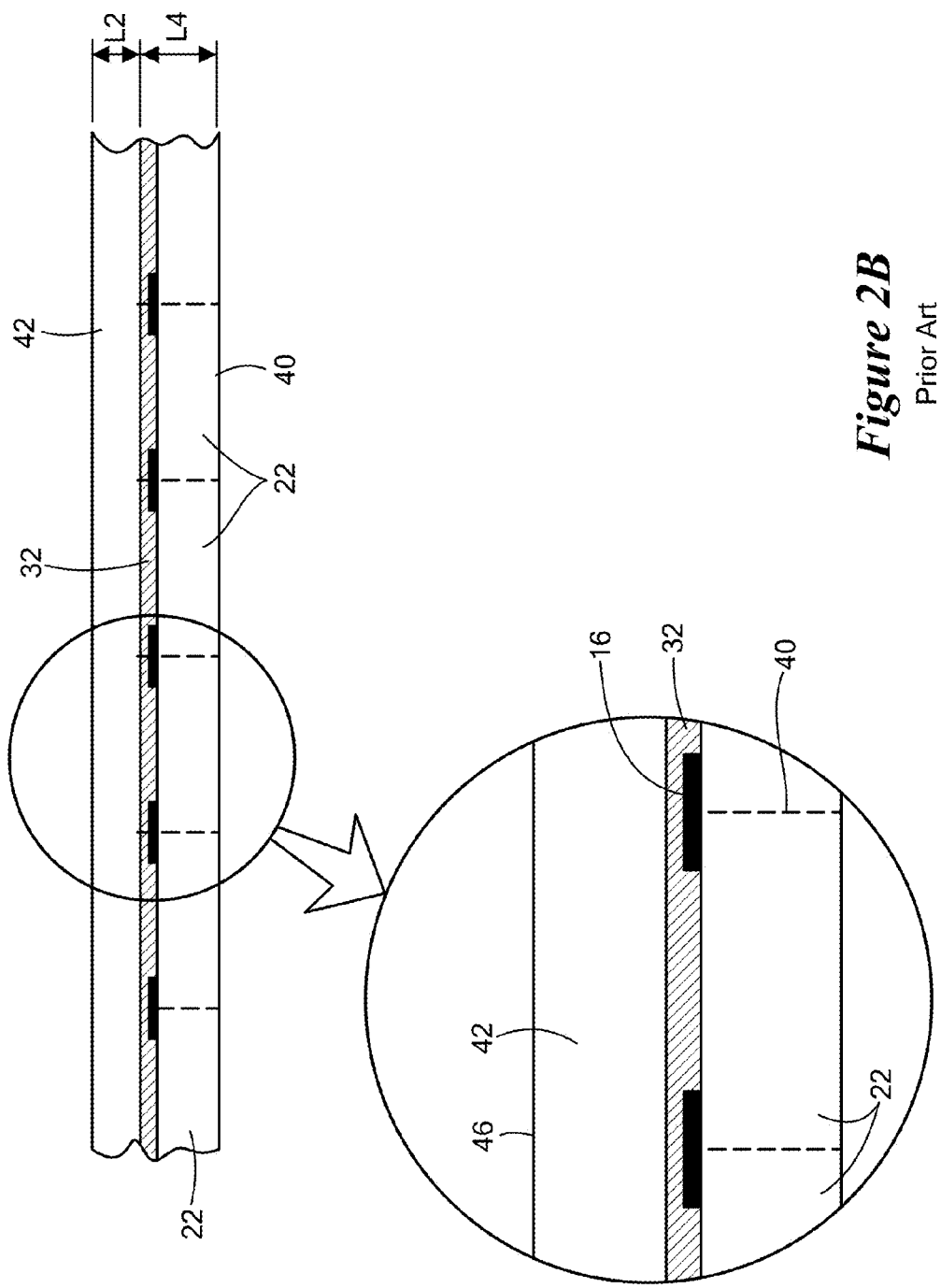
Figure 2C:
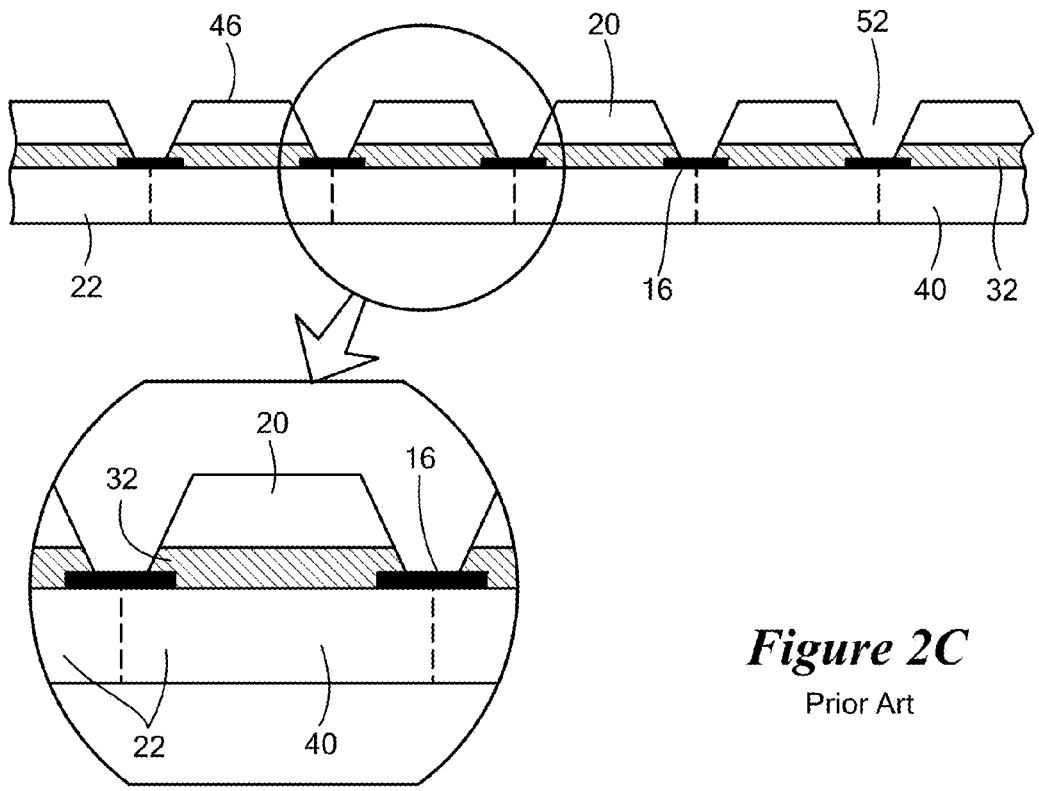
Figure 2D:
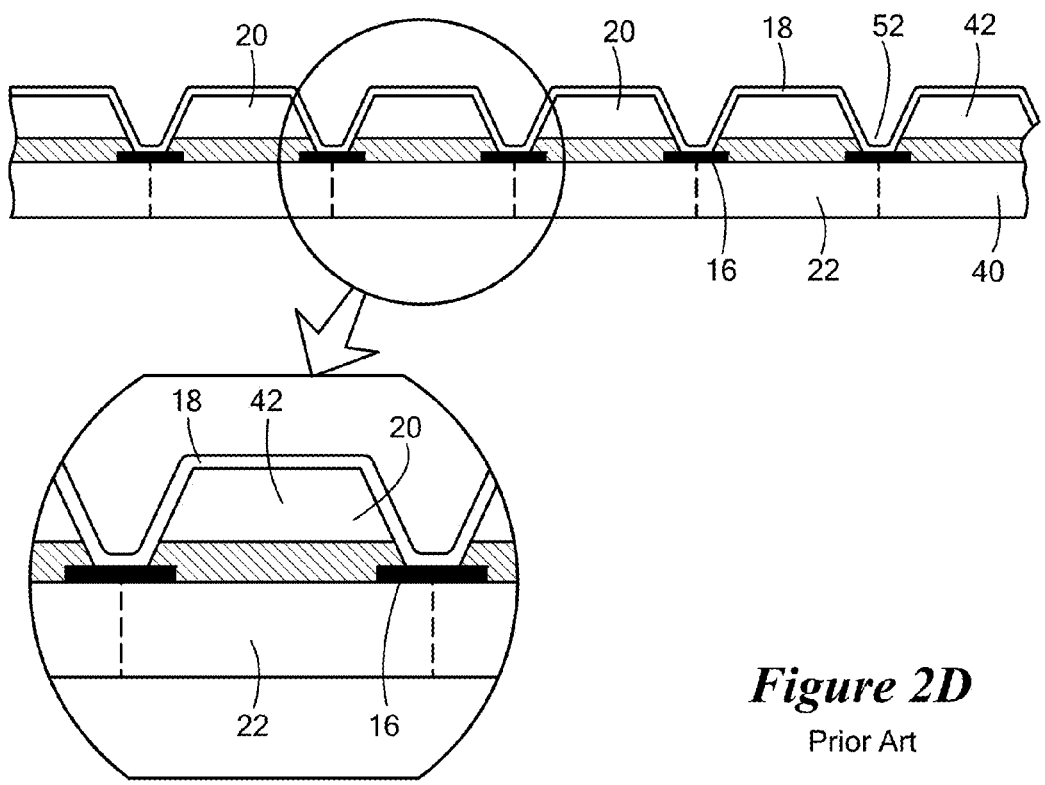
Figure 2E:
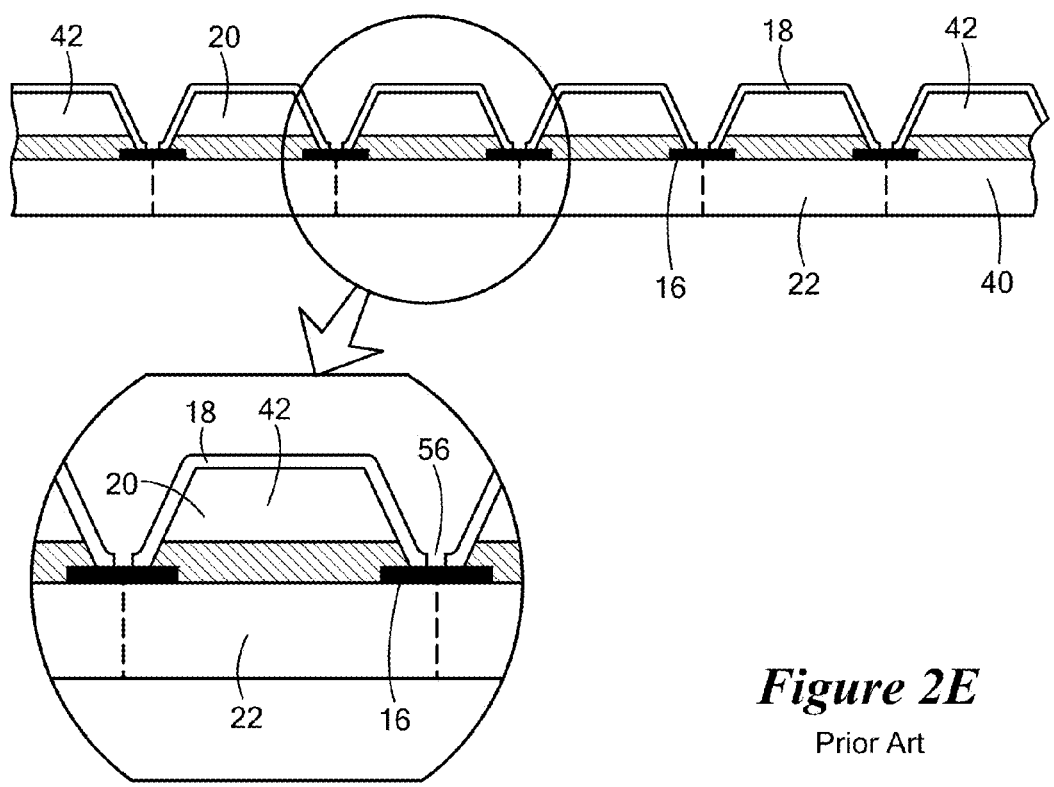
Figure 2F:
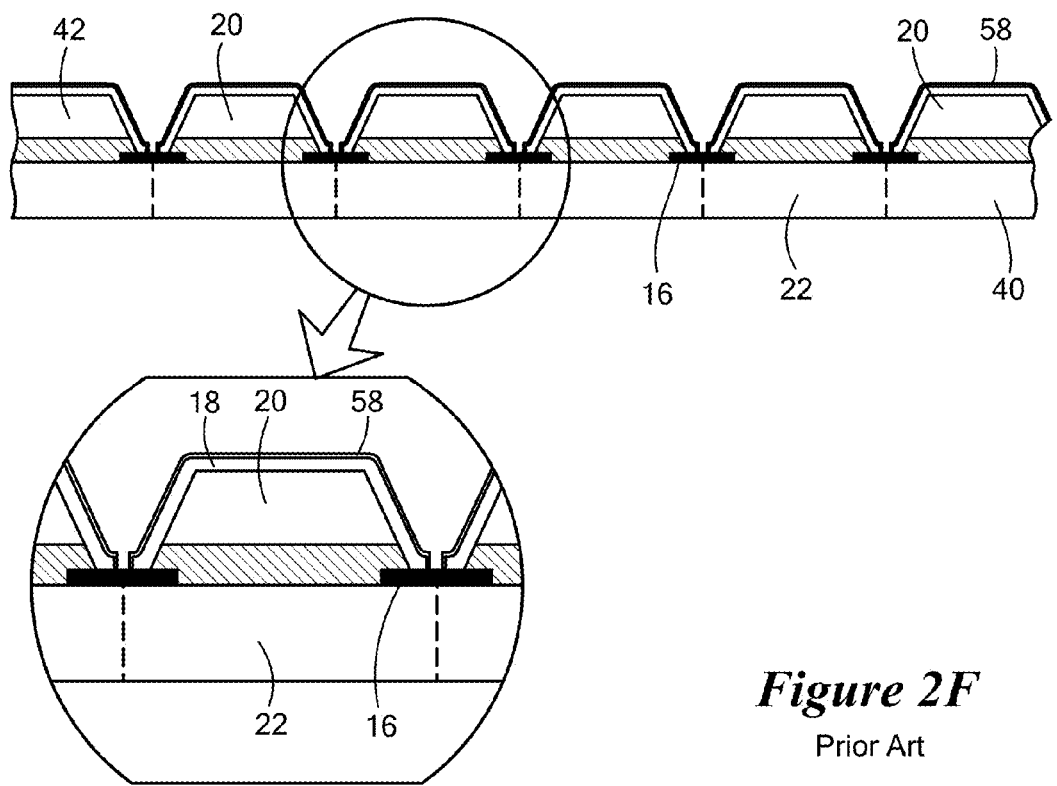
Figure 2G:
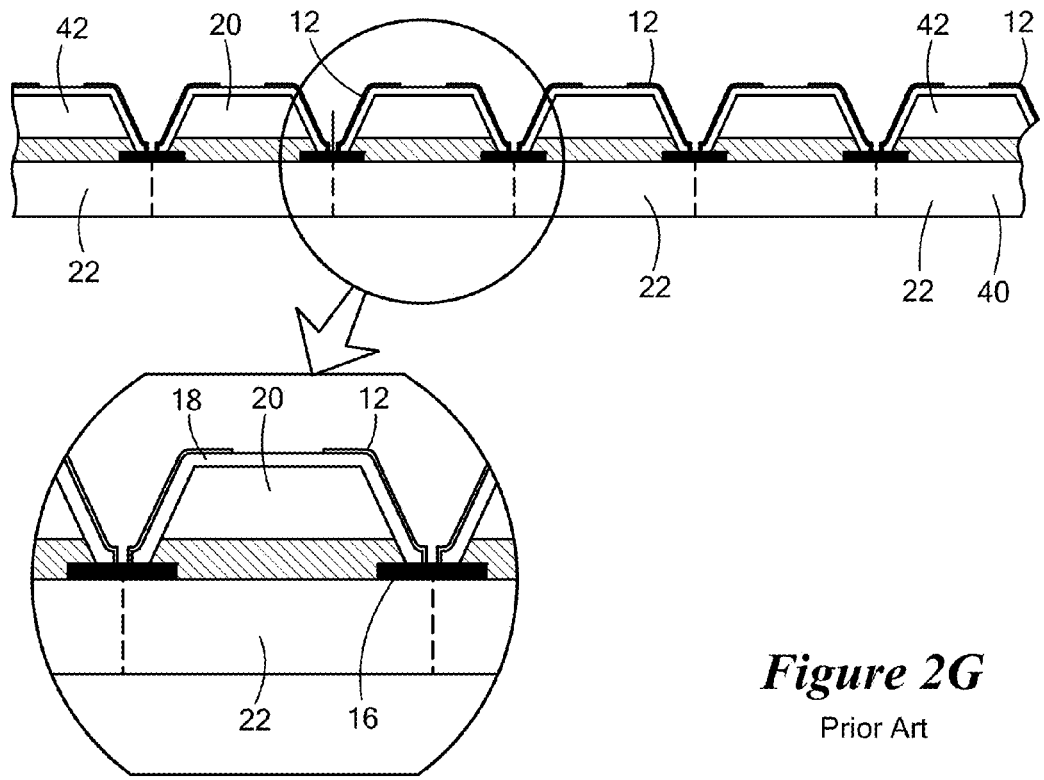
Figure 2H:
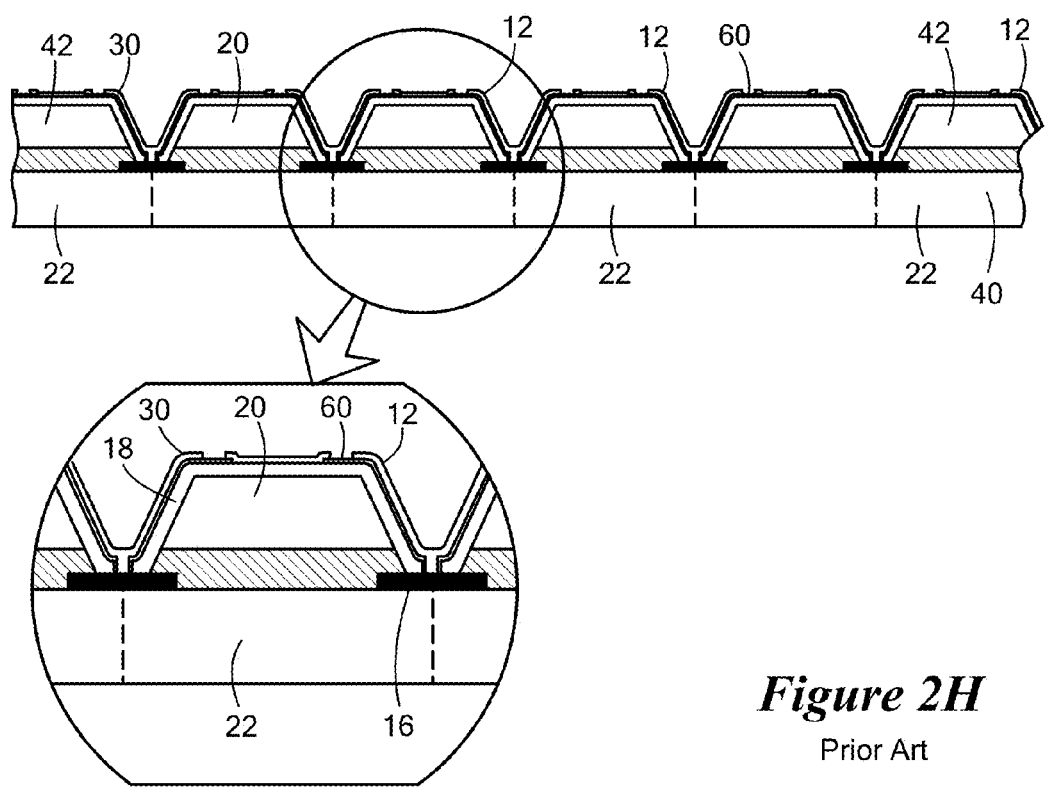
Figure 2I:
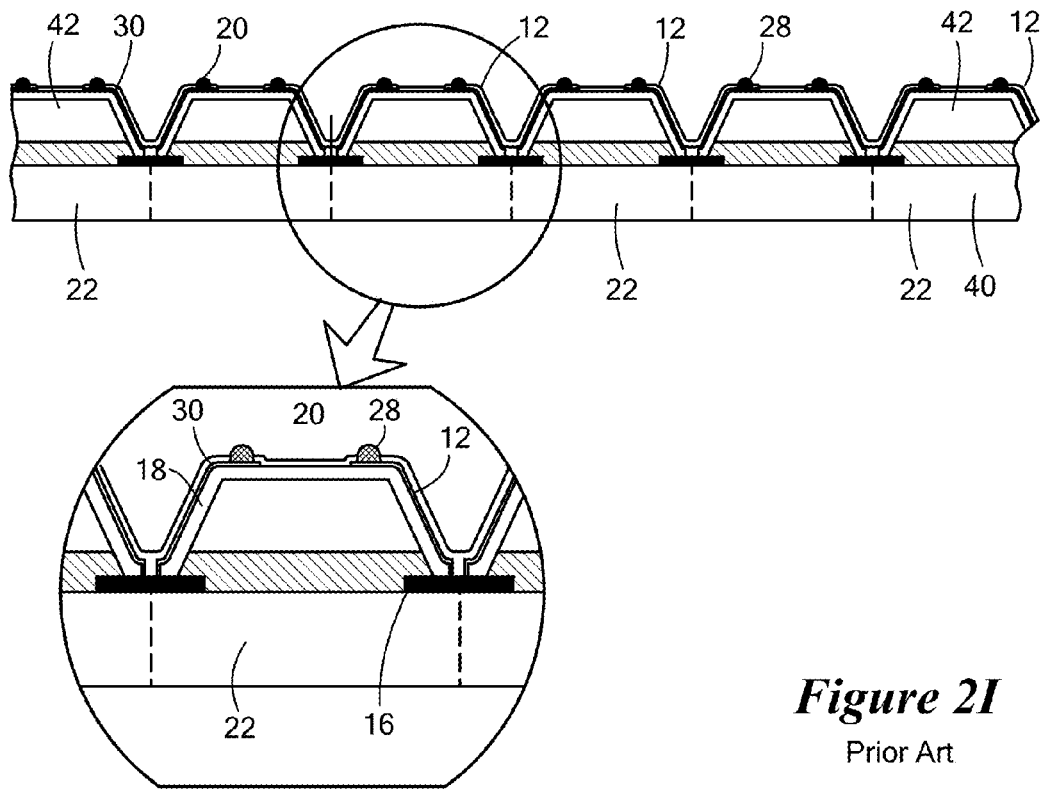
Figure 2J:
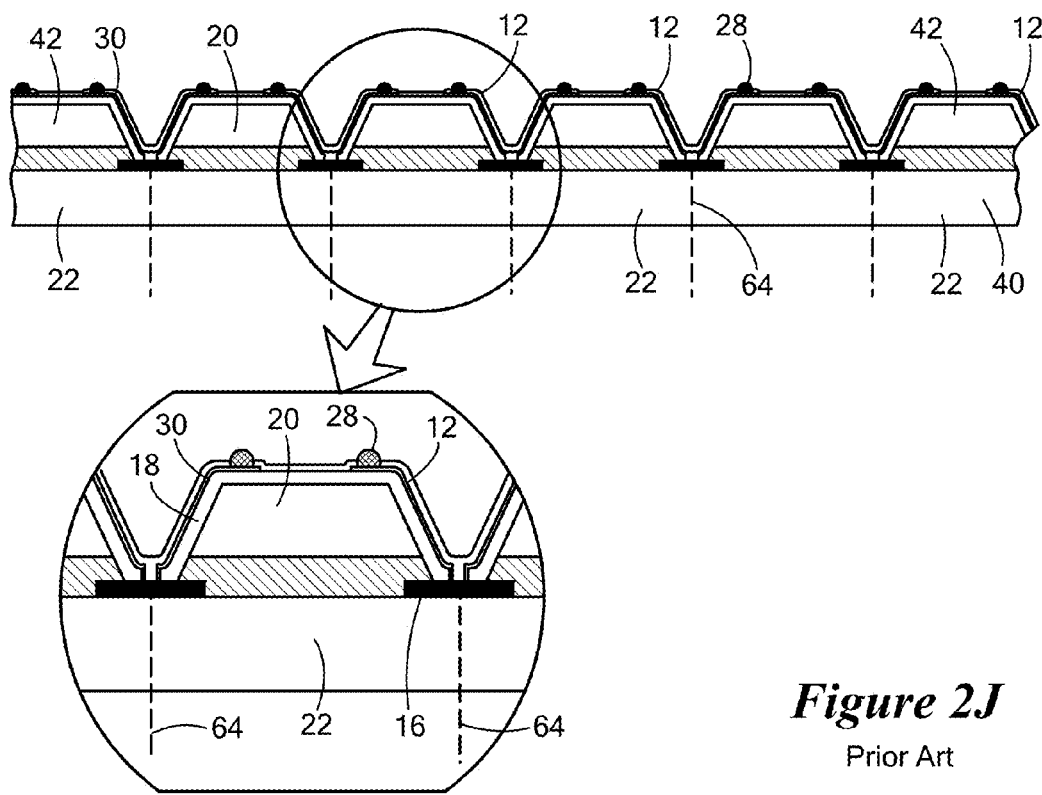

The Shellcase dies have multiple electrical connections formed over the surface of the chip packaging layer plate 42 and external to the chip packaging layer which it bonded to the integrated circuit substrate by a bonding layer 32 (see FIG. 2B). The surface WLCSP uses a bonding serving both as bonding layer and to connect electrical conductor pads (such as eutectic or metal diffusion bonding), wherein bonding occurs between the chip scale packaging layer and integrated circuit substrate, and said chip scale packaging layer is a silicon (or glass) cap wafer, not a MEMS structure.

The Shellcase device comprises a gap between the chip packaging layer and integrated circuit substrate. In the surface WLCSP disclosed, the gap is pressurized with gaseous species not limited to sulphur hexafluoride, xenon, or 2,3,3,3-Tetrafluoropropene (HFO1234yf), or propane.

FIG. 3 shows the detail description of an embodiment of a MEMS device utilizing the external surface WLCSP process described. This example describes a MEMS device comprising an integrated circuit wafer hermetically sealed with a silicon cap wafer (or chip scale packaging layer) with a cavity using eutectic or metal diffusion bonding. Hermetic bonding may be done by conventional bonding machine such as a Suss MicroTec SB81 or SB8L; or EV GROUP EVG 520 wafer bonder under controlled bonding temperature, high pressure, force and time. Bonding is not limited to metal diffusion bonding such as copper-copper, gold-gold, silicon-titanium, and eutectic bonding such as gold-tin, copper-tin, gold-silicon, gold-indium, gold-germanium, and aluminum-germanium. Conductors are connected from integrated circuit pads through eutectic or metal diffusion bonding to the conductors on the slanted surface of the chip scale packaging layer to the solder bumps on the front side of the silicon cap wafer. U.S. Pat. No. 7,442,570 B2 described a method for bonding a CMOS wafer and a MEMS wafer, the CMOS wafer including an integrated circuit, the MEMS wafer including a MEMS device.

The starting material is the chip scale packaging layer which is typically silicon wafer. The process starts with a silicon wafer 301 deposited of a liner passivation 302 not limited to silicon oxide, nitride or oxy-nitride. Conductive material is deposited and patterned to define top metal pad 303 which includes a first portion 303a and a second portion 303b (see FIG. 3A). While this top metal pad is used as interconnect pad, it is also used to form a hermetic bonding ring structure with an integrated circuit substrate. The conductive material could be but is not limited to aluminum, copper, gold, silicon, titanium, tin, indium, or germanium.

Figure 3A:
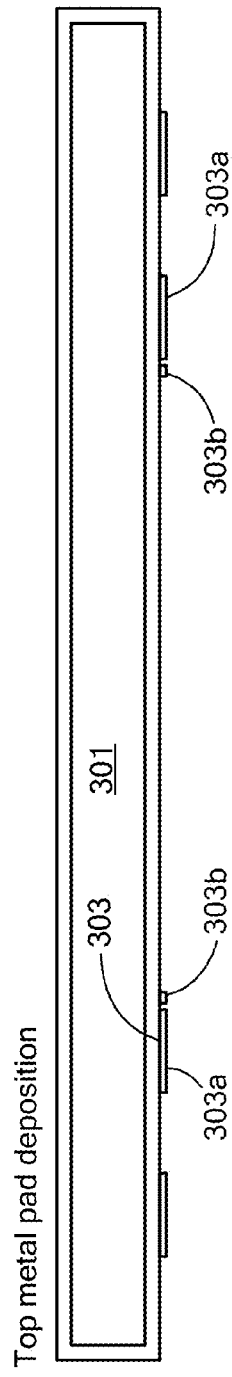
FIGS. 3A-3L, collectively referred to as FIG. 3, illustrate an example of a detailed diagrammatic process flow of a MEMS device using external surface WLCSP technology as described.
Figure 3B:
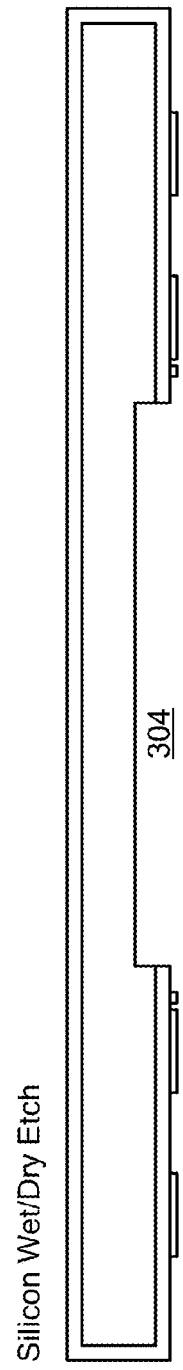
Figure 3C:
Figure 3D:
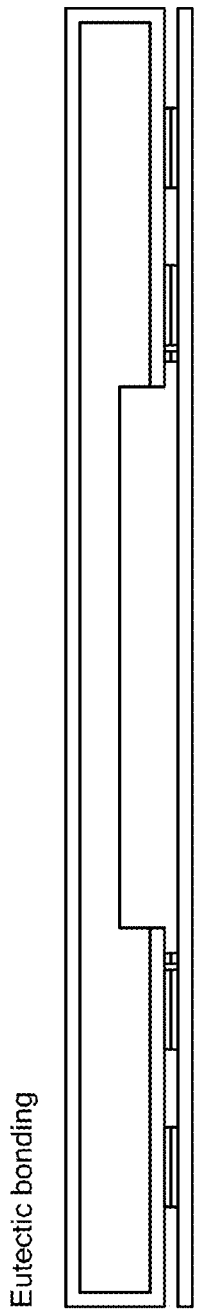
Figure 3E:
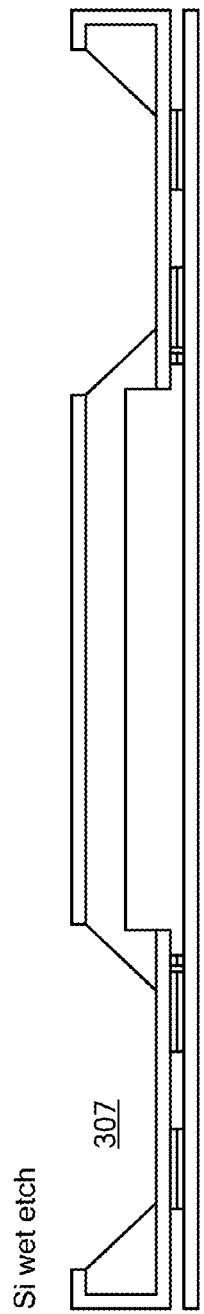
Figure 3F:
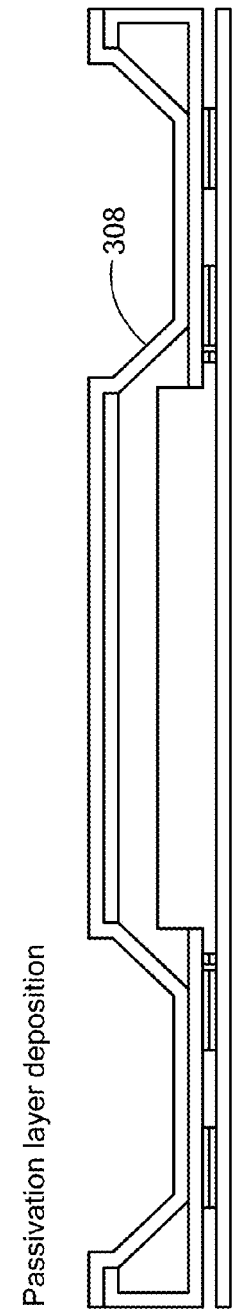

A mask is deposited to define a silicon cavity 304 by either wet or dry silicon etching (see FIG. 3B) and subsequently removed. The depth of the silicon cavity 304 could range from 10 um to 600 um. The depth of silicon cavity 304 could range from 0.1 um to 10 um. Such mask could be but is not limited to photo-resist, silicon oxide, or nitride. As seen in FIG. 3D, the top metal pad 303 on the silicon cap wafer 301 is aligned with bottom metal pad 305 on the integrated circuit substrate and forms a hermetic eutectic or metal diffusion bonding at elevated temperature in the presence of gaseous species not limited to sulphur hexafluoride, xenon or 2,3,3,3-Tetrafluoropropene (HFO1234yf), or propane. The bottom metal pad 305 on the integrated circuit wafer could be but is not limited to aluminum, copper, gold, silicon, titanium, tin, indium, or germanium. The bottom metal pad 305 includes a first portion 305a (which matches 303a) and a second portion 305b (which matches 303b).

A mask is deposited on the top side of the wafer, patterned and defined to form the shape of the silicon pit 307. The mask could be, but is not limited to, patterned silicon oxide or nitride or any photo-definable material such as a photo-resist. The substrate is immersed in a silicon wet anisotropic etchant (see FIG. 3E) not limited to potassium hydroxide, Ethylenediamine Pyrocatechol (EDP), hydrazine, and TetraMethyl Ammonium Hydroxide (TMAH) to form silicon pit exposing the passivation liner oxide 302. Alternatively, etching could be done by dry etching or laser etching.

After that, a passivation layer 308 (see FIG. 3F) is deposited to passivate the exposed slanted silicon sidewall with a typical 54.7°. The passivation layer 308 could be, but is not limited to epoxy, silicon nitride, silicon oxide, silicon oxynitride, a solder mask, polyimide, benzocyclobutene (BCB), parylene, polynaphthalenes, fluorocarbons and acrylates. The passivation layer could be formed by spin coating, spray coating, curtain coating, liquid phase deposition, physical vapor deposition, chemical vapor deposition, low pressure chemical vapor deposition, plasma enhanced chemical vapor deposition, rapid thermal chemical vapor deposition or atmospheric pressure chemical vapor deposition.

Figure 3G:
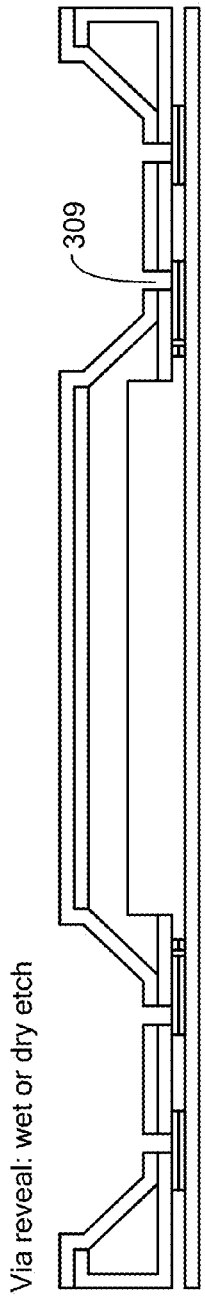
Figure 3H:
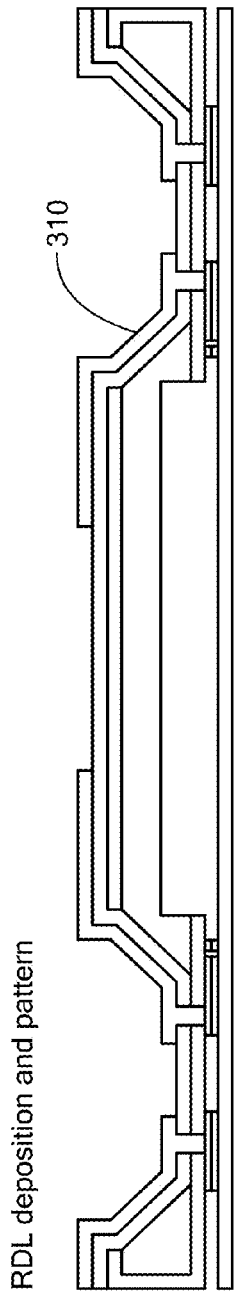

After that, a via is then defined by patterning using conventional photolithography at the bottom of the silicon pit followed by revealing the via 309 through etching the passivation layer and liner oxide either by wet etching, dry etching or laser etching (see FIG. 3G). Metal 310 such as but not limited to aluminum, copper, titanium, titanium tungsten, chromium, or any combination is deposited on the top and sidewall of the substrate and patterned to form a redistribution layer (RDL) (see FIG. 3H).

Figure 3I:
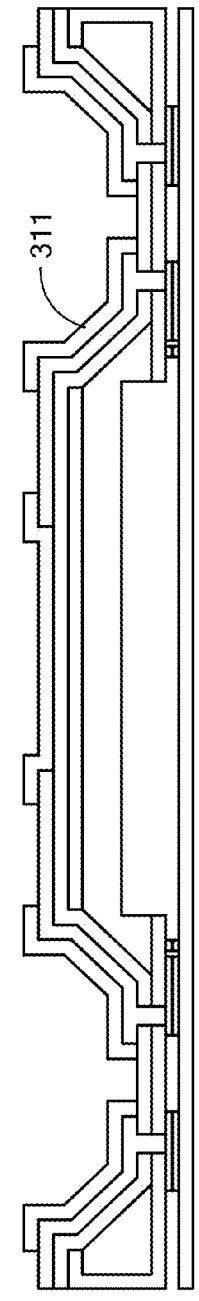
Figure 3J:
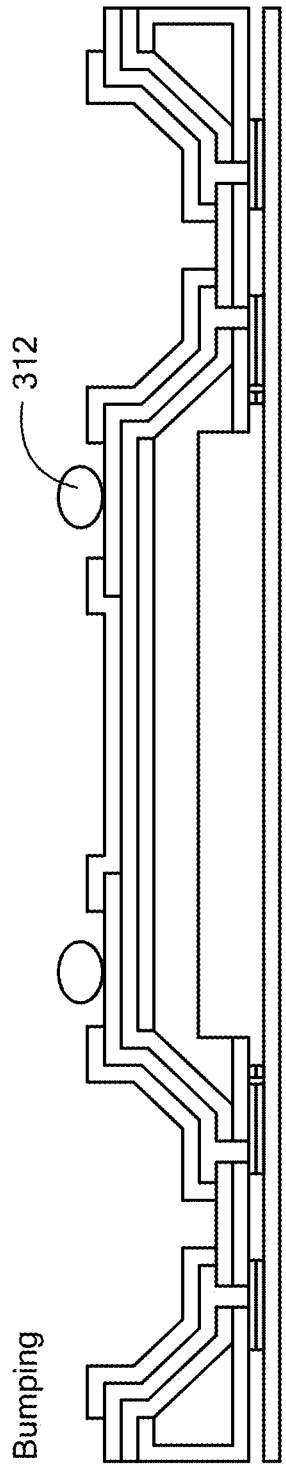
Figure 3K:
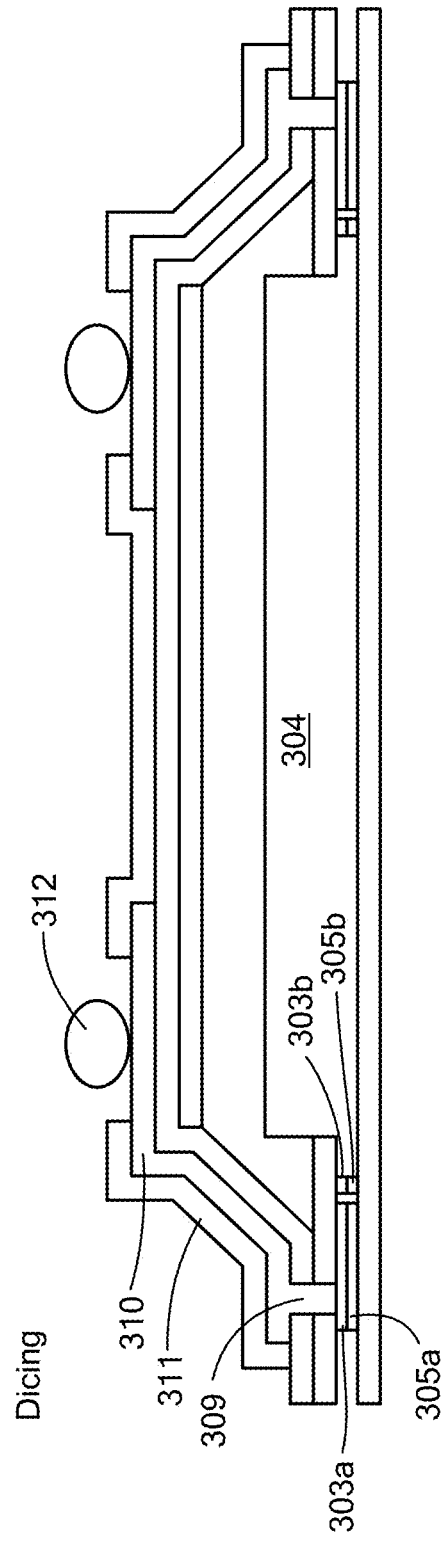

Finally a top passivation layer 311 is formed (see FIG. 3I). The passivation layer 311 could be, but is not limited to epoxy, silicon nitride, silicon oxide, silicon oxynitride, a solder mask, polyimide, benzocyclobutene (BCB), parylene, polynaphthalenes, fluorocarbons and acrylates. Finally, the top side of the substrate is bumped 312 (see FIG. 3J) and diced (see FIG. 3K) in this embodiment along the bottom of the silicon pit 307.

Figure 3L:
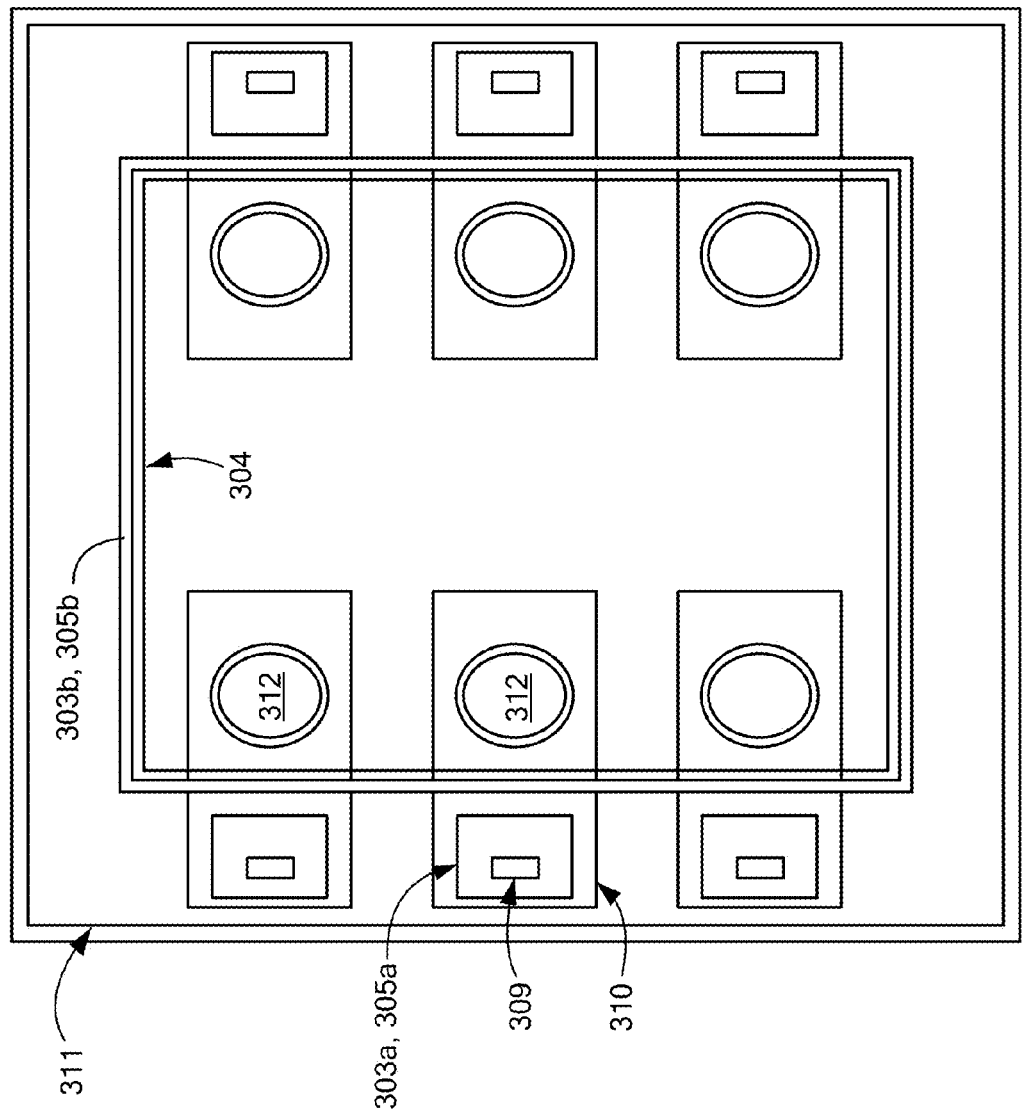

FIG. 3L shows a conceptual view of the device in order to show the relative location of various components to each other. The first portions 303a, 305a of the top metal pad 303 and bottom metal pad 305 form a rectangular surface which is in contact to the metal 310 in via 309. The top metal pad 303 and bottom metal pad 305 are shown in their relation to metal 310 which runs up the side of the device and makes contact with bump 312.

The outline of gap 304 is shown under the bumping 312. The gap 304 is surrounded by closed ring pads 303b, 305b which form a hermetic seal retaining any gases in gap 304. In this non-limiting embodiment, the gap 304 and closed ring pads 303b, 305b are rectangular. In further non-limiting embodiments, they have different shapes, such as round, oval, etc.

Example #2: Internal Surface WLCSP

A different kind of surface WLCSP process can be used in MEMS device as shown in the following embodiment. FIG. 4 shows the detail description of an embodiment of a MEMS device utilizing the internal surface WLCSP process described. This example describes a MEMS device comprising an integrated circuit wafer 408 hermetically sealed with a silicon cap wafer 401 (or chip scale packaging layer) with cavity 403 using eutectic or metal diffusion bonding. Conductors are connected from integrated circuit pads through eutectic or metal diffusion bonding to the conductors on slanted surface of the silicon cavity 403 and then further coupled to the solder bumps 413 on the front side of the silicon cap wafer. Instead of routing along silicon pit located external to the silicon cap wafer as in the case of Shellcase, conductors run along the slanted surface of the silicon cavity 403 internal to the silicon cap wafer 401.

In another embodiment, an integrated circuit device comprising an integrated circuit wafer wherein conductors are connected from integrated circuit pads to the conductors on the slanted surface of the silicon cavity internal to the integrated circuit wafer and then further coupled to the solder bumps of the front side of the integrated circuit wafer.

The starting material is the chip scale packaging layer which is typically silicon wafer 401. The process starts with selectively etching silicon wafer 401 with anisotropic wet etching not limited to potassium hydroxide, Ethylenediamine Pyrocatechol (EDP), hydrazine, and TetraMethyl Ammonium Hydroxide (TMAH) from the backside of substrate with liner oxide 402 (see FIG. 4A) to form silicon cavity 403 with a typical 54.7° to the substrate. The depth of silicon cavity could range from 10 um to 600 um. The depth of silicon cavity could range from 0.1 um to 10 um. After that, another passivation layer 404 not limited to silicon oxide, nitride or oxy-nitride is deposited (see FIG. 4B). Immediately after, conductive material not limited to in-situ doped poly-silicon or copper is deposited (see FIG. 4C) to form interconnect 405.

Figure 4A:
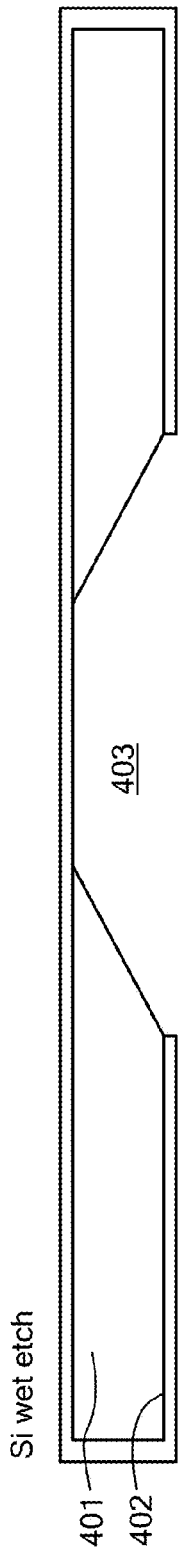
FIGS. 4A-4K, collectively referred to as FIG. 4, illustrate an example of a detailed diagrammatic process flow of a MEMS device using internal surface WLCSP technology as described.
Figure 4B:
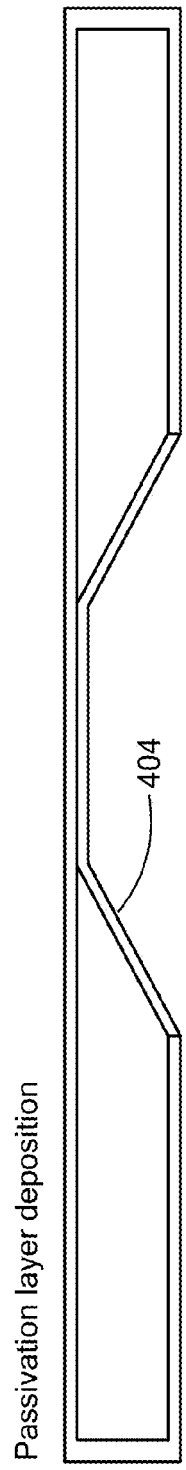
Figure 4C:
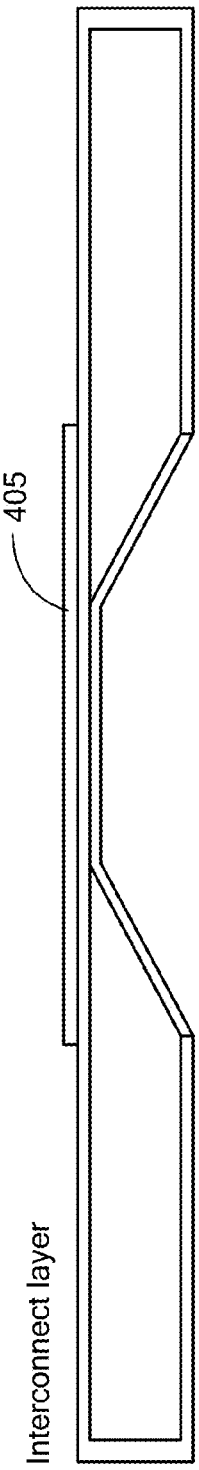
Figure 4D:
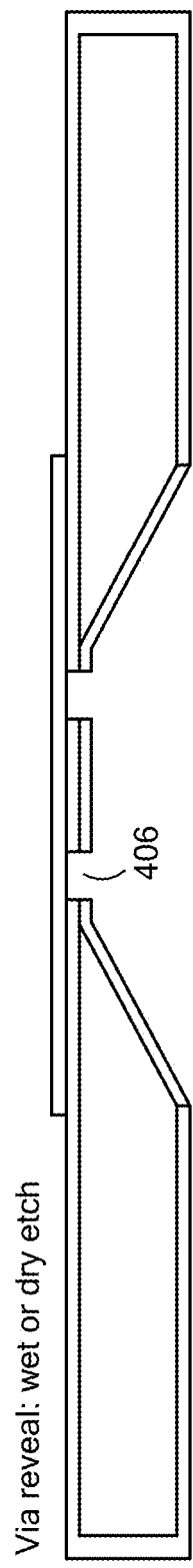
Figure 4E:
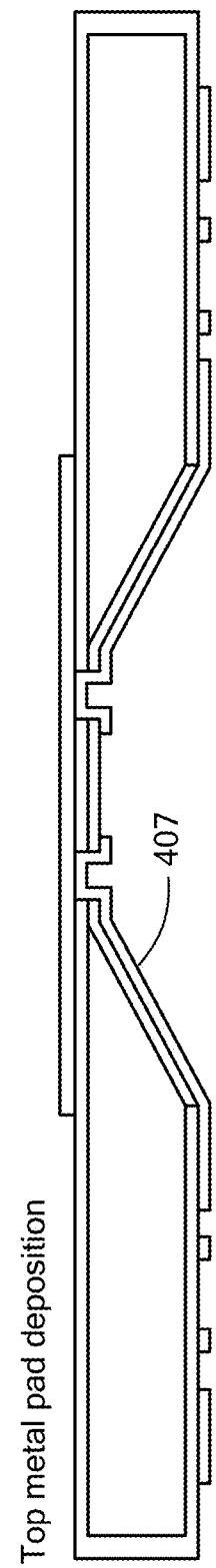
Figure 4F:
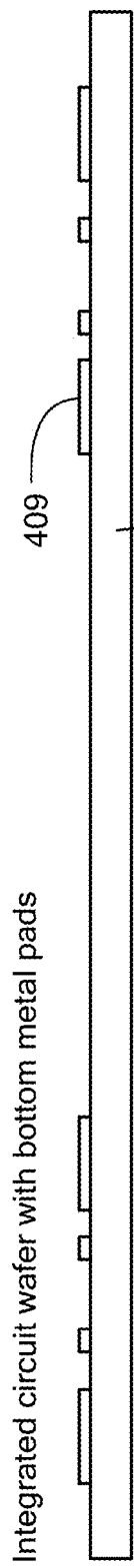
Figure 4G:
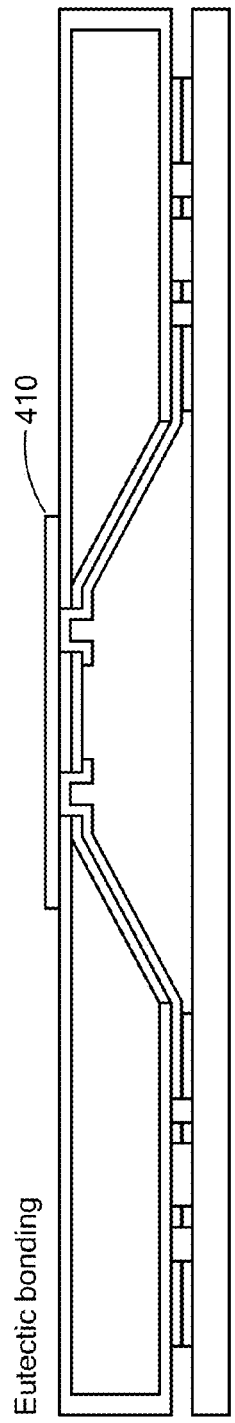

A via is then defined by patterning using conventional photolithography at the bottom of the silicon cavity 403 followed by revealing via 406 through the etching passivation layer and liner oxide either by wet etching, dry etching or laser etching (see FIG. 4D). Top metal pads 407 such as but not limited to aluminum, copper, titanium, titanium tungsten, chromium, or any combination is deposited on the top and sidewall of the substrate and patterned to form top metal pad (see FIG. 4E). As seen in FIG. 4F, the top metal pad 407 on the silicon cap wafer 401 is aligned with bottom metal pad 409 on the integrated circuit substrate 408 to form a hermetic eutectic or metal diffusion bonding at elevated temperature. Such cavity 403 could be pressurized with gaseous species not limited to sulphur hexafluoride, xenon or 2,3,3,3-Tetrafluoropropene (HFO1234yf), or propane. The bottom metal pad 409 on the integrated circuit wafer 408 could be but is not limited to aluminum, copper, gold, silicon, titanium, tin, indium, or germanium.

Figure 4H:
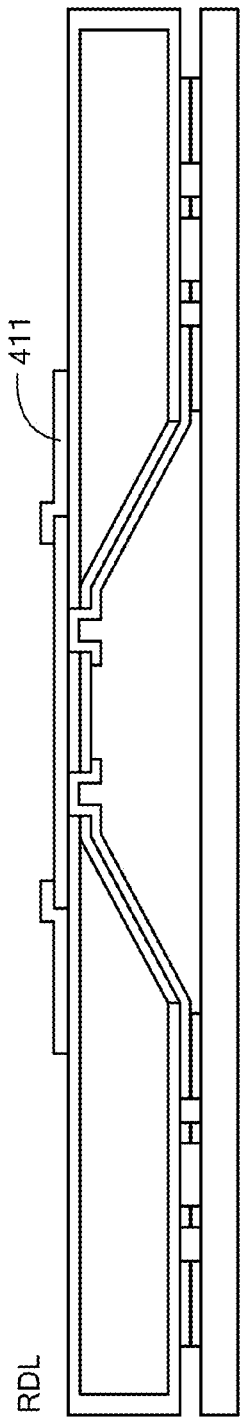
Figure 4I:
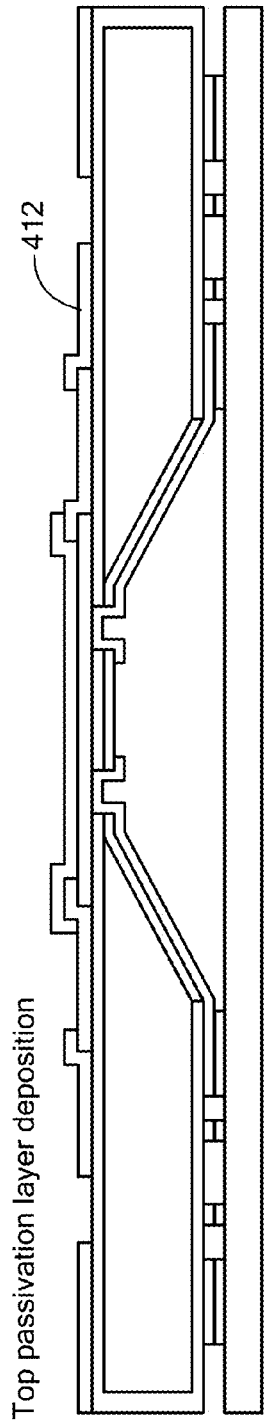
Figure 4J:
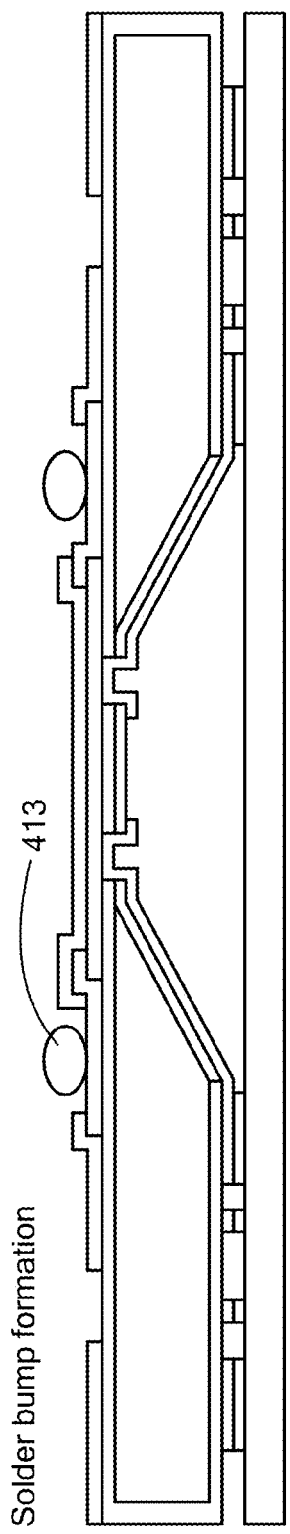
Figure 4K:
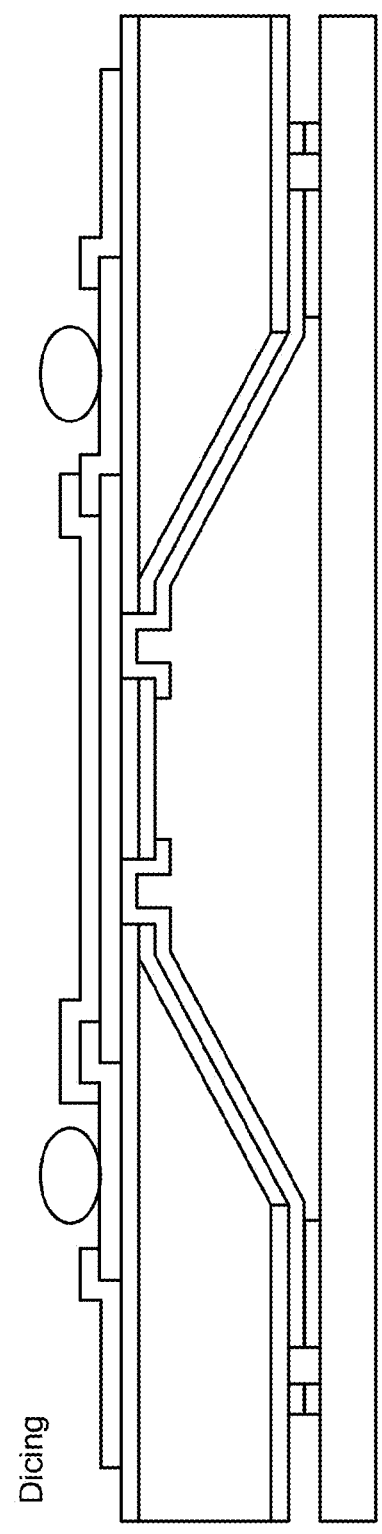

Next, metal such as but not limited to aluminum, copper, titanium, titanium tungsten, chromium, or any combination is deposited on the top and sidewall of the substrate and patterned to form a redistribution layer (RDL) 410 (see FIG. 4H). After that, top passivation layer 411 is deposited and patterned to form apertures 412 (see FIG. 4I). The passivation layer 411 could be, but is not limited to epoxy, silicon nitride, silicon oxide, silicon oxynitride, a solder mask, polyimide, benzocyclobutene (BCB), parylene, polynaphthalenes, fluorocarbons and acrylates. Finally, the top side of the substrate is bumped 413 (see FIG. 4J) and diced (see FIG. 4K).

External Hybrid Surface-Bulk WLCSP

Various embodiments provide a hybrid surface-bulk WLCSP technology that combines the Shellcase process and conventional TSV process. Essentially the Shellcase process allows conductors to form over the surface of the chip scale packaging layer and conventional TSV constructs the conductor inside the bulk of the chip scale packaging layer. Some embodiments disclose a hybrid wafer level chip scale packaging technology that allows a portion of the electrical connections to form over the slanted surface of the chip scale packaging layer and a portion of the electrical connections to form inside the bulk of the chip scale packaging layer. Therefore such combinations of surface and bulk formation of conductors enable the construction of reliable electrical connections of a thick chip scale packaging layer. The thickness of the packaging layer could range from 1 to 100 um. Particularly, the thickness of the packaging layer could range from 100 to 800 um.

Example #3

This hybrid surface-bulk WLCSP process can be used in MEMS devices as shown in the following embodiment. FIG. 5 shows the detail description of an embodiment of a MEMS device utilizing the external hybrid surface-bulk WLCSP process described. This example describes a MEMS device comprising an integrated circuit wafer hermetically sealed with a silicon cap wafer (or chip scale packaging layer) with cavity using eutectic or metal diffusion bonding. Conductors are connected from integrated circuit pads through eutectic or metal diffusion bonding to the conductive material of the TSVs and then further coupled through the conductors on the slanted surface of the chip scale packaging layer to the solder bumps on the front side of the silicon cap wafer.

The starting material is the chip scale packaging layer which is typically silicon wafer. The process starts with selectively etching a silicon wafer 501 with deep reactive-ion etching (RIE) etching from the backside of the substrate (see FIG. 5A) to form silicon trenches followed by deposition of a liner passivation 502 not limited to silicon oxide, nitride or oxy-nitride (see FIG. 5B). Immediately after, conductive material 503 not limited to in-situ doped polysilicon or copper is deposited to fill in the bulk silicon trenches (see FIG. 5C) forming the bulk portion of the conductor. Next, the backside of the silicon substrate undergoes chemical mechanical polish to expose the individual TSVs followed by the removal of the front side conductive material (see FIG. 5D).

Figure 5A:
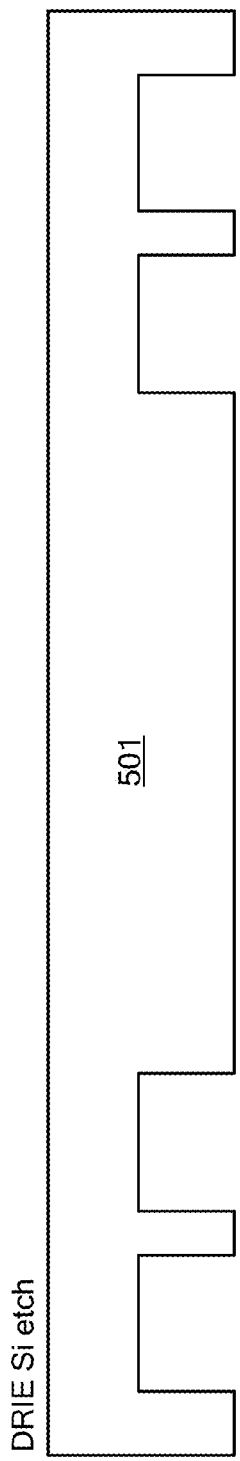
FIGS. 5A-5O, collectively referred to as FIG. 5, illustrate another example of a detailed diagrammatic process flow of a MEMS device using hybrid surface-bulk WLCSP technology as described.
Figure 5B:
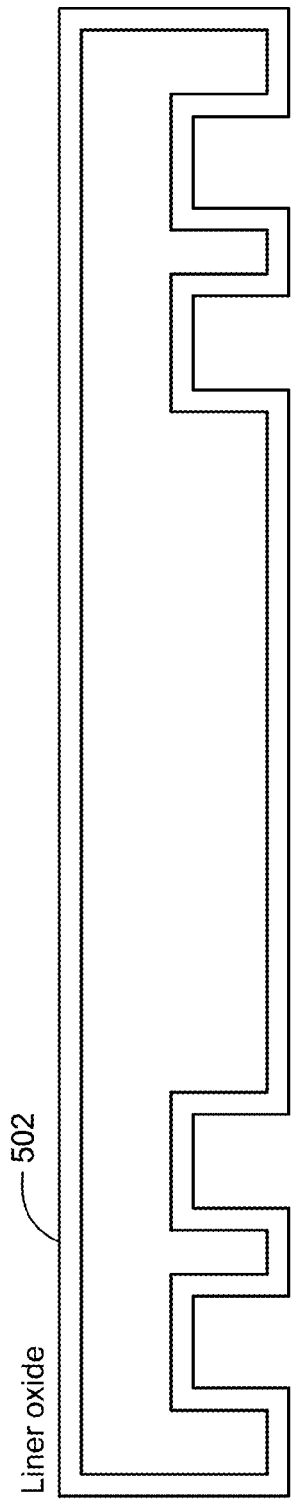
Figure 5C:
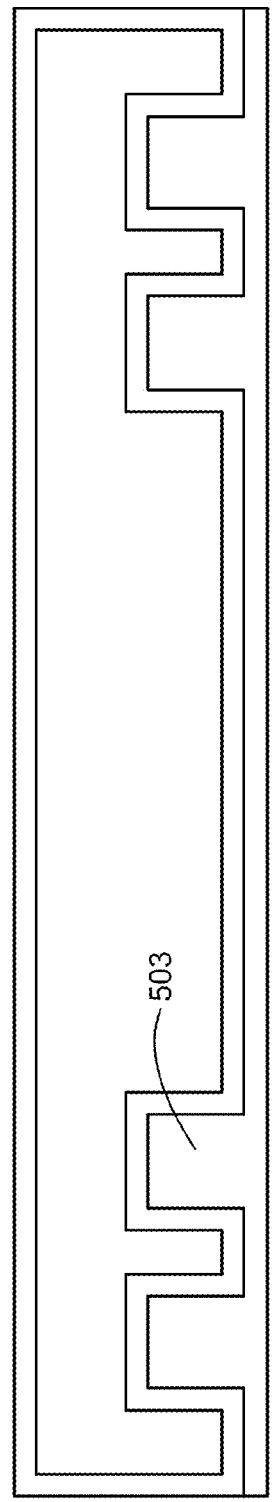
Figure 5D:
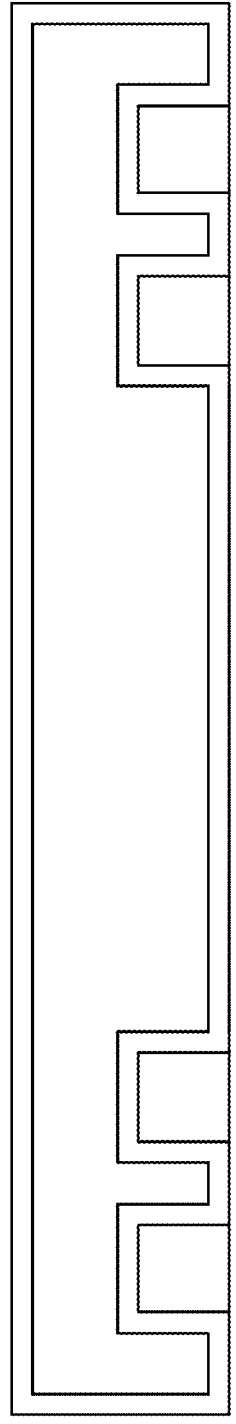
Figure 5E:
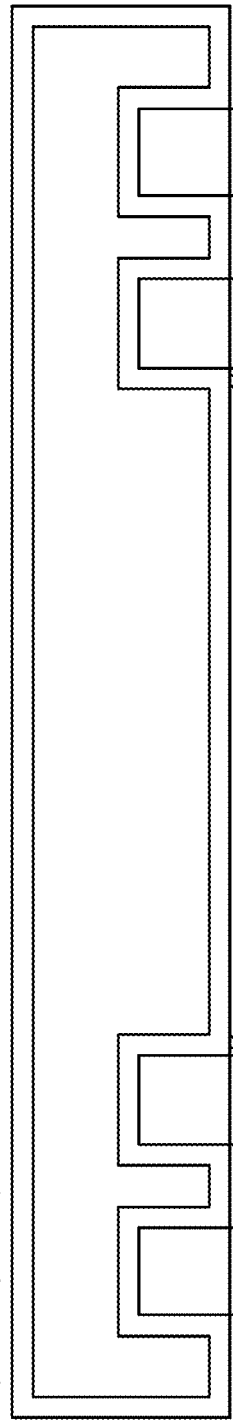
Figure 5F:
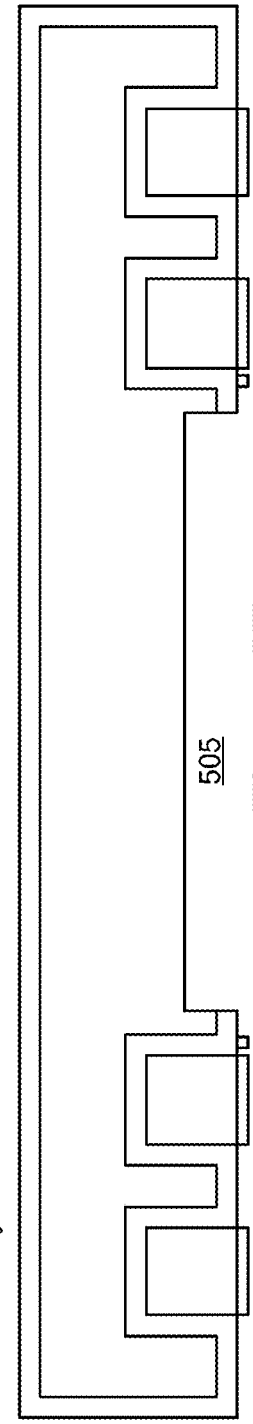

As seen in FIG. 5E, a conductive material is deposited and patterned to define top metal pad 504. While this top metal pad is used as an interconnect pad, it is also used to form a hermetic bonding ring structure with an integrated circuit substrate. The conductive material could be but is not limited to aluminum, copper, gold, silicon, titanium, tin, indium, or germanium.

A mask is deposited to define a silicon cavity 505 by either wet or dry silicon etching (see FIG. 5F) and subsequently removed. The depth of the silicon cavity 505 could range from 10 um to 600 um. The depth of silicon cavity 505 could range from 0.1 um to 10 um. Such mask could be but is not limited to photo-resist, silicon oxide, or nitride.

Figure 5G:
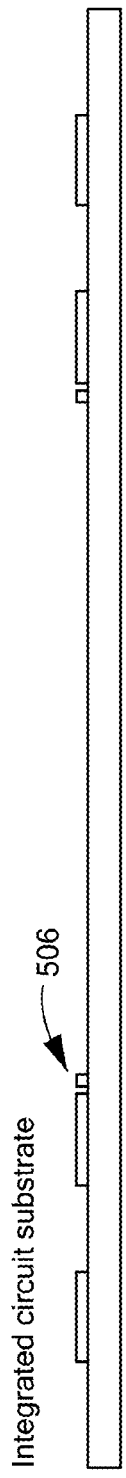
Figure 5H:
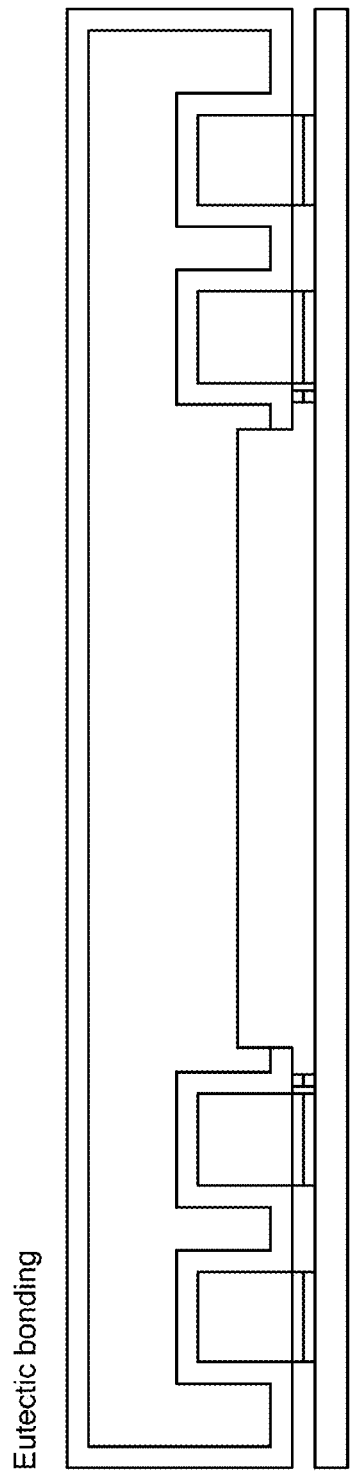
Figure 5I:
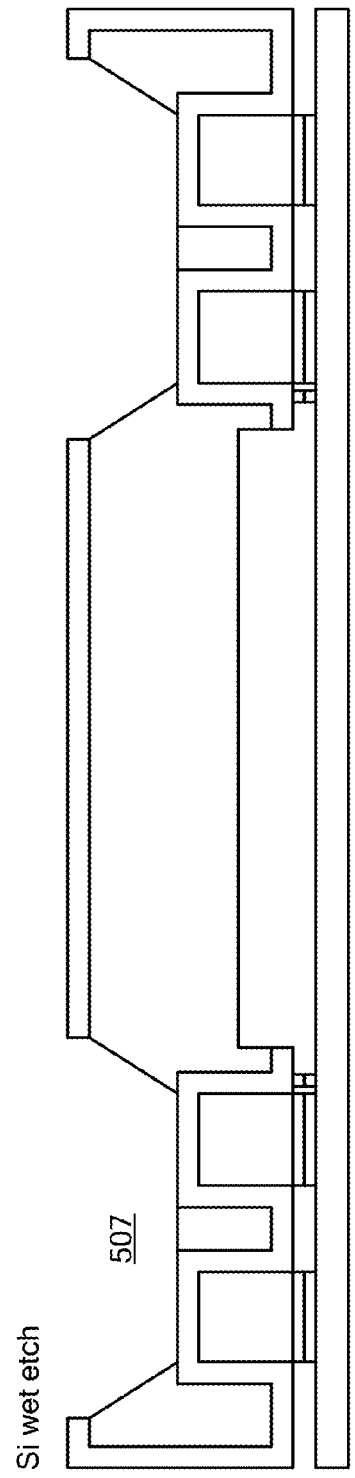
Figure 5J:
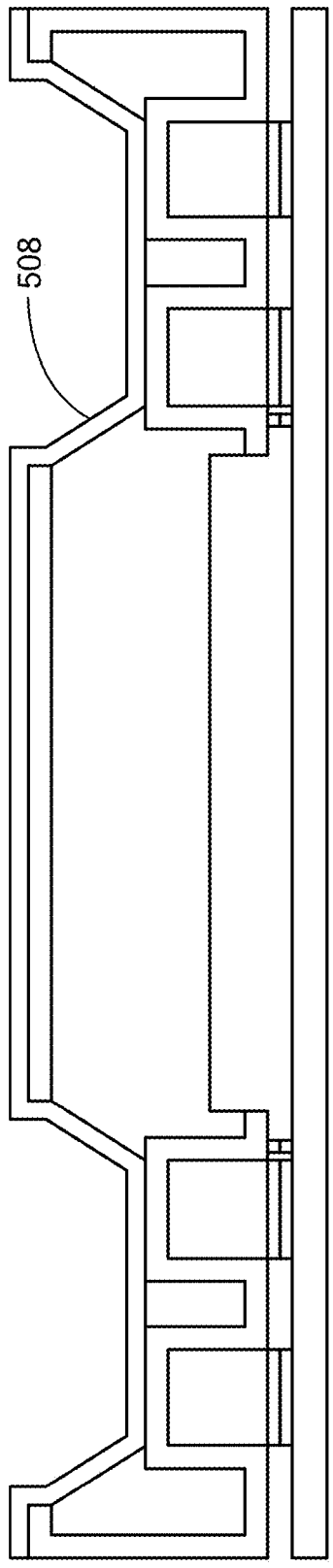

As seen in FIGS. 5G and 5H, the top metal pad 504 on the silicon cap wafer 501 is aligned with a bottom metal pad 506 on the integrated circuit substrate and formed a hermetic eutectic or metal diffusion bonding at elevated temperature. Such cavity 505 could be pressurized with gaseous species not limited to sulphur hexafluoride, xenon, 2,3,3,3-Tetrafluoropropene (HFO1234yf), or propane. The bottom metal pad 506 on the integrated circuit wafer could be but is not limited to aluminum, copper, gold, silicon, titanium, tin, indium, or germanium. A mask is deposited on the top side of the wafer, patterned and defined to form the shape of the silicon pit 507. The mask could be, but is not limited to patterned silicon oxide or nitride or any photo-definable material such as photoresist. The substrate is immersed in silicon wet anisotropic etchant (see FIG. 5I) not limited to potassium hydroxide, Ethylenediamine Pyrocatechol (EDP), hydrazine, and TetraMethyl Ammonium Hydroxide (TMAH) to form a silicon pit exposing the passivation liner oxide of the TSVs. Such silicon cavity 507 etched by wet etchant usually has a slope of 54.7° with the substrate. Alternatively, etching could be done by dry etching or laser etching. After that, a passivation layer 508 (see FIG. 5J) is deposited to passivate the exposed slanted silicon sidewall. The passivation layer 508 could be, but is not limited to epoxy, silicon nitride, silicon oxide, silicon oxynitride, a solder mask, polyimide, benzocyclobutene (BCB), parylene, polynaphthalenes, fluorocarbons and acrylates. The passivation layer 508 could be formed by spin coating, spray coating, curtain coating, liquid phase deposition, physical vapor deposition, chemical vapor deposition, low pressure chemical vapor deposition, plasma enhanced chemical vapor deposition, rapid thermal chemical vapor deposition or atmospheric pressure chemical vapor deposition.

Figure 5K:
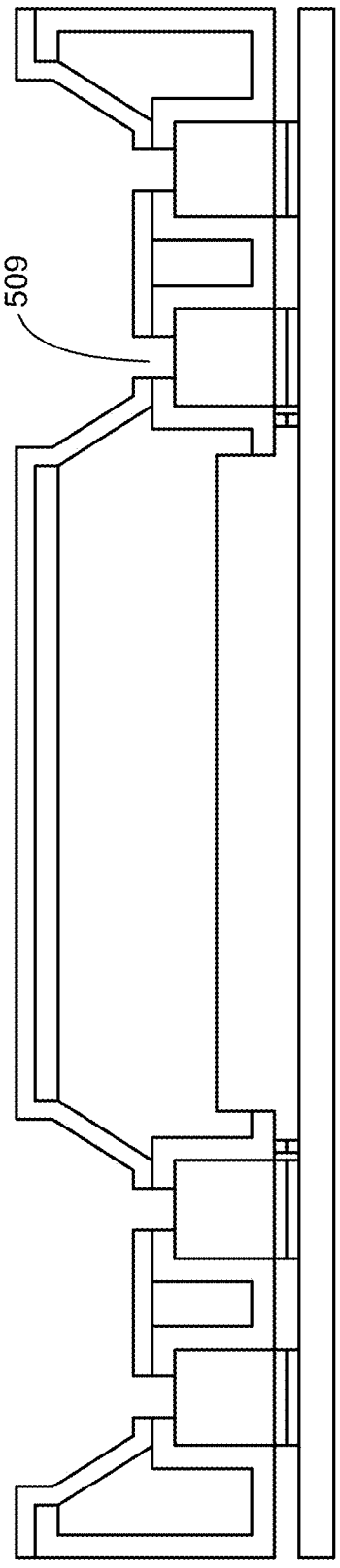
Figure 5L:
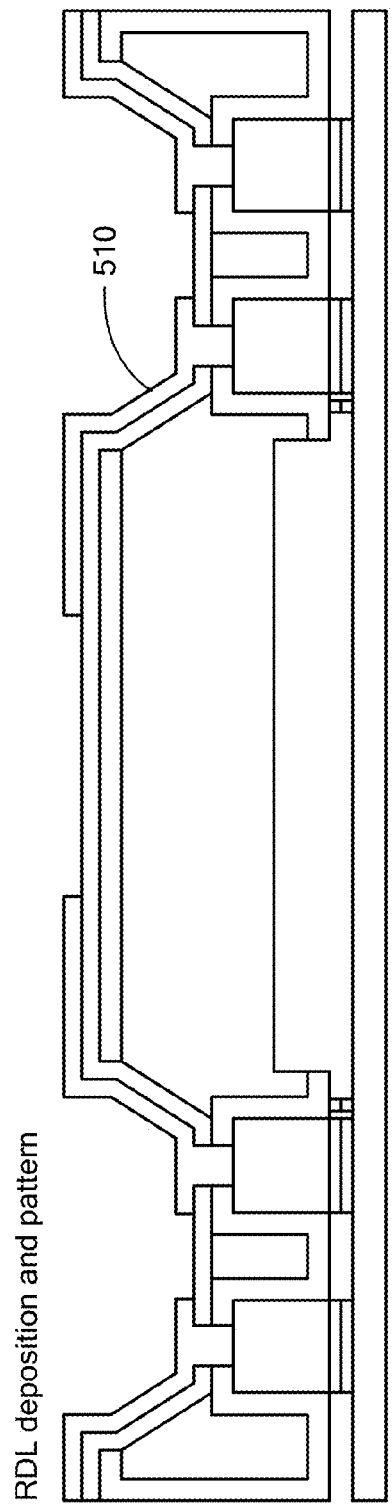

After that, the via is then defined by patterning using conventional photolithography at the bottom of the silicon pit followed by revealing via 509 through etching passivation layer and liner oxide either by wet etching, dry etching or laser etching (see FIG. 5K). Metal 510 such as but not limited to aluminum, copper, titanium, titanium tungsten, chromium, or any combination is deposited on the top and sidewall of the substrate and patterned to form a RDL (see FIG. 5L).

Figure 5M:
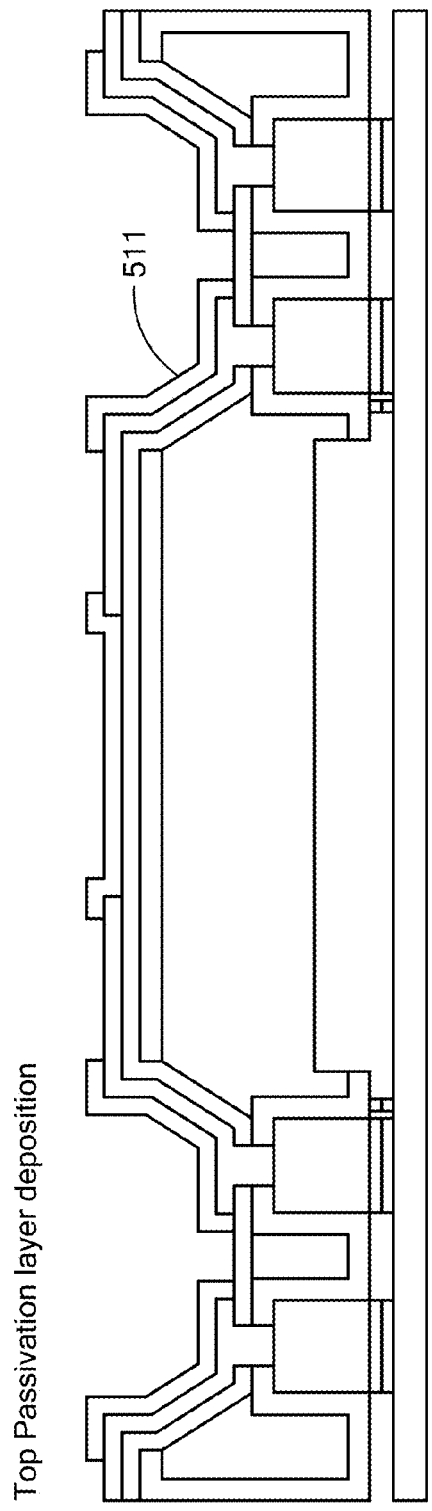
Figure 5N:
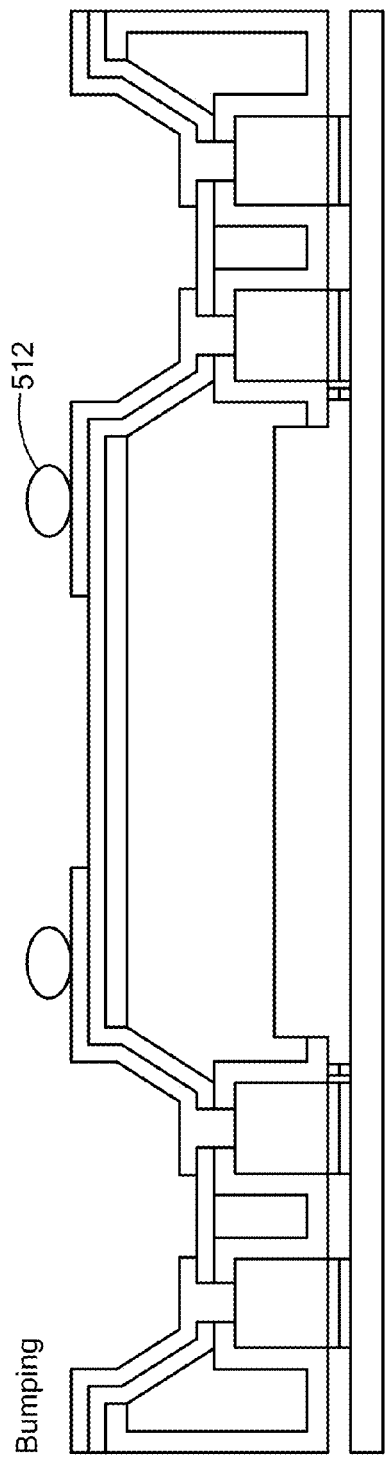
Figure 5O:
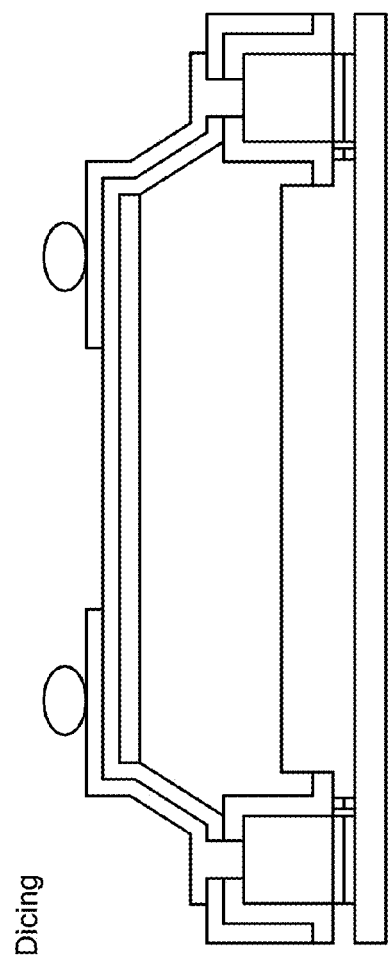

Top passivation layer 511 is formed (see FIG. 5M). The passivation layer 511 could be, but is not limited to epoxy, silicon nitride, silicon oxide, silicon oxynitride, a solder mask, polyimide, benzocyclobutene (BCB), parylene, polynaphthalenes, fluorocarbons and acrylates. Finally, the top side of the substrate is bumped 512 (see FIG. 5N) and diced (see FIG. 5O) in this embodiment along the bottom of the silicon pit 507.

Example #4

Another example of using hybrid surface-bulk WLCSP is a similar MEMS structure as shown in the following embodiment shown in Figure. FIGS. 6A-6E reflect a start that is similar to that in FIGS. 5A-5E. The silicon wafer 601 is etched with deep reactive-ion etching (RIE) etching and a liner passivation 602 is formed. Then a conductive material 603 is deposited to fill in the trenches (see and a chemical mechanical polish is used to expose the individual TSVs followed by the removal of the front side conductive material. Another conductive material is deposited and patterned to define top metal pad 604.

Figure 6A:
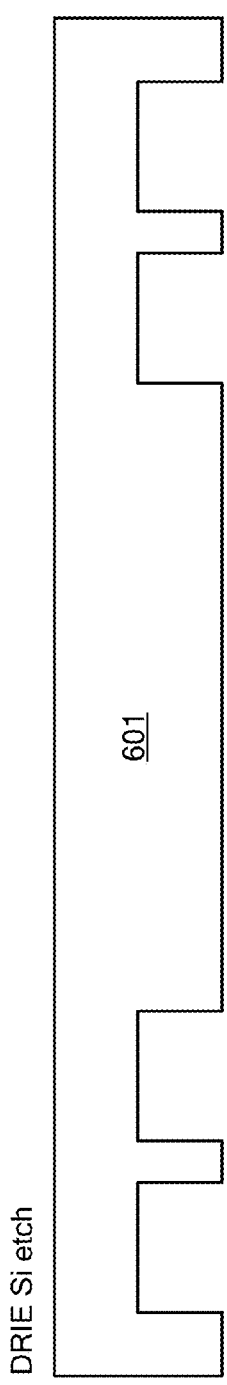
FIGS. 6A-6N, collectively referred to as FIG. 6, illustrate another example of a detailed diagrammatic process flow of a MEMS device using hybrid surface-bulk WLCSP technology as described.
Figure 6B:
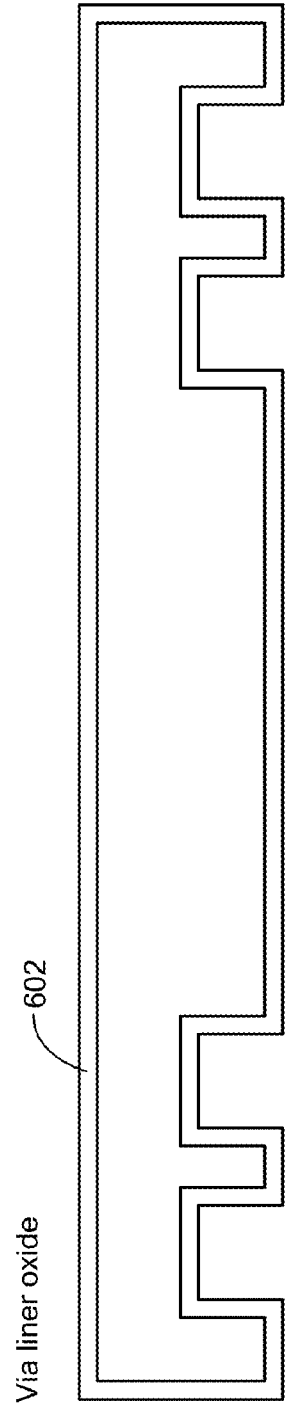
Figure 6C:
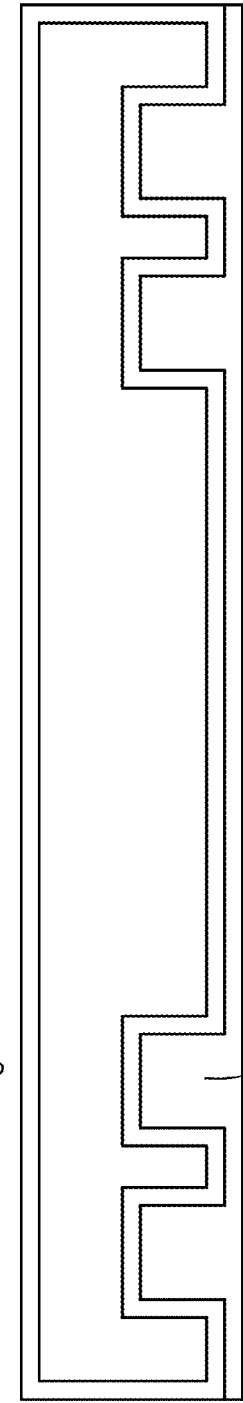
Figure 6D:
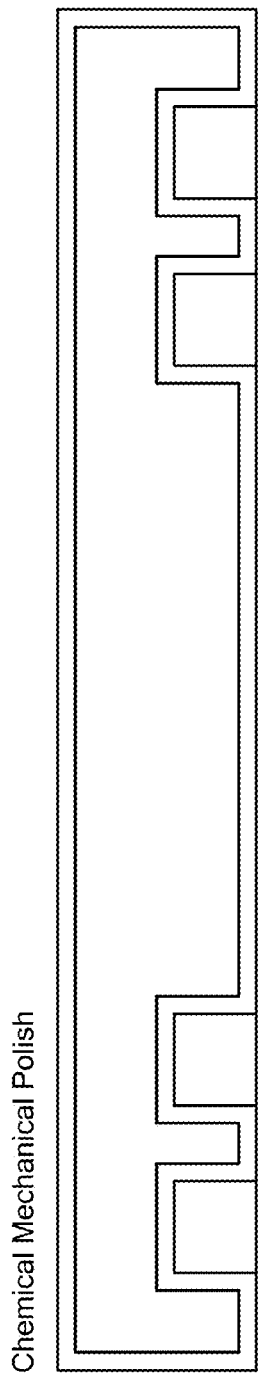
Figure 6E:
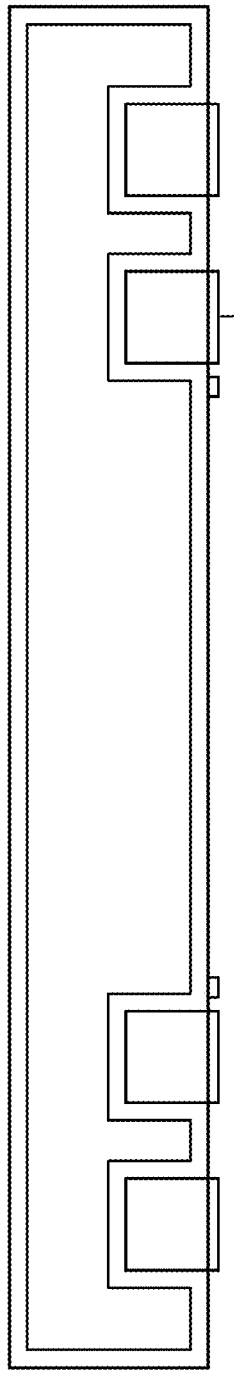
Figure 6F:
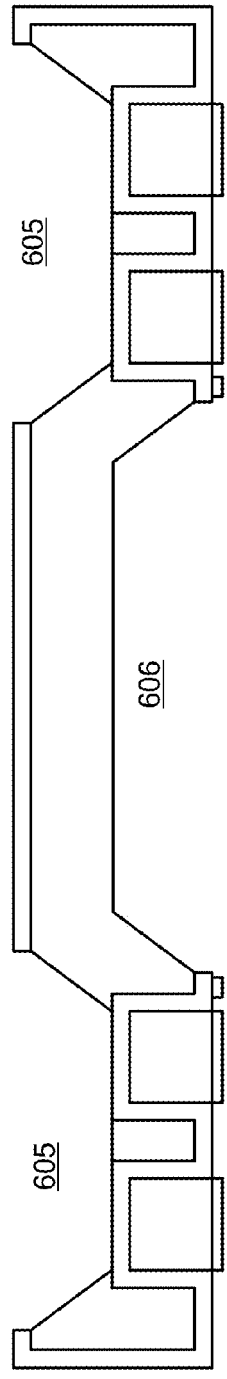
Figure 6G:
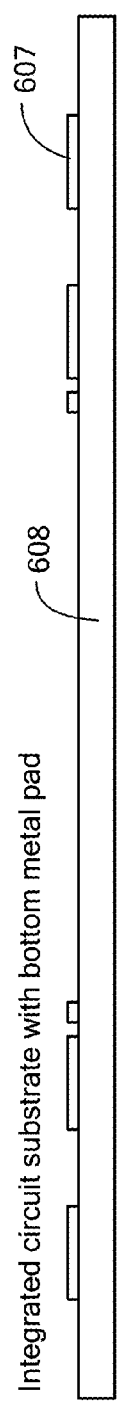

After that, a mask not limited to photoresist, silicon oxide, or nitride is deposited and patterned on the back side of the substrate to define silicon cavity 605. Another mask not limited to photoresist, silicon oxide, or nitride is deposited and patterned on the front side of the substrate to define silicon pit 606. Next, liner oxide and underlying silicon are etched either by dry or wet etching. The wafer will undergo an anisotropic etching not limited to potassium hydroxide (KOH) etching (see FIG. 6F) and stops etching from the front on the liner oxide to form silicon pit 606. It also etches from the back side of the wafer forming silicon cavity 605. The protective mask is then removed from the front and back side.

Figure 6H:
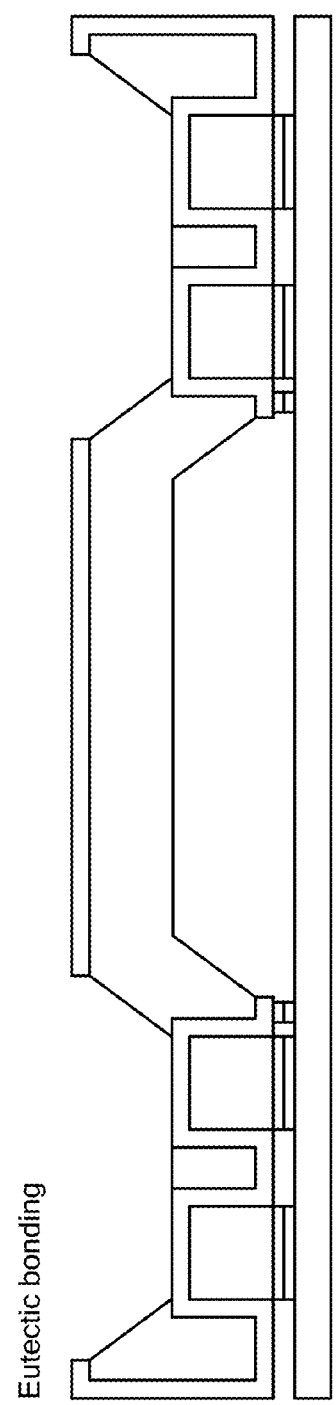
Figure 6I:
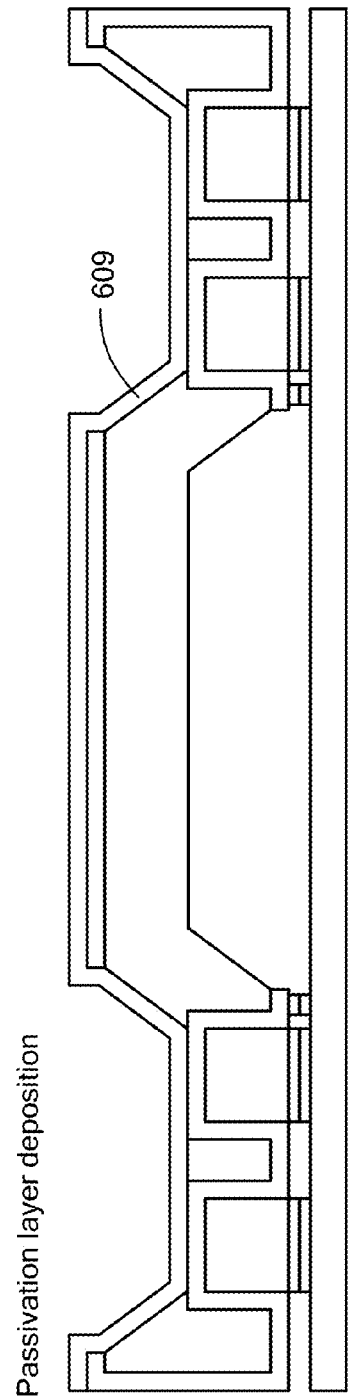
Figure 6J:
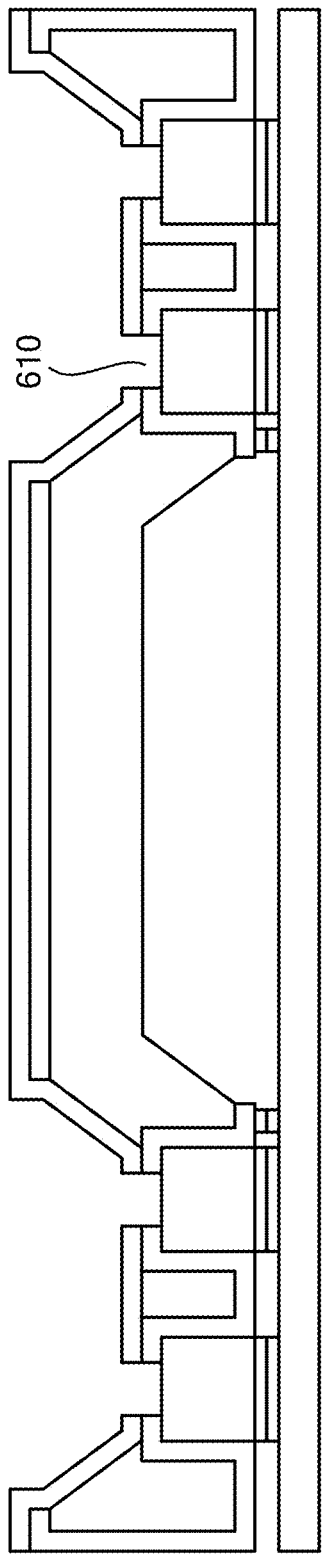
Figure 6K:
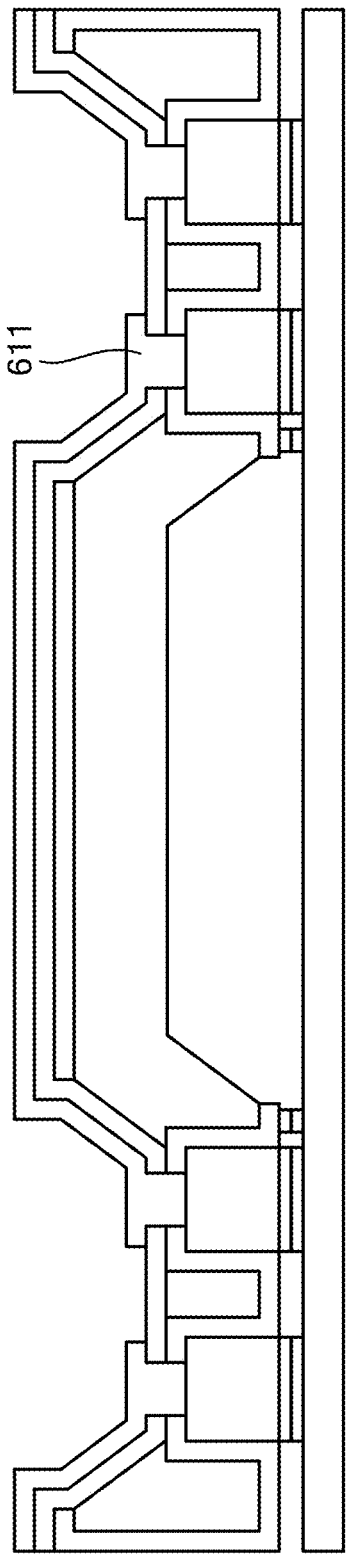
Figure 6L:
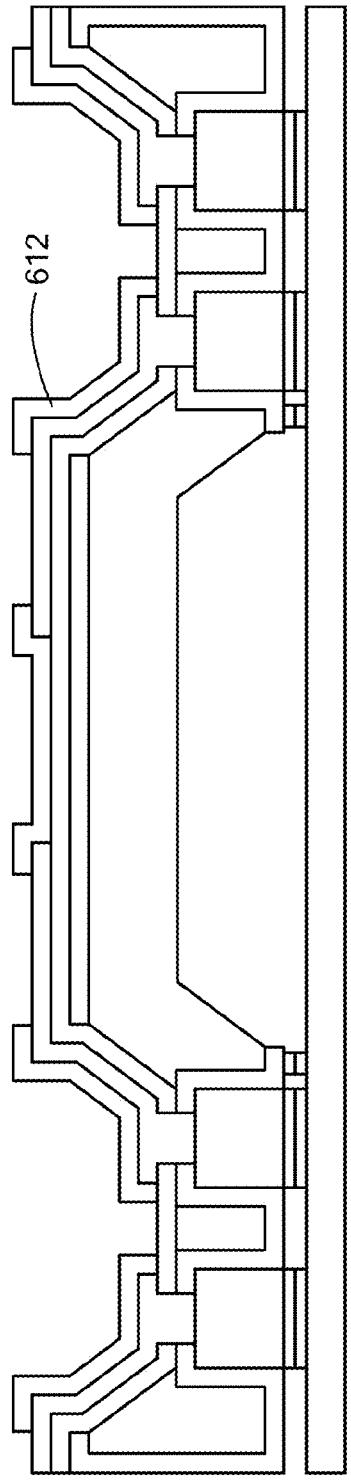
Figure 6M:
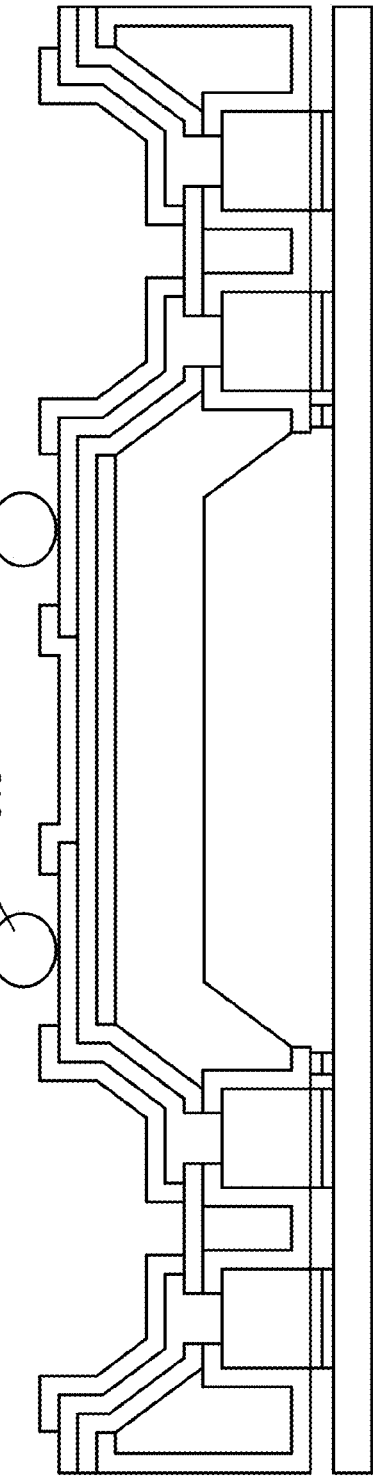
Figure 6N:
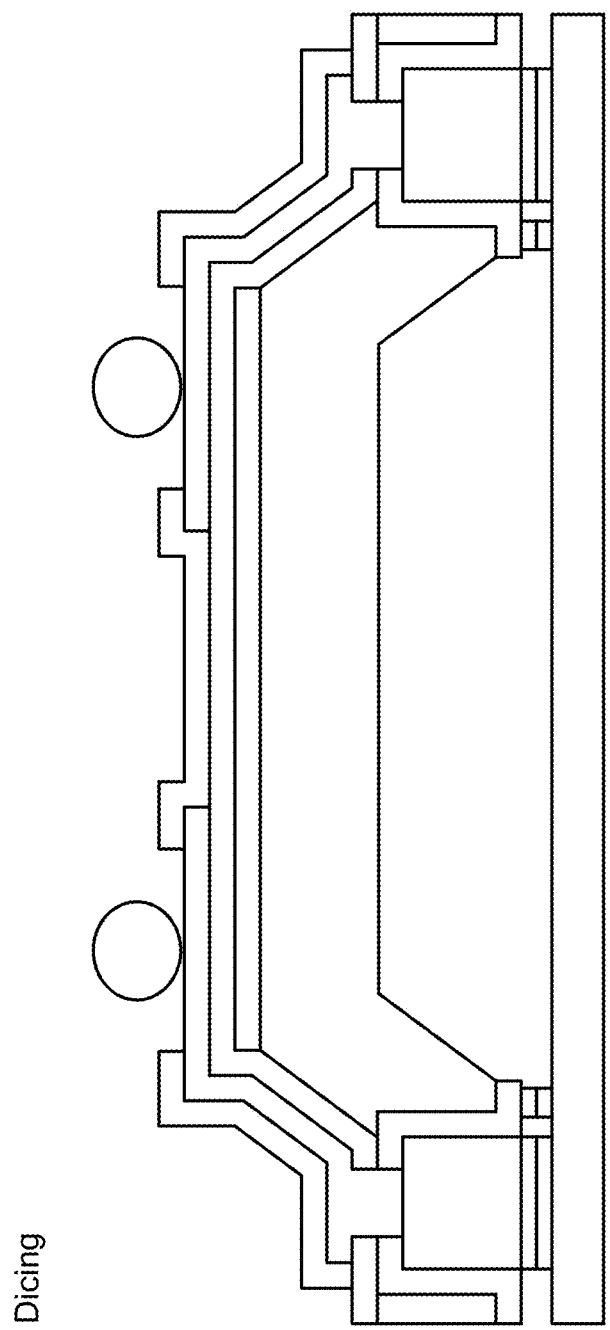

The MEMS wafer is bonded to the integrated circuit wafer by forming eutectic or metal diffusion bonding (see FIG. 6H), wherein the integrated circuit wafer comprising bottom metal pads that can bond with top metal pad previously deposited on the silicon cap wafer under elevated temperature. The bottom metal layer on the integrated circuit wafer could be but is not limited to aluminum, copper, gold, silicon, titanium, tin, indium, or germanium.

The rest of the process steps in FIGS. 6I-6N are similar to that in FIGS. 5J-5O. Via 610 is revealed through etching of the passivation layer 609. Metal 612 is deposited on the top and sidewall of the substrate and patterned to form a RDL. Top passivation layer 612 is formed. Finally, the top side of the substrate is bumped 613 and diced in this embodiment along the bottom of the silicon pit 605.

Example #5: Internal Hybrid Surface-Bulk WLCSP

A different kind of hybrid surface-bulk WLCSP process can be used in MEMS device as shown in the following embodiment. FIG. 7 shows the detail description of an embodiment of a MEMS device utilizing the internal hybrid surface-bulk WLCSP process described. This example describes a MEMS device comprising an integrated circuit wafer hermetically sealed with a silicon cap wafer (or chip scale packaging layer) with cavity 704 using eutectic or metal diffusion bonding. Conductors are connected from integrated circuit pads through eutectic or metal diffusion bonding to the conductors on the slanted surface of the silicon cavity 704 and then further coupled through the TSV conductors to the solder bumps on the front side of the silicon cap wafer. Instead of routing along silicon pit located external to the silicon cap wafer as in example #1, and #2, conductors run along the slanted surface of the silicon cavity 704 internal to the silicon cap wafer 701 similar to example #2.

The starting material is the chip scale packaging layer which is typically a silicon wafer 701. The process starts with selectively etching silicon wafer 701 with deep RIE etching from the backside of the substrate (see FIG. 7A) to form silicon trenches followed by deposition of a liner passivation layer 702 not limited to silicon oxide, nitride or oxy-nitride (see FIG. 7B). Immediately after, conductive material 703 not limited to in-situ doped poly-silicon or copper is deposited to fill in the bulk silicon trenches (see FIG. 7C) forming the bulk portion of the conductor. Next, the backside of the silicon substrate undergoes chemical mechanical polish (see FIG. 7D) to expose individual TSVs followed by the removal of the front side conductive material (see FIG. 7E). A mask is deposited to define a silicon cavity 704. Such a mask could be but is not limited to photo-resist, silicon oxide, or nitride.

The substrate is immersed in a silicon wet anisotropic etchant (see FIG. 7F) not limited to potassium hydroxide, Ethylenediamine Pyrocatechol (EDP), hydrazine, and TetraMethyl Ammonium Hydroxide (TMAH) to form a silicon pit 704 exposing the passivation liner oxide of the TSVs. Such a silicon cavity 704 usually has a slope of 54.7° with the substrate. Alternatively, etching could be done by dry etching or laser etching. After that, a passivation layer 705 (see FIG. 7G) is deposited to passivate the exposed slanted silicon sidewall. The passivation layer 705 could be, but is not limited to epoxy, silicon nitride, silicon oxide, silicon oxynitride, a solder mask, polyimide, benzocyclobutene (BCB), parylene, polynaphthalenes, fluorocarbons and acrylates. The passivation layer 705 could be formed by spin coating, spray coating, curtain coating, liquid phase deposition, physical vapor deposition, chemical vapor deposition, low pressure chemical vapor deposition, plasma enhanced chemical vapor deposition, rapid thermal chemical vapor deposition or atmospheric pressure chemical vapor deposition. The depth of silicon cavity 704 could range from 10 um to 600 um. The depth of silicon cavity 704 could range from 0.1 um to 10 um.

Figure 7A:
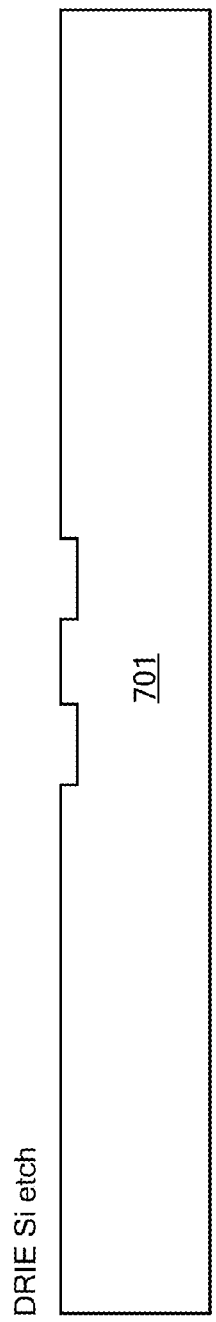
FIGS. 7A-7O, collectively referred to as FIG. 7, illustrate another example of a detailed diagrammatic process flow of a MEMS device using internal hybrid surface WLCSP technology as described.
Figure 7B:
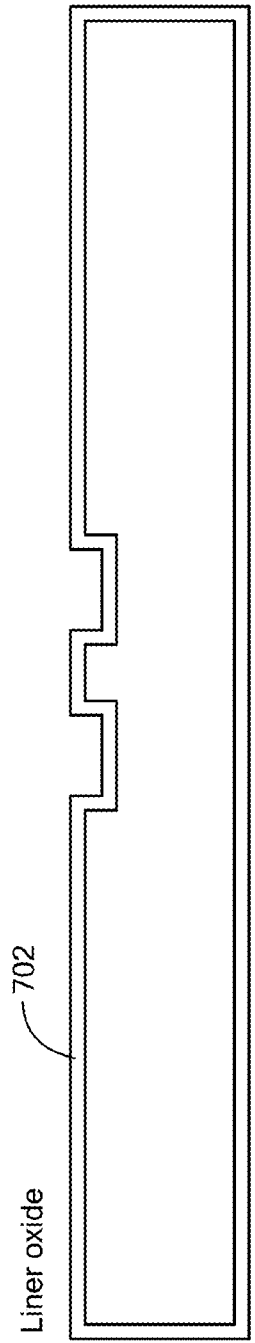
Figure 7C:
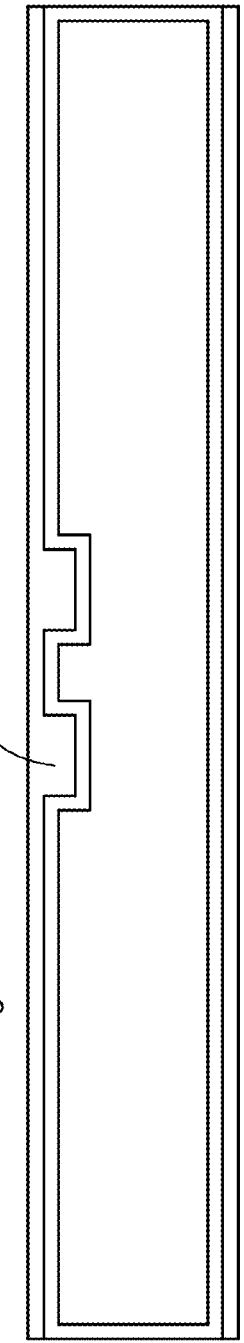
Figure 7D:
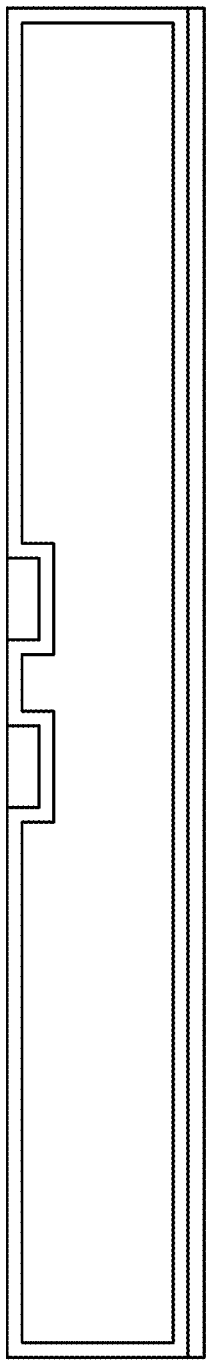
Figure 7E:
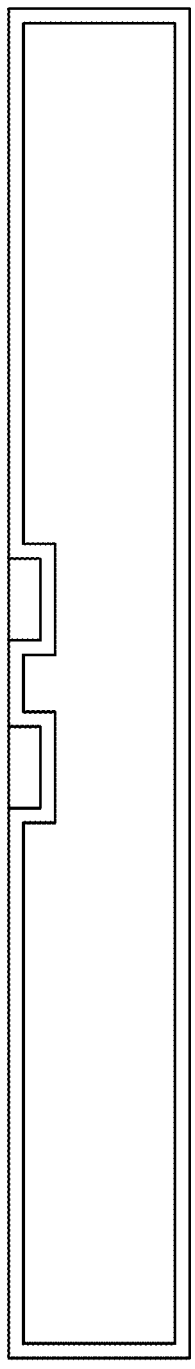
Figure 7F:
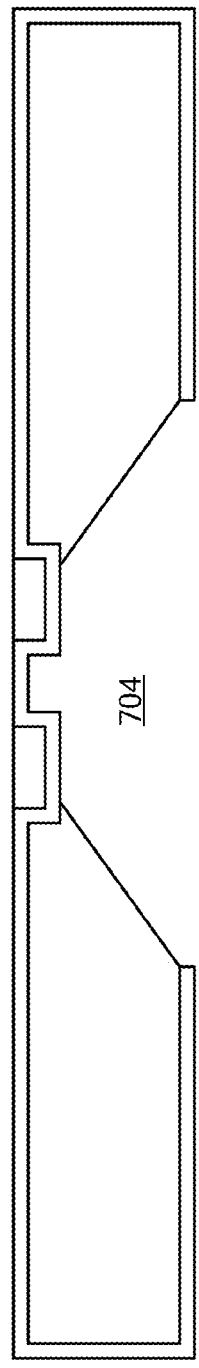
Figure 7G:
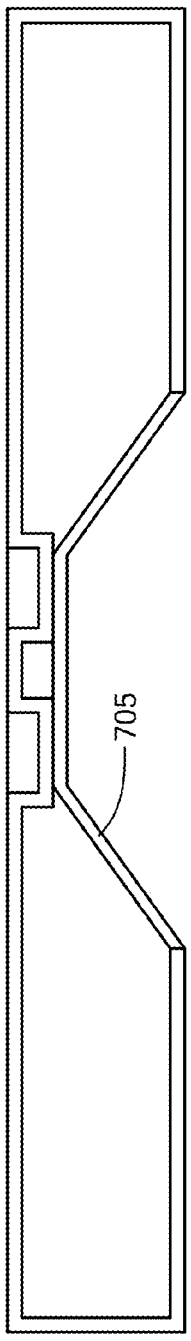
Figure 7H:
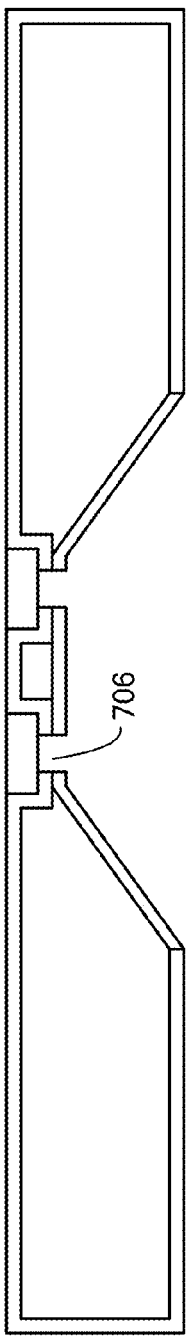
Figure 7I:
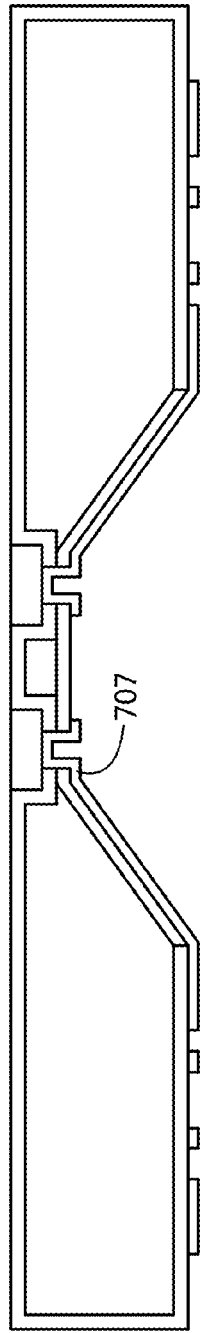
Figure 7J:
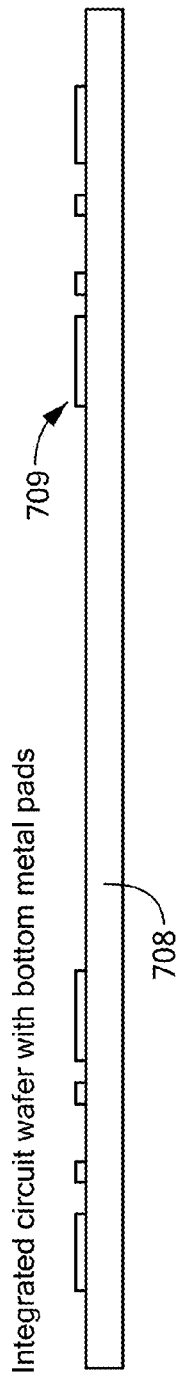
Figure 7K:
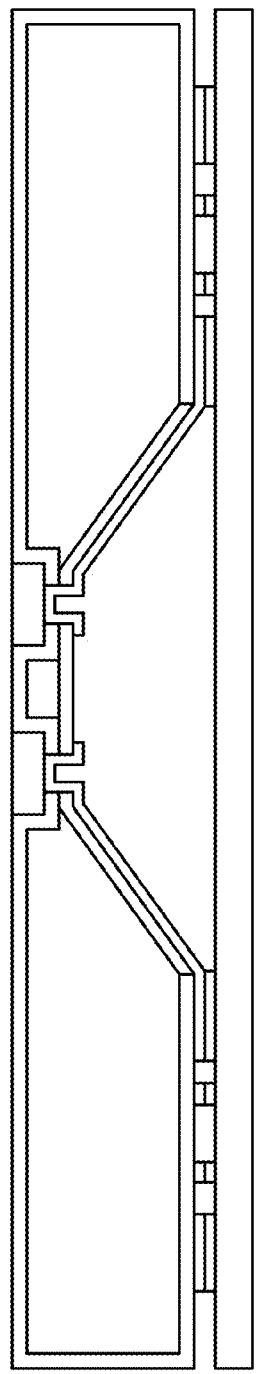
Figure 7L:
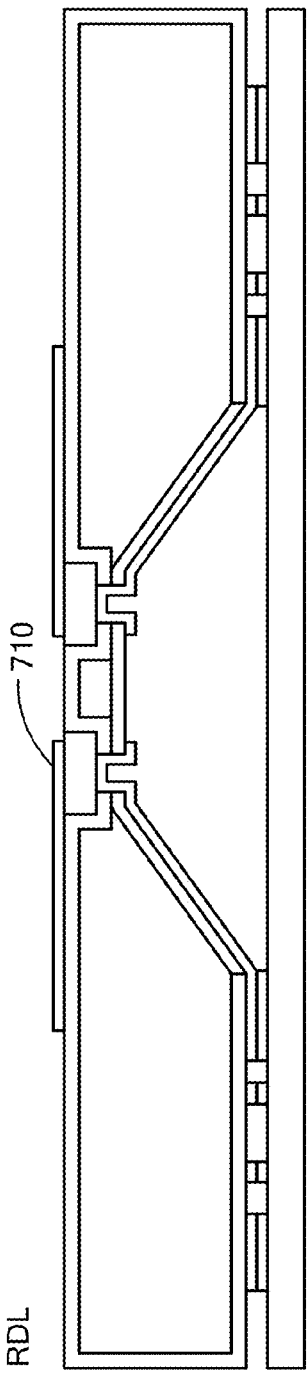
Figure 7M:
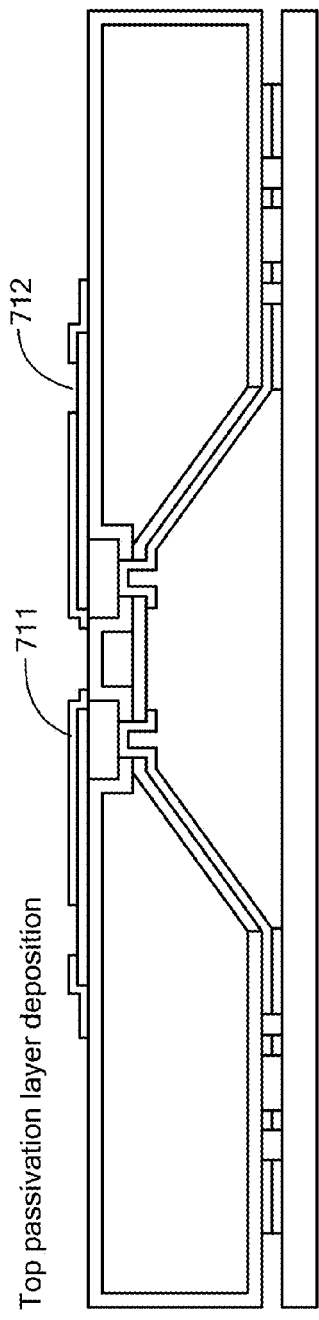
Figure 7N:
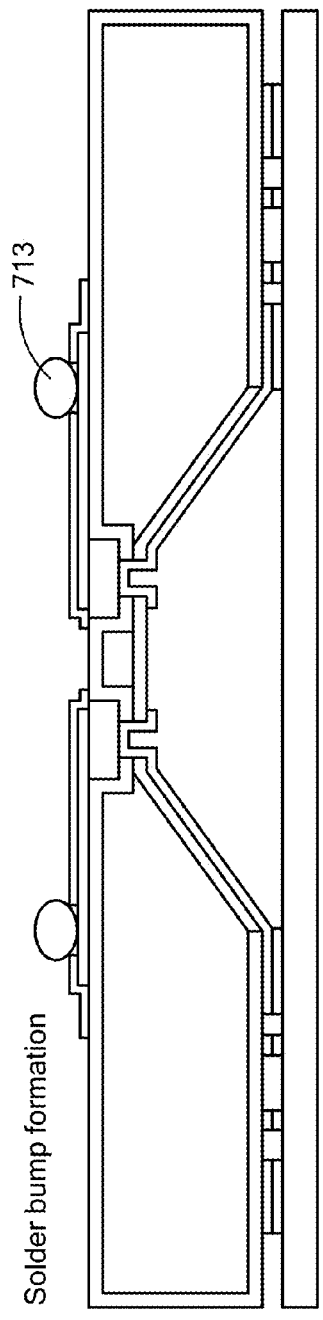
Figure 7O:
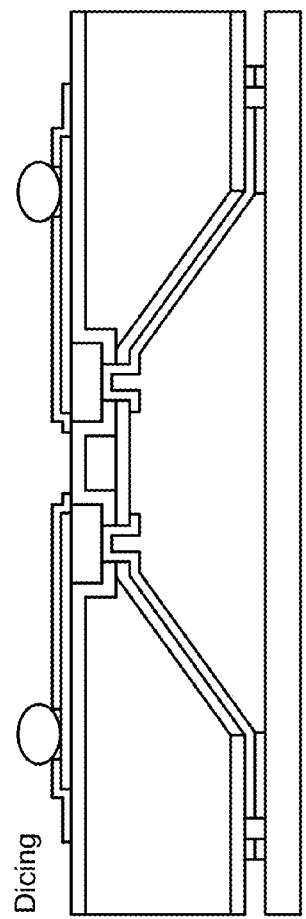

After that, a via 706 is then defined by patterning using conventional photolithography at the bottom of the silicon pit 704 followed by revealing via 706 through etching passivation layer and liner oxide either by wet etching, dry etching or laser etching (see FIG. 7H). Top metal pads 707 such as but not limited to aluminum, copper, titanium, titanium tungsten, chromium, or any combination are deposited on the top and sidewall of the substrate and patterned to form top metal pad (see FIG. 7I). As seen in FIG. 7K, the top metal pad 707 on the silicon cap wafer 701 is aligned with bottom metal pad 709 on the integrated circuit substrate 708 to form a hermetic eutectic or metal diffusion bonding at elevated temperature. Such cavity 704 could be pressurized with gaseous species not limited to sulphur hexafluoride, xenon, or 2,3,3,3-Tetrafluoropropene (HFO1234yf), or propane. The bottom metal pad 709 on the integrated circuit wafer 708 could be but is not limited to aluminum, copper, gold, silicon, titanium, tin, indium, or germanium. Next, metal such as but not limited to aluminum, copper, titanium, titanium tungsten, chromium, or any combination is deposited on the top and sidewall of the substrate and patterned to form a RDL 710 (see FIG. 7L). After that, top passivation layer 711 is deposited and patterned to form apertures 712 (see FIG. 7M). The passivation layer 711 could be, but is not limited to epoxy, silicon nitride, silicon oxide, silicon oxynitride, a solder mask, polyimide, benzocyclobutene (BCB), parylene, polynaphthalenes, fluorocarbons and acrylates. Finally, the top side of the substrate is bumped 712 (see FIG. 7N) and diced (see FIG. 7O).

Example #6: External/Internal Same Side Hybrid Surface-Bulk WLCSP

This example describes a MEMS device comprising an integrated circuit wafer hermetically sealed with a silicon cap wafer (or chip scale packaging layer) with cavity using eutectic or metal diffusion bonding. Conductors are connected from integrated circuit pads through eutectic or metal diffusion bonding to the conductive material of the TSVs and then further coupled to the solder bumps on the front side of the silicon cap wafer. The silicon wet etching that forms slanted surface and deep RIE etching for TSVs is performed on the same side of the substrate, unlike as shown in previous examples.

Figure 8A:
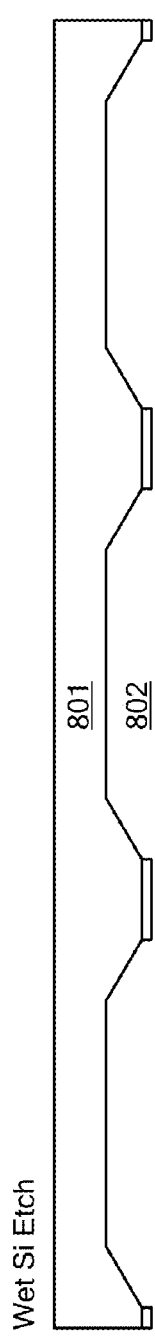
FIGS. 8A-8M, collectively referred to as FIG. 8, illustrate another example of a detailed diagrammatic process flow of a MEMS device using bulk WLCSP technology as described.
Figure 8B:
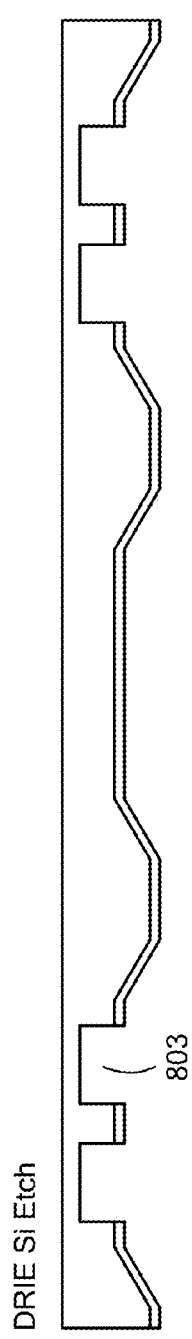
Figure 8C:
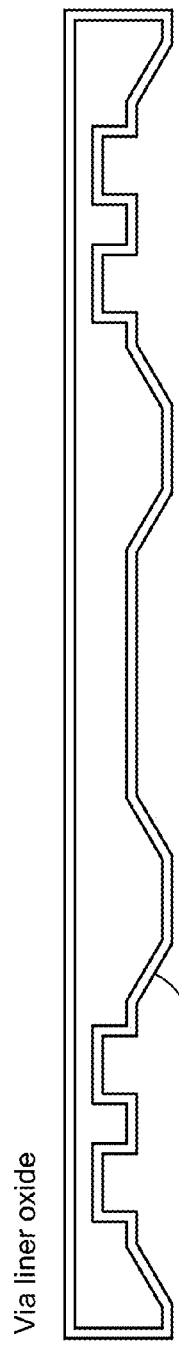
Figure 8D:
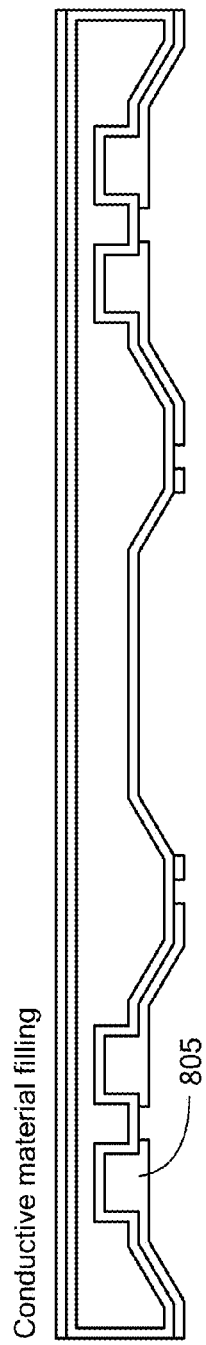

The starting material is the chip scale packaging layer (typically silicon wafer) which starts with selectively etching silicon wafer 801 with wet etching from the backside of the substrate (see FIG. 8A) to form silicon cavity 802. The depth of silicon cavity 802 could range from 10 um to 600 um. The depth of silicon cavity 802 could range from 0.1 um to 10 um. Another mask is then deposited and patterned so that the silicon wafer 801 is selectively etched with deep RIE etching forming the silicon trenches 803 (see FIG. 8B). Both silicon etchings are done from the same side of the substrate instead of opposite side as in previous examples. After that, a liner passivation layer 804 not limited to silicon oxide, nitride or oxy-nitride is deposited (see FIG. 8C). Immediately after, conductive material 805 not limited to in-situ doped poly-silicon or copper is deposited to fill in the bulk silicon trenches 803 (see FIG. 8D) forming the bulk and the surface portion of the conductor.

Figure 8E:
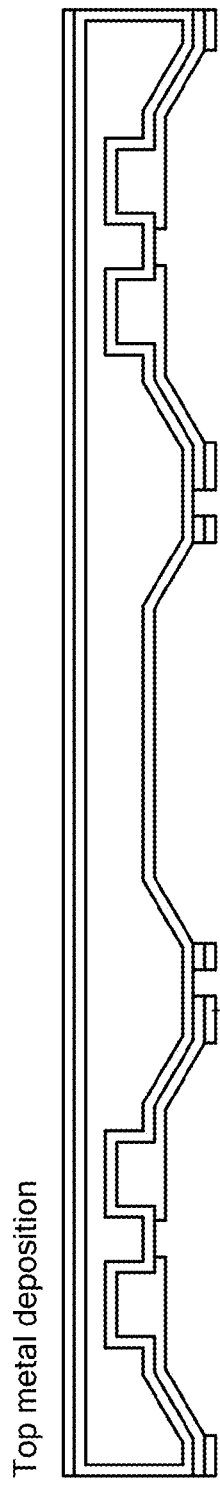
Figure 8F:
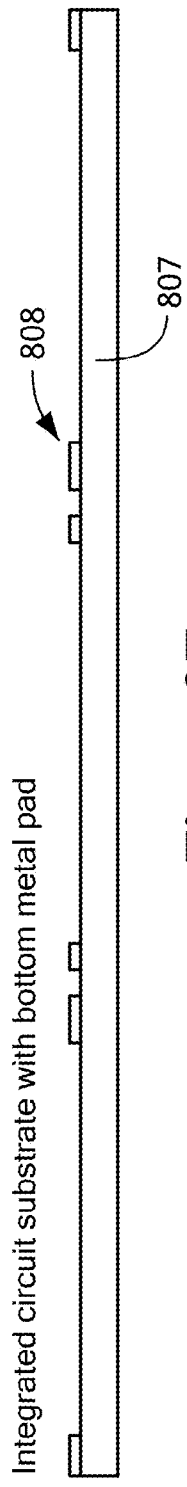
Figure 8G:
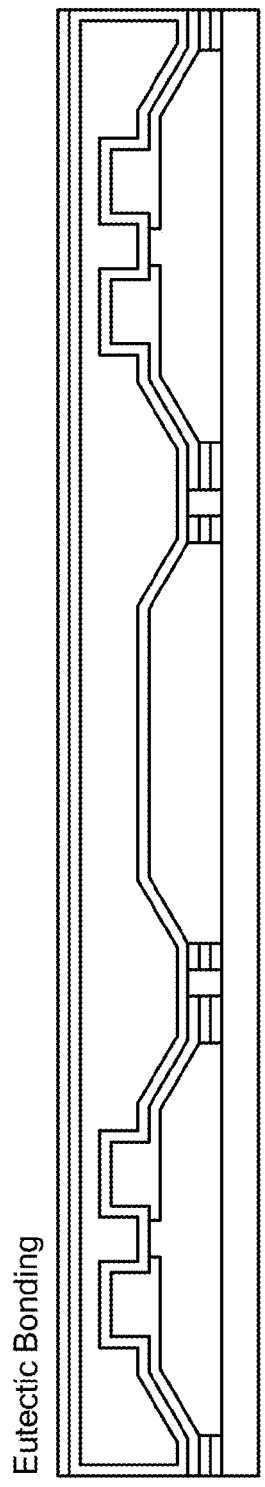
Figure 8H:
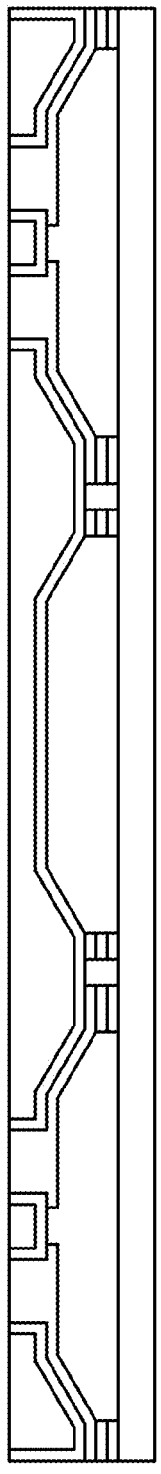

As seen in FIG. 8E, a conductive material is deposited and patterned to define top metal pad 806. While this top metal pad 806 is used as interconnect pad, it is also used to form a hermetic bonding ring structure with an integrated circuit substrate. The conductive material could be but is not limited to aluminum, copper, gold, silicon, titanium, tin, indium, or germanium. FIG. 8F shows the top metal pad 806 on the silicon cap wafer 801 is aligned with bottom metal pad 808 on the integrated circuit substrate 807 and a hermetic eutectic or metal diffusion bonding is formed at elevated temperature (see FIG. 8G). The cavity 802 could be pressurized with gaseous species not limited to sulphur hexafluoride, xenon, or 2,3,3,3-Tetrafluoropropene (HFO1234yf), or propane. The bottom metal pad 808 on the integrated circuit wafer 807 could be but is not limited to aluminum, copper, gold, silicon, titanium, tin, indium, or germanium. Next, the front side of the silicon substrate undergoes chemical mechanical polish to expose individual TSVs (see FIG. 8H) followed by another passivation layer deposition 809.

Figure 8I:
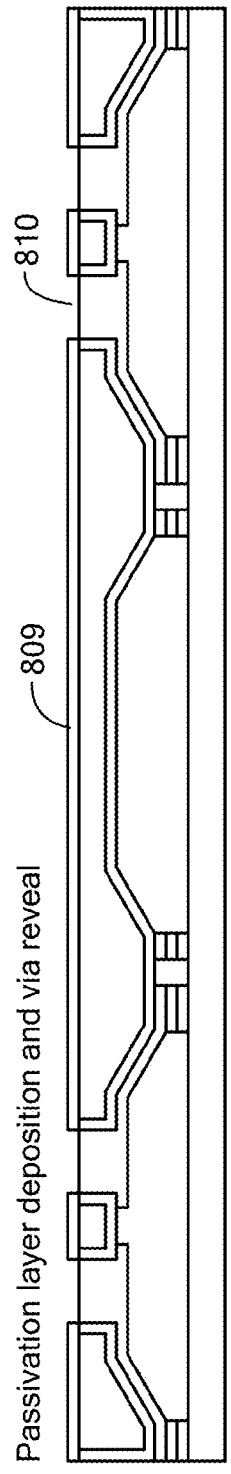
Figure 8J:
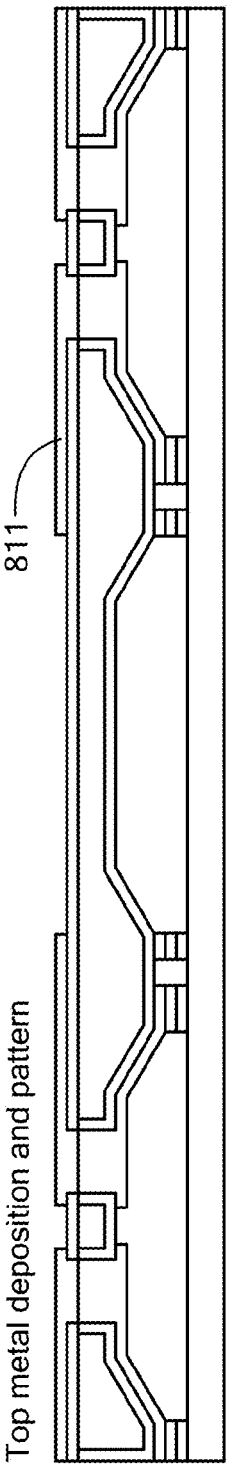
Figure 8K:
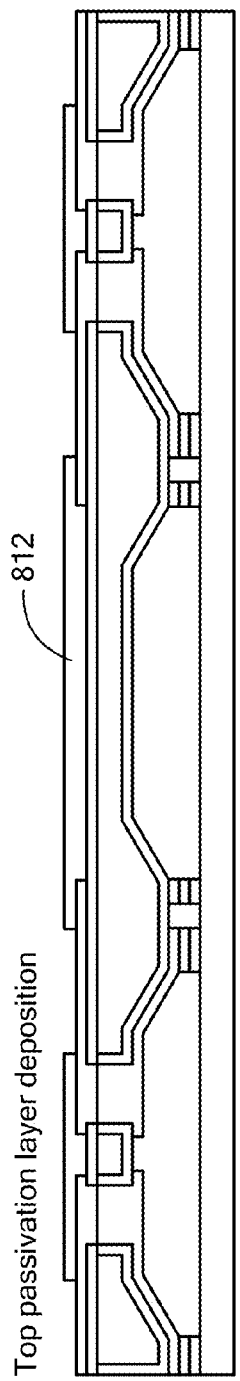
Figure 8L:
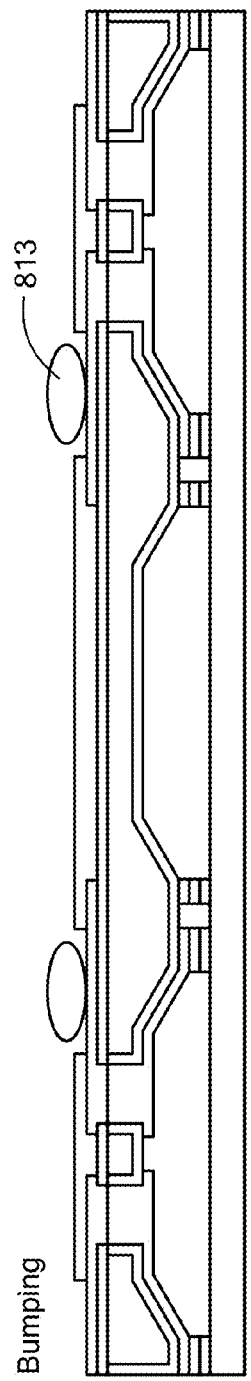
Figure 8M:
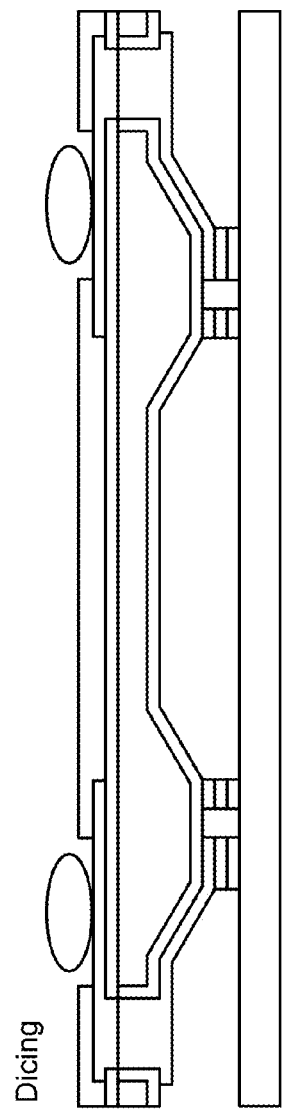

After that, at least one via is then defined by patterning using conventional photolithography followed by revealing via 810 through etching passivation layer 809 either by wet etching, dry etching or laser etching (see FIG. 8I). Metal 811 such as but not limited to aluminum, copper, titanium, titanium tungsten, chromium, or any combination is deposited on the top of the substrate and patterned to form a RDL (see FIG. 8J). Top passivation layer 812 is formed (see FIG. 8K). Finally, the top side of the substrate is bumped 813 (see FIG. 8L) and diced (see FIG. 8M) in this embodiment.

Similar design of MEMS structure is also shown in FIG. 9 where part of the conductors are formed along the internal cavity.

FIG. 9 illustrates another example of a detailed diagrammatic process flow of a MEMS device using same side hybrid surface-bulk WLCSP technology as described. Silicon wafer 901 is etched with wet etching from the backside of the substrate (see FIG. 9A) to form silicon cavity 902. The depth of silicon cavity 902 could range from 10 um to 600 um or from 0.1 um to 10 um. The silicon wafer 901 is selectively etched with deep RIE etching forming the silicon trenches 903 (see FIG. 9B). Both silicon etchings are done from the same side of the substrate.

Figure 9A:
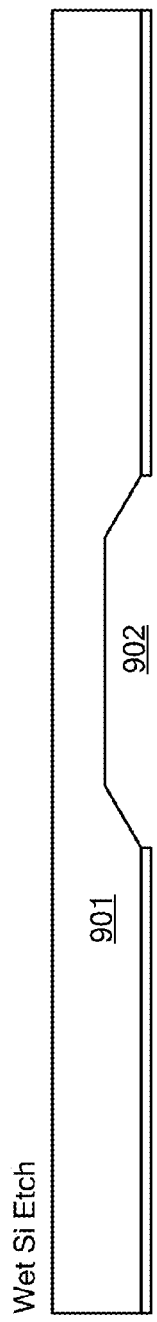
FIGS. 9A-9M, collectively referred to as FIG. 9, illustrate another example of a detailed diagrammatic process flow of a MEMS device.
Figure 9B:
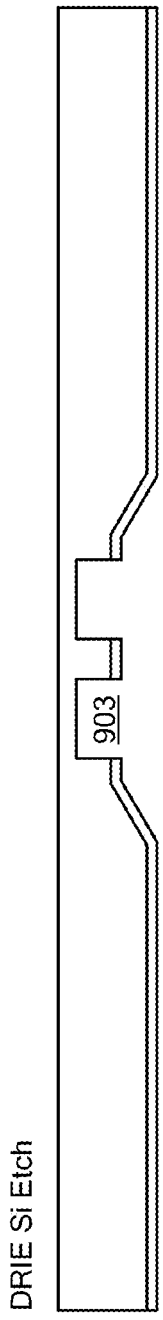
Figure 9C:
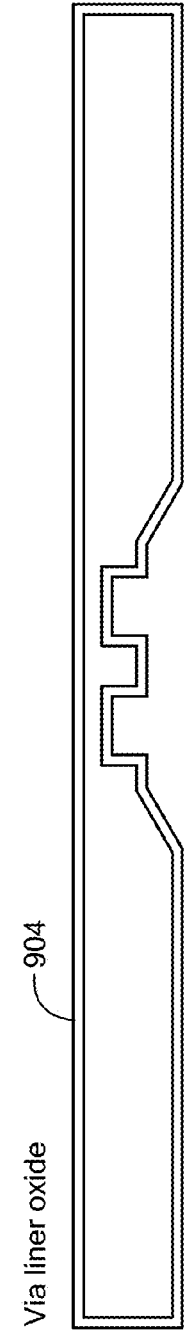
Figure 9D:
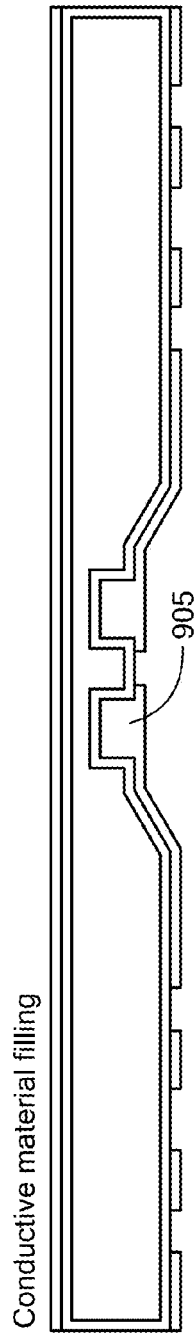

After that, a liner passivation layer 904 is deposited (see FIG. 9C). Conductive material 905 is then deposited filling in the bulk silicon trenches 903 (see FIG. 9D).

Figure 9E:
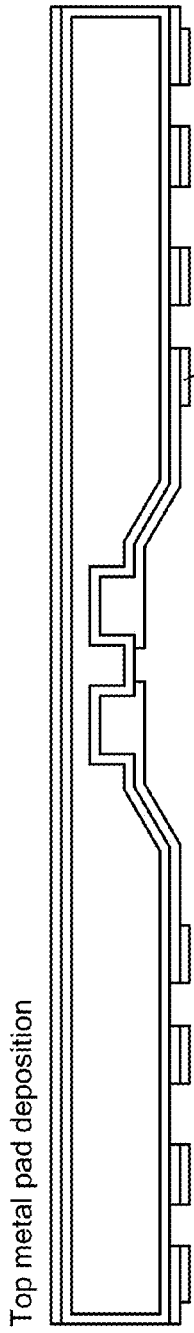
Figure 9F:
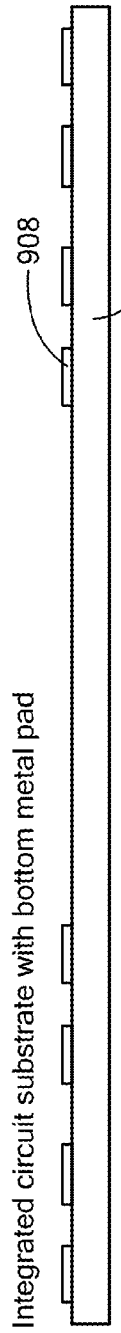
Figure 9G:
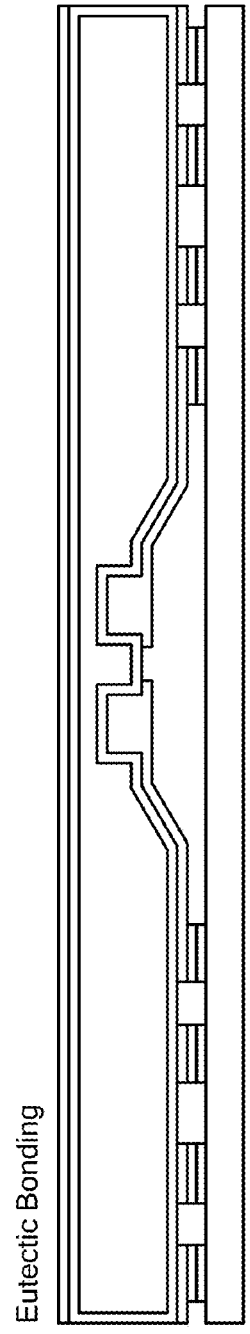
Figure 9H:
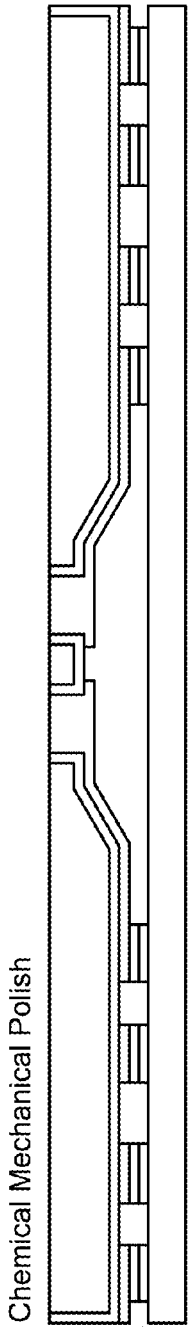

As seen in FIG. 9E, a conductive material is deposited and patterned to define top metal pad 906. This top metal pad 906 is also used to form a hermetic bonding ring structure. FIG. 9F shows the bottom metal pad 908 on the integrated circuit substrate 907, which is aligned with the top metal pad 906 on the silicon cap wafer 901. A hermetic eutectic or metal diffusion bonding is formed at elevated temperature (see FIG. 9G). The cavity 902 could be pressurized with a gaseous species. Next, the front side of the silicon substrate undergoes chemical mechanical polish to expose individual TSVs (see FIG. 9H) followed by another passivation layer deposition.

Figure 9I:
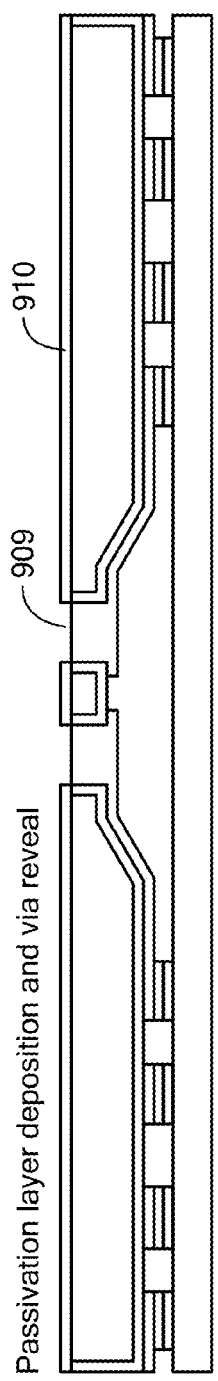
Figure 9J:
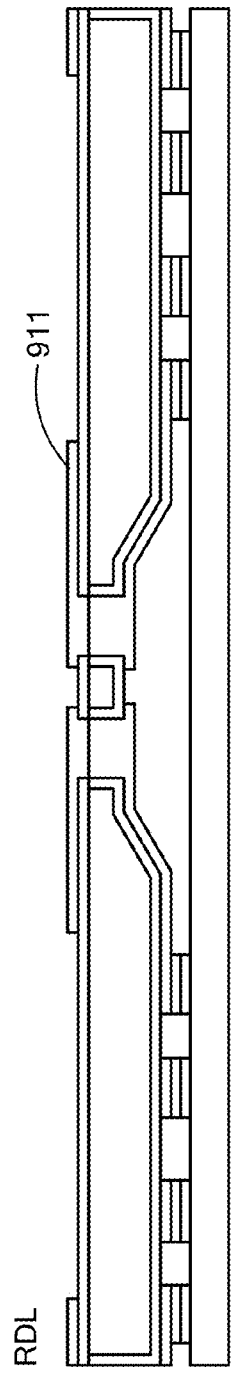
Figure 9K:
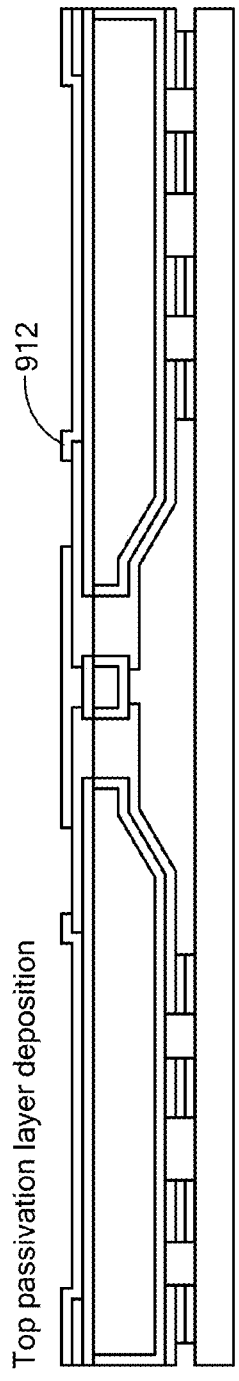
Figure 9L:
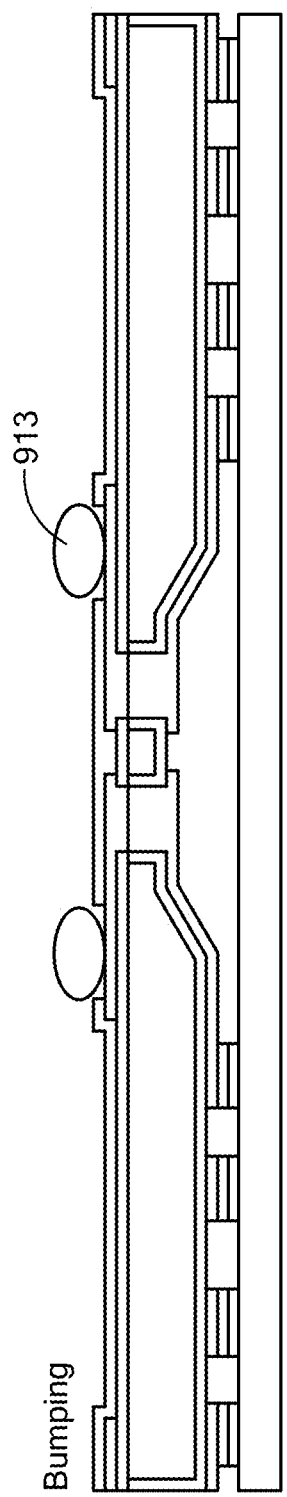
Figure 9M:
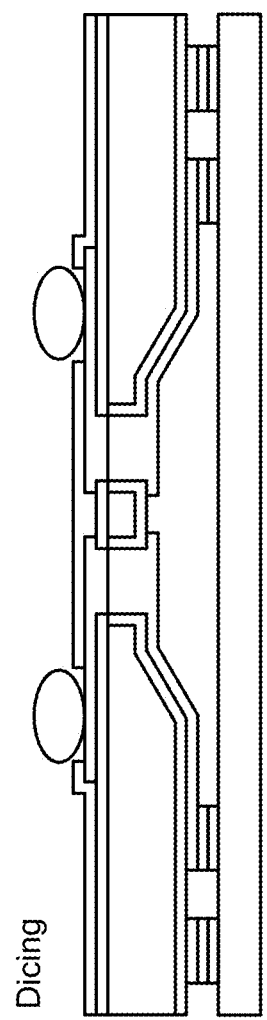

After that, vias are then defined by patterning followed by revealing vias 909 through etching passivation layer 910 (see FIG. 9I). Metal 911 is deposited on the top of the substrate and patterned to form a RDL (see FIG. 9J). Top passivation layer 912 is then formed (see FIG. 9K). Finally, the top side of the substrate is bumped 913 (see FIG. 9L) and diced (see FIG. 9M).

Example #7: Bulk WLCSP (TSV) on Silicon Cap Wafer

FIG. 10 illustrates another example of a detailed diagrammatic process flow of a MEMS device using TSV technology on the silicon cap wafer 1001 as described. The silicon cap wafer 1001 (see FIG. 10A) is selectively etched to form trenches 1002 with either dry etching such as DRIE or wet etching followed by deposition of a liner passivation layer 1003 (see FIG. 10B). The depth of these trenches 1002 could range from 10 um to 600 um. Conductive material 1004 is then deposited along the sidewall of the silicon trenches 1002 (see FIG. 10C). A filling material 1005 could fill up the trenches 1002 with either non-conductive filling material or conductive material (see FIG. 10D). Then the silicon cap wafer 1001 undergoes chemical mechanical polishing (see FIG. 10E).

As seen in FIG. 10F, a conductive material is deposited and patterned to define top metal pad 1006. This top metal pad 1006 is used to form a hermetic bonding ring structure and an electrical interconnect. After that, the silicon cap wafer 1001 is then selectively etched to form cavity 1007 as shown in FIG. 10G. FIG. 10H shows the bottom metal pad 1009 on the integrated circuit substrate 1008, which is then aligned with the top metal pad 1006 on the silicon cap wafer 1001. An additional cavity 1012 can be formed on the integrated circuit substrate 1008 (see FIG. 10J). A hermetic eutectic or metal diffusion bonding is formed at elevated temperature (see FIG. 10K). The cavity 1007 could be pressurized with a gaseous species. Next, the side of the silicon cap substrate 1001 that is opposite to the top metal pad undergoes chemical mechanical polishing to expose individual TSVs 1020 in the trenches 1002 (see FIG. 10L).

Figure 10A:
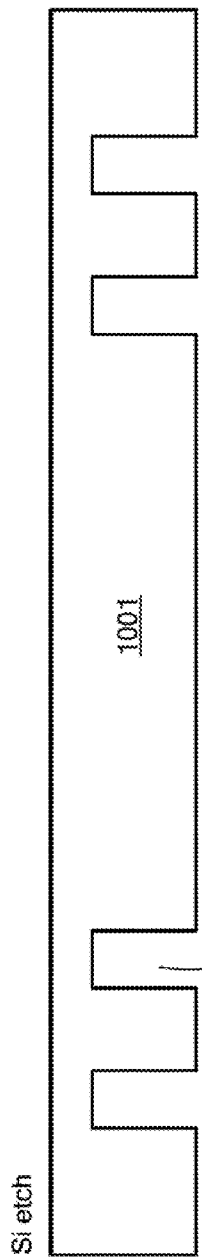
FIGS. 10A-10Q, collectively referred to as FIG. 10, illustrate another example of a detailed diagrammatic process flow of a MEMS device using bulk WLCSP technology on silicon CMOS wafer as described.
Figure 10B:
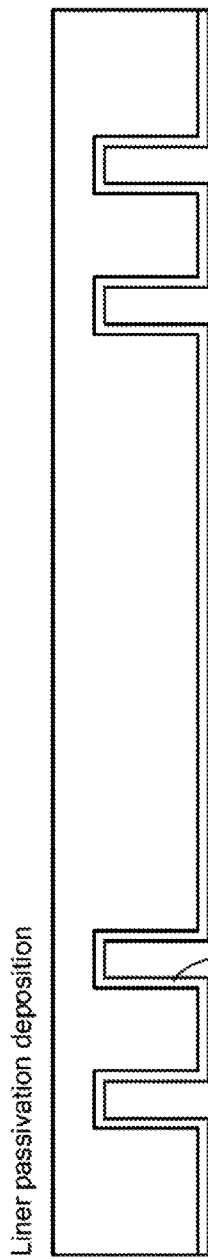
Figure 10C:
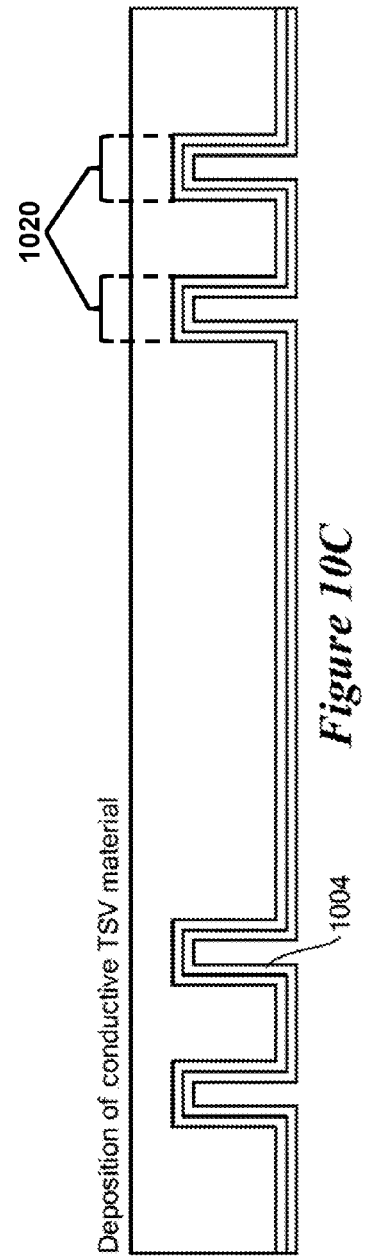
Figure 10M:
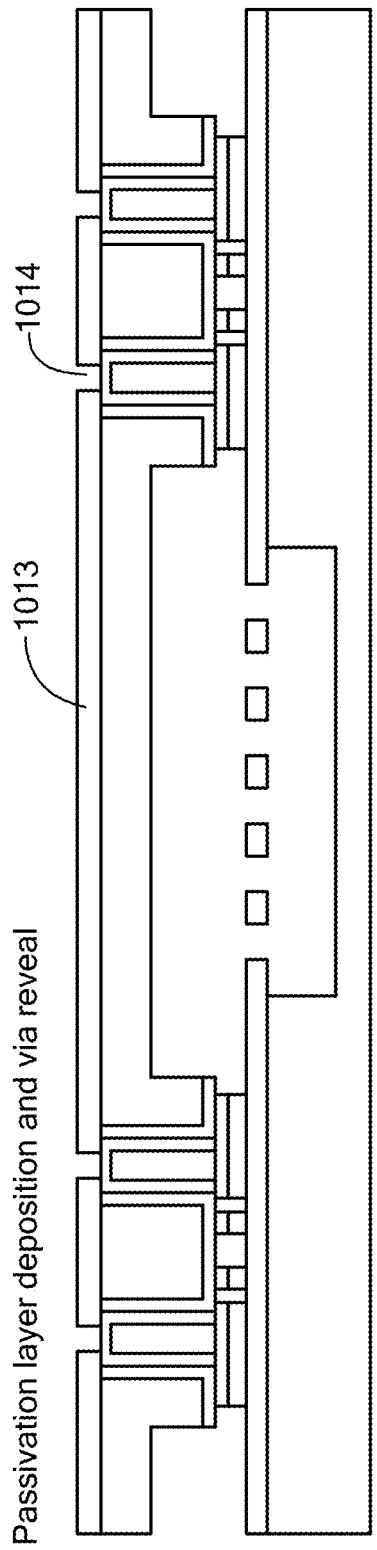
Figure 10N:
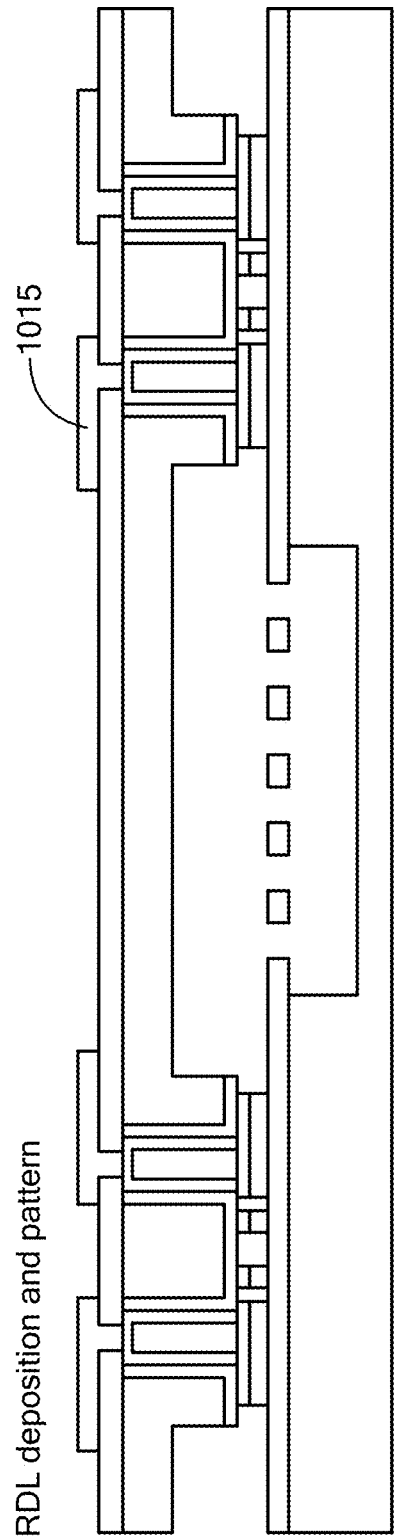
Figure 10O:
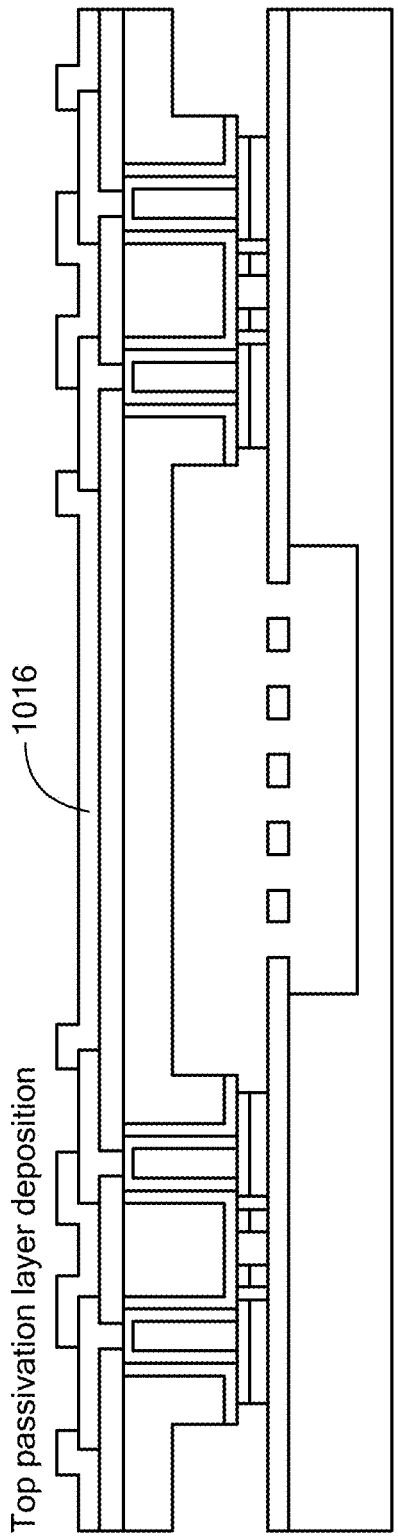
Figure 10P:
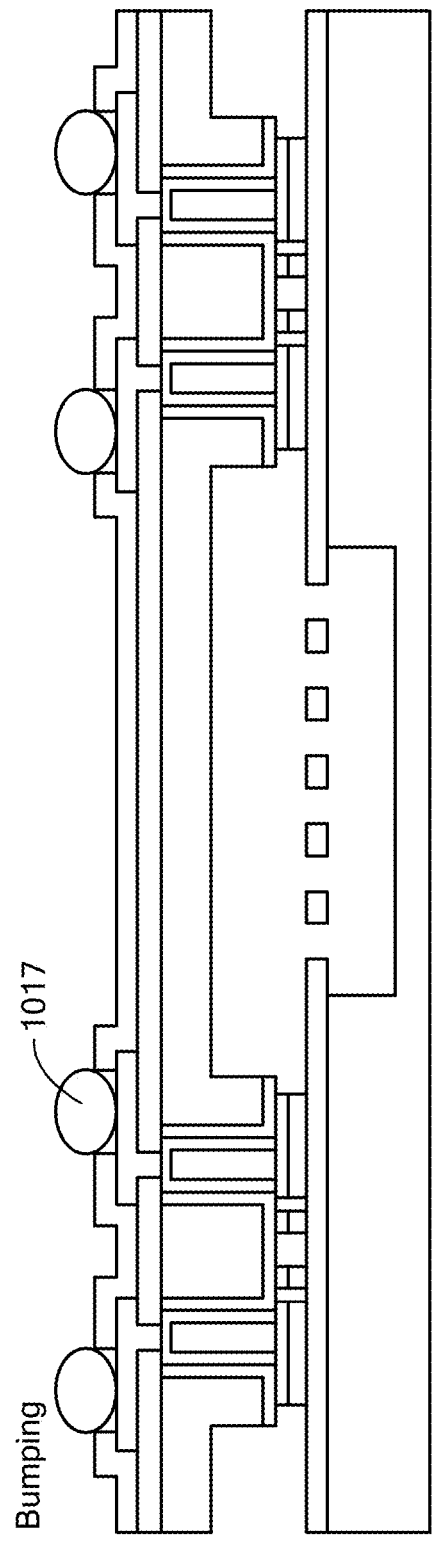
Figure 10Q:
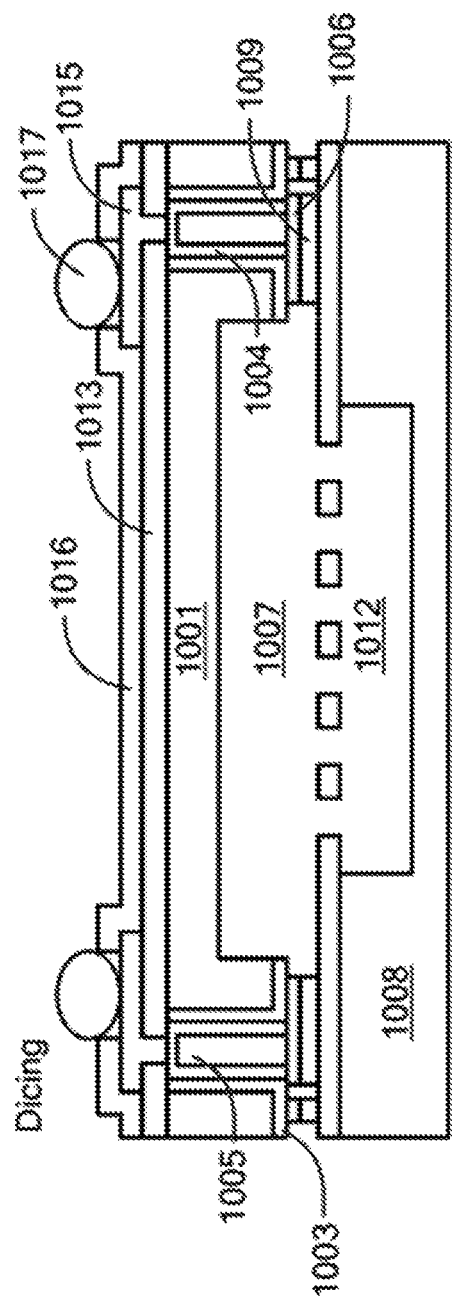
Figure 11A:
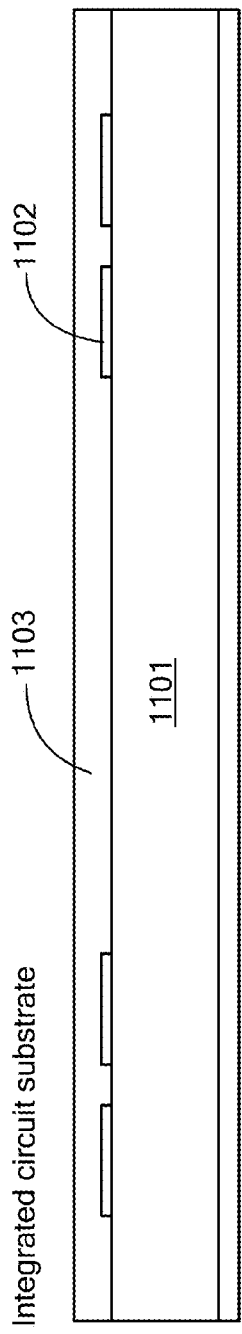
FIGS. 11A-11L, collectively referred to as FIG. 11, illustrate another example of a detailed diagrammatic process flow of a MEMS device using bulk WLCSP technology on silicon cap wafer.
Figure 11B:
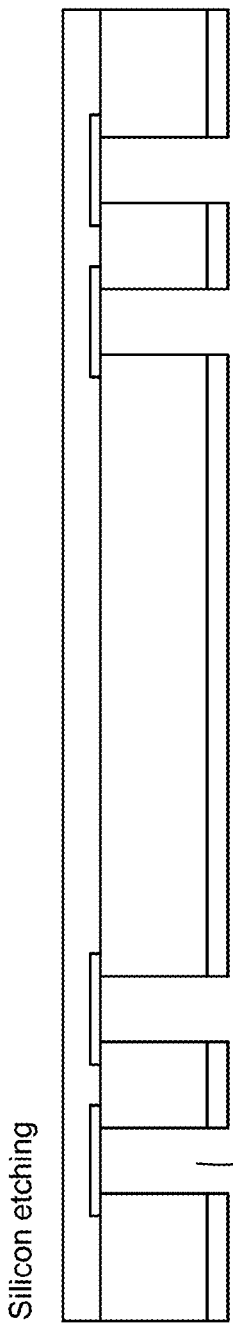
Figure 11C:
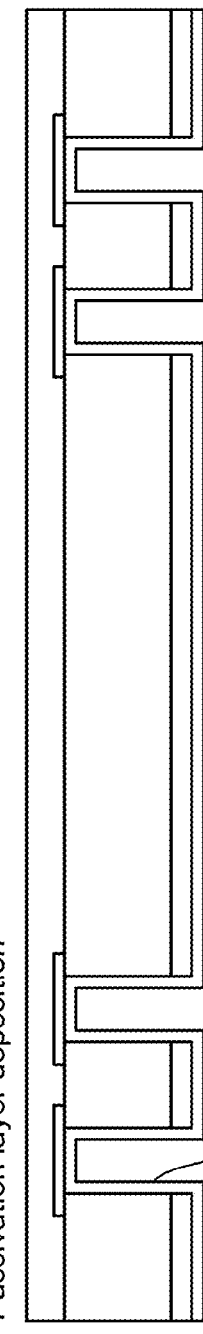
Figure 11D:
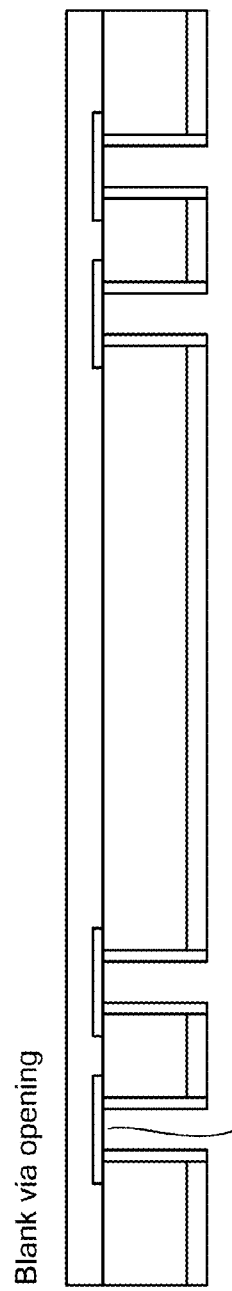
Figure 11E:
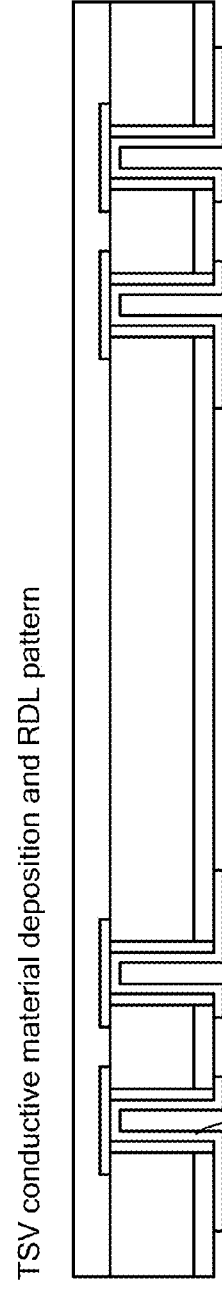
Figure 11F:
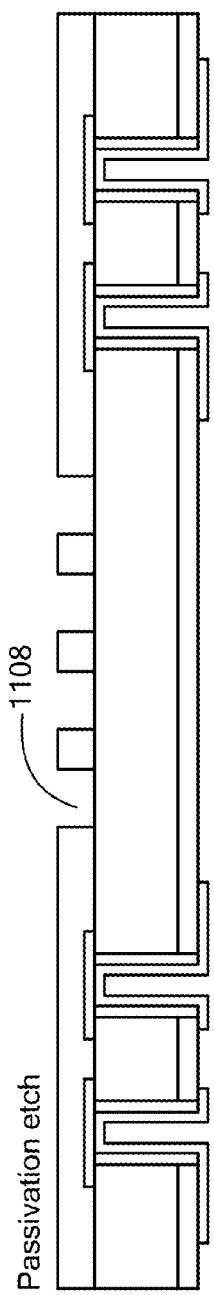
Figure 11G:
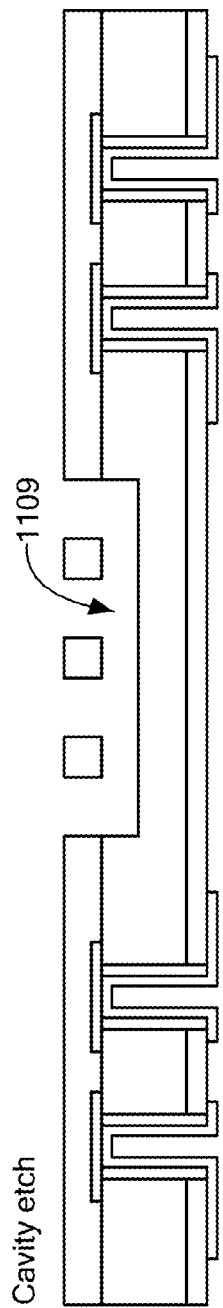
Figure 11H:
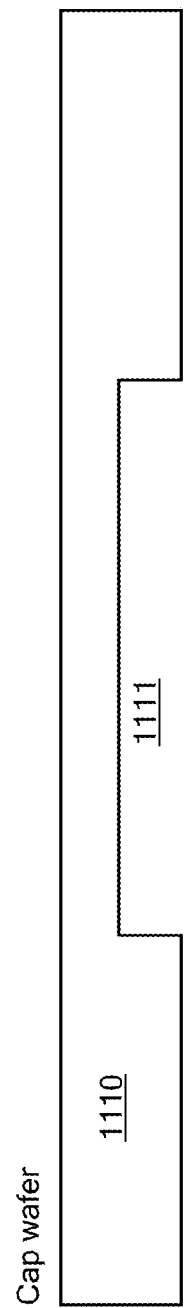
Figure 11I:
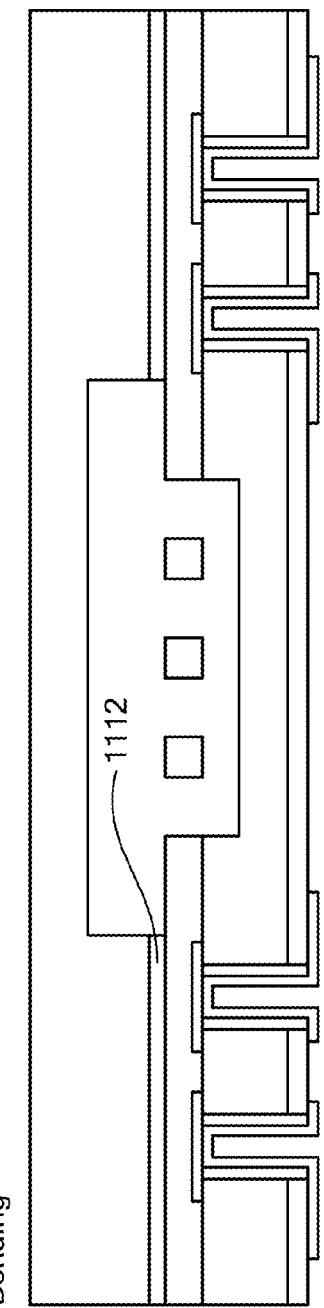
Figure 11J:
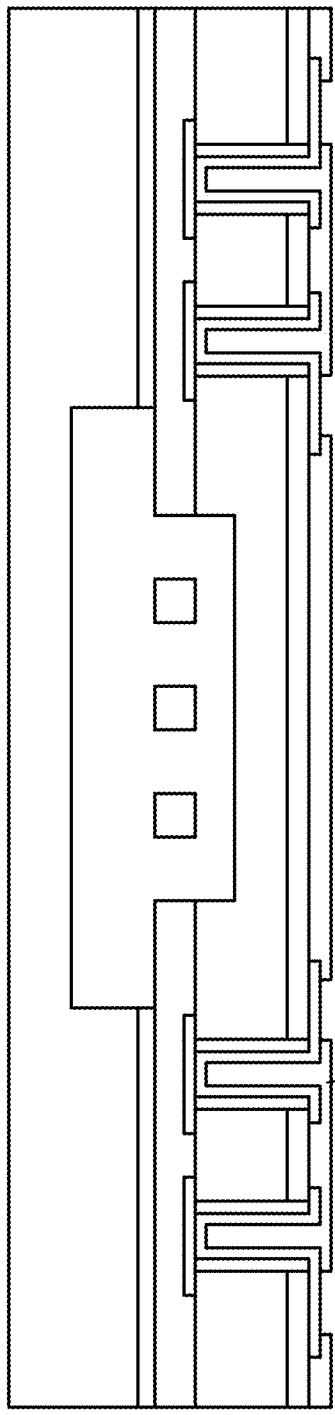
Figure 11K:
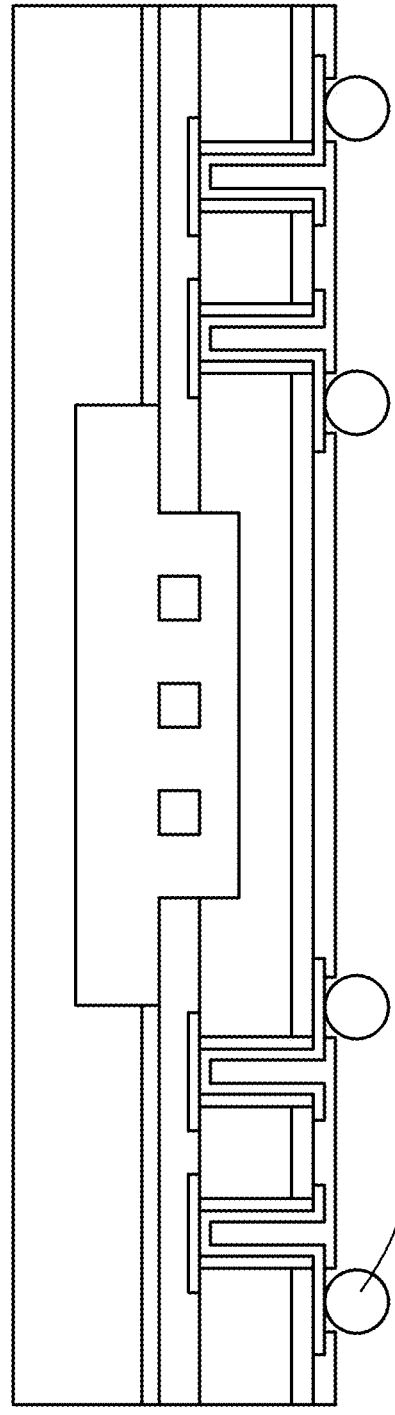
Figure 11L:
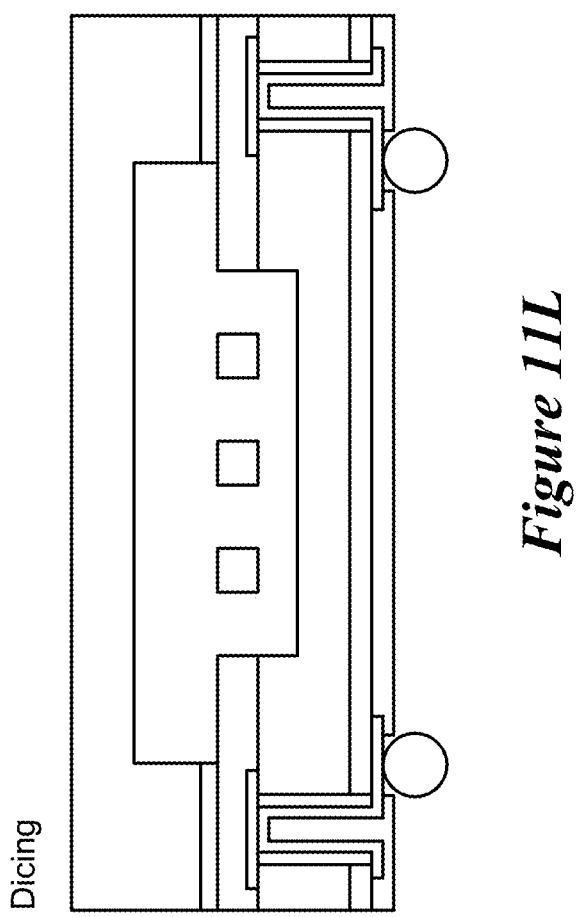

Next, a passivation layer 1013 is then deposited and vias 1020 are then defined by patterning followed by revealing vias 1020 through etching the passivation layer 1013 (see FIG. 10M). A metal layer 1015 is deposited and patterned to form a RDL 1014 (see FIG. 10N). Top passivation layer 1016 is then formed (see FIG. 10O). Finally, the top side of the substrate is bumped 1017 (see FIG. 10P) and diced (see FIG. 10Q).

Example #8: Bulk WLCSP (TSV) on Silicon CMOS Wafer

FIG. 11 illustrates another example of a detailed diagrammatic process flow of a MEMS device using TSV technology on silicon CMOS wafer as described. The starting substrate is a silicon CMOS wafer 1101 with conductive layer 1102 and passivation layer 1103. There is also a passivation layer on the other side of the substrate. The conductive layer 1101 could be a first-level metal layer (M1) of the CMOS process. The silicon wafer 1101 is etched with either dry etching or wet etching from the backside of the substrate (see FIG. 11B) to form silicon trench 1104. The depth of silicon trench 1104 could range from 10 um to 600 um. After that, a liner passivation layer 1105 is deposited (see FIG. 11C). As seen in FIG. 11D, the substrate 1101 undergoes blank etching of the passivation layer to open up via 1106 at the bottom of the trenches followed by a conductive material deposition on the sidewall of the trenches forming TSV interconnect. Such conducive metal could be copper and is patterned to form RDL layer (see FIG. 11E). Next, the top passivation layer 1103 is patterned and etched to from openings 1108 that expose underlying silicon substrate (see FIG. 11F). After that cavity 1109 is formed by exposing the substrate to reactive ion etching (see FIG. 11G). At the same time, a cap wafer 1110 either made of silicon or glass is etched to form cavity 1111 (see FIG. 11H). As shown in FIG. 11I, the cap wafer is bonded to the silicon CMOS wafer 1101 by adhesion layer 1112. The adhesion layer could be epoxy. The adhesion layer could also be formed by a hermetic eutectic or metal diffusion bonding at elevated temperature (see FIG. 11F). Both cavity 1111 and 1109 could be pressurized with a gaseous species. After that, a passivation layer 1113 is formed over covering the RDL layer and is patterned to form via openings (see FIG. 11J). Example of non-conducive material is epoxy, SU-8 (from Shell Chemical), polyimide, or benzocyclobutene (BCB). Finally the substrate is bumped (see FIG. 11k) and diced (see FIG. 11L).

Example #9: Bulk WLCSP (TSV) on Silicon CMOS Wafer

FIG. 12 illustrates another example of a detailed diagrammatic process flow of a MEMS device using TSV technology on silicon CMOS wafer as described. The starting substrate is a silicon CMOS wafer 1201 with passivation layer 1202. There is also a passivation layer on the other side of the substrate. The silicon wafer 1201 is patterned and etched with either dry etching or wet etching from the front side of the substrate (see FIG. 12B) to form silicon trenches 1203. The depth of the silicon trenches 1203 could range from 10 um to 600 um.

Figure 12A:
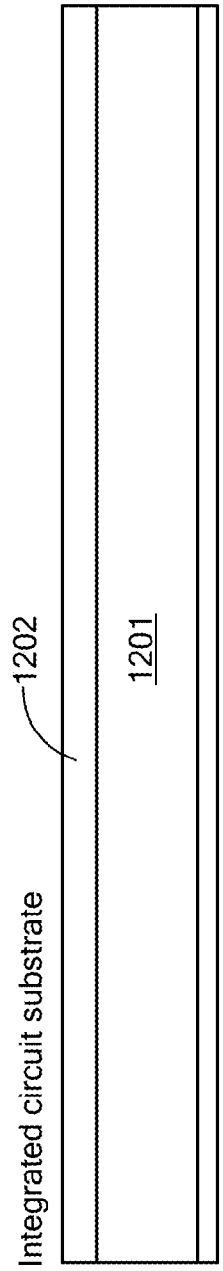
FIGS. 12A-12Q, collectively referred to as FIG. 12, illustrate another example of a detailed diagrammatic process flow of a MEMS device using bulk WLCSP technology on silicon CMOS wafer.
Figure 12B:
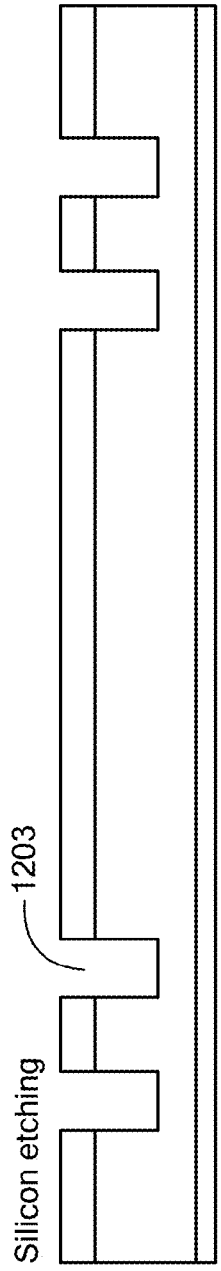
Figure 12C:
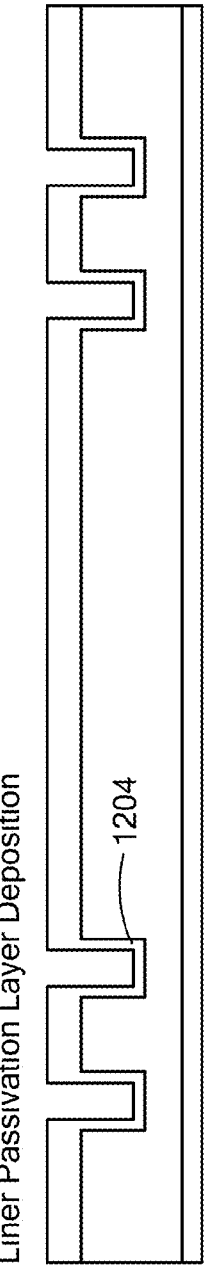
Figure 12D:
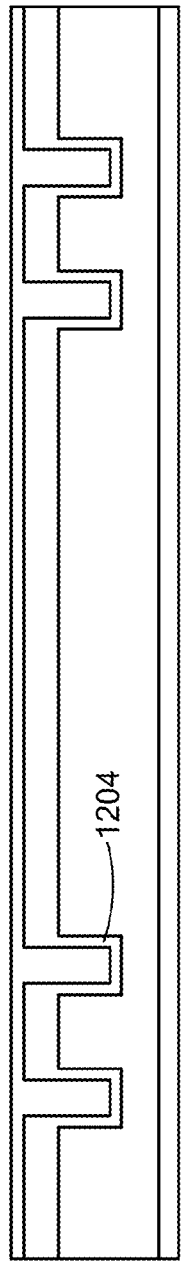
Figure 12E:
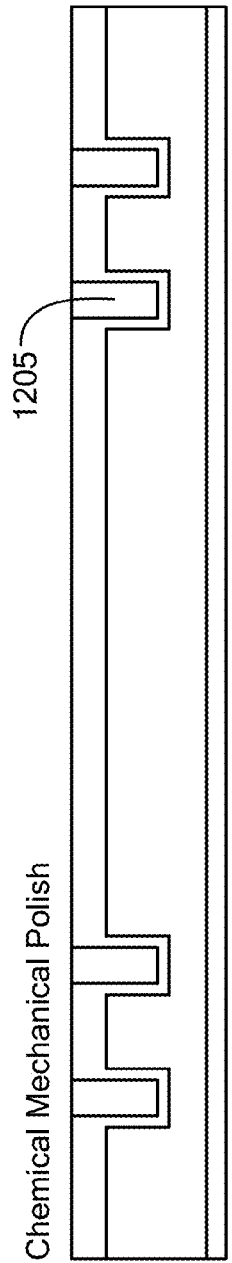

After that, a liner passivation layer 1204 is deposited (see FIG. 12C). As seen in FIG. 12D, the substrate 1201 undergoes a conductive material sputtering as a seed layer 1204 both on the surface of the wafer and the sidewall of the trenches followed by a plating deposition filling up the silicon trenches. After that a chemical mechanical polish (see FIG. 12E) is performed to form individual TSV interconnects 1205. Such conductive metal could be copper.

Figure 12F:
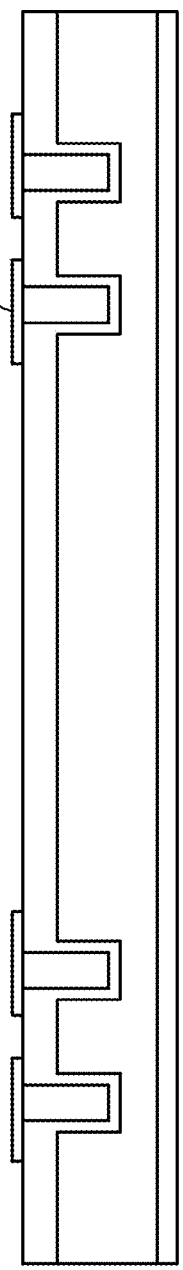
Figure 12G:
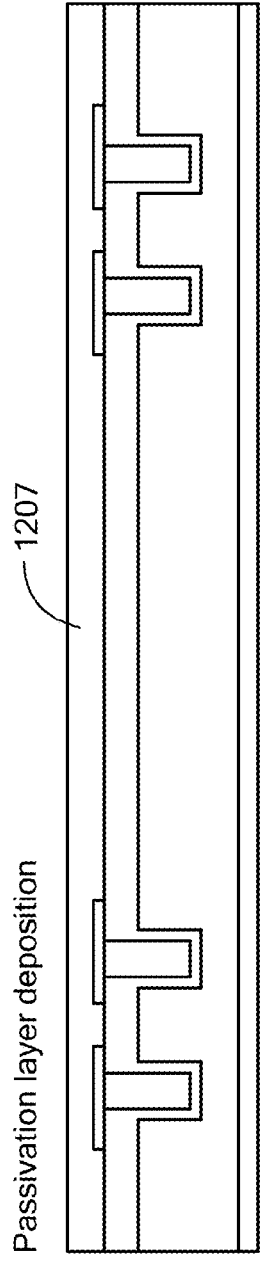
Figure 12H:
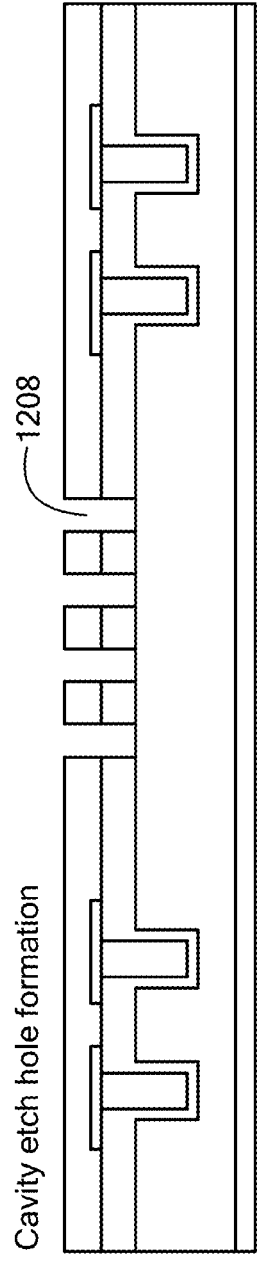
Figure 12I:
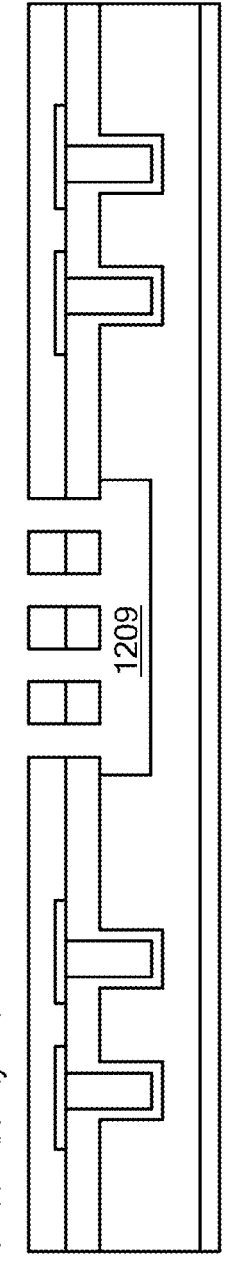
Figure 12J:
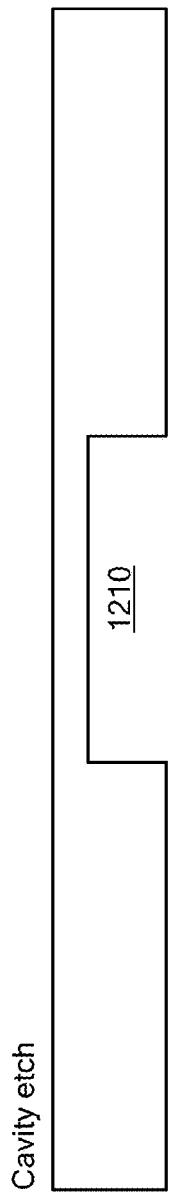
Figure 12K:
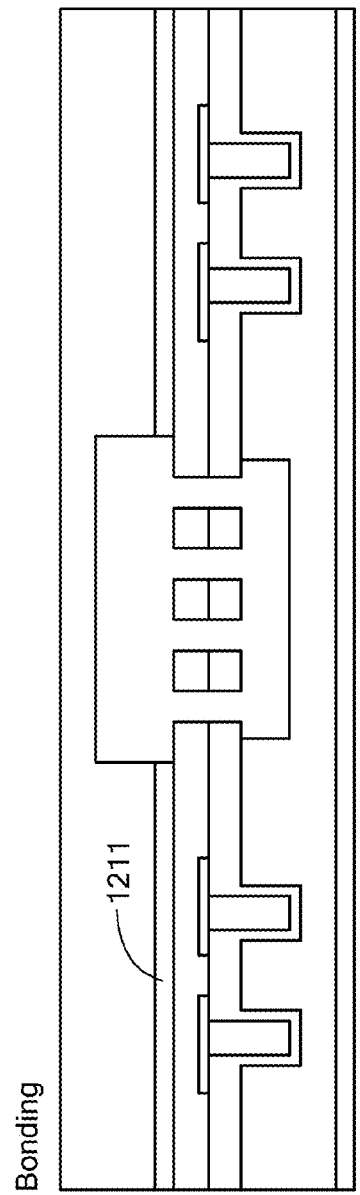
Figure 12L:
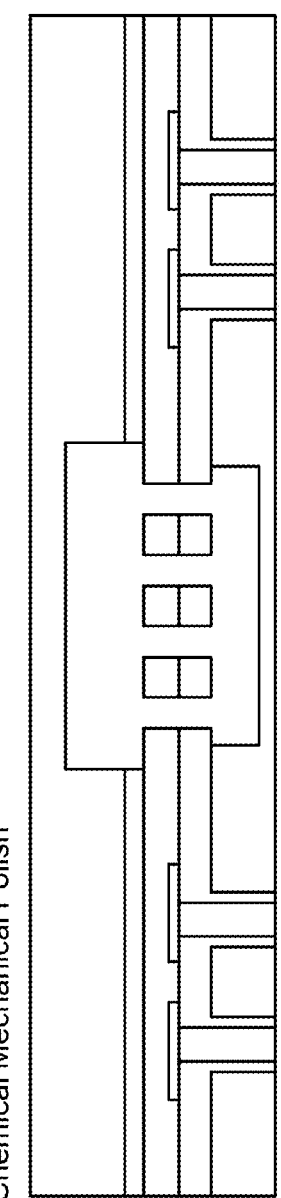
Figure 12M:
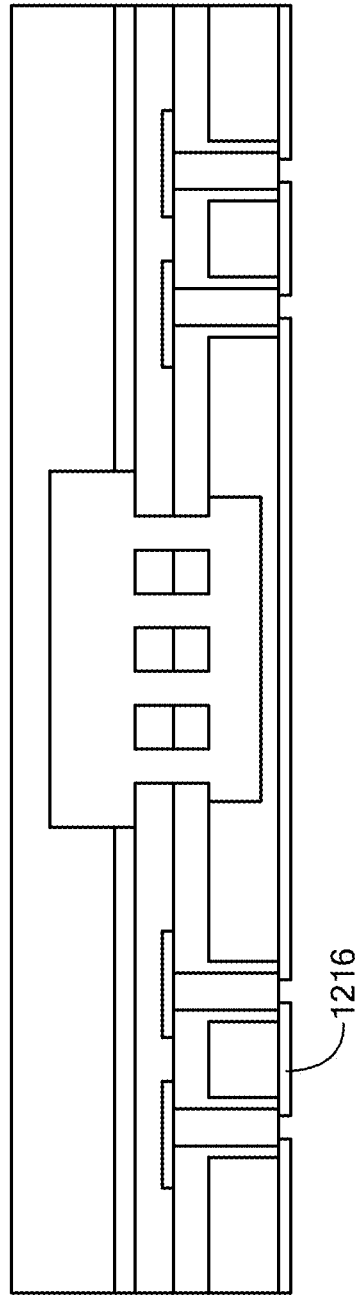
Figure 12N:
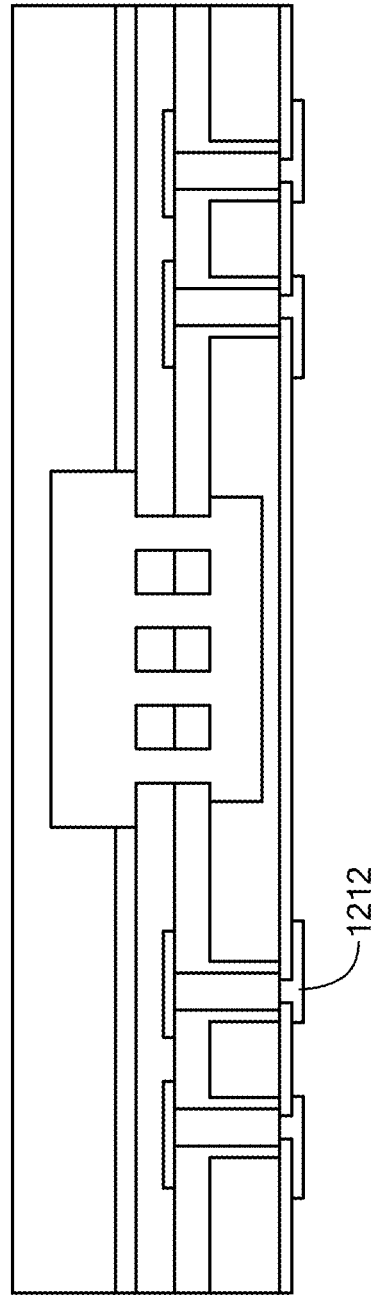
Figure 12O:
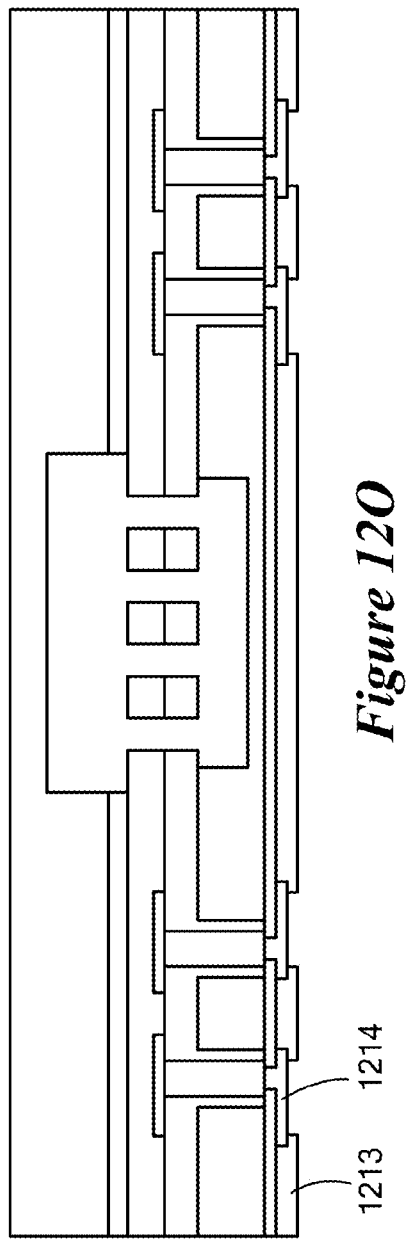
Figure 12P:
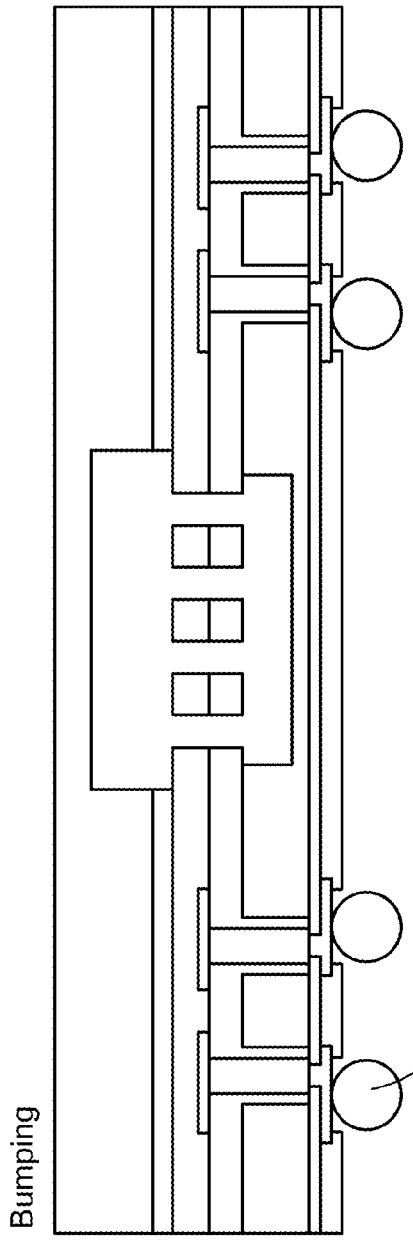
Figure 12Q:
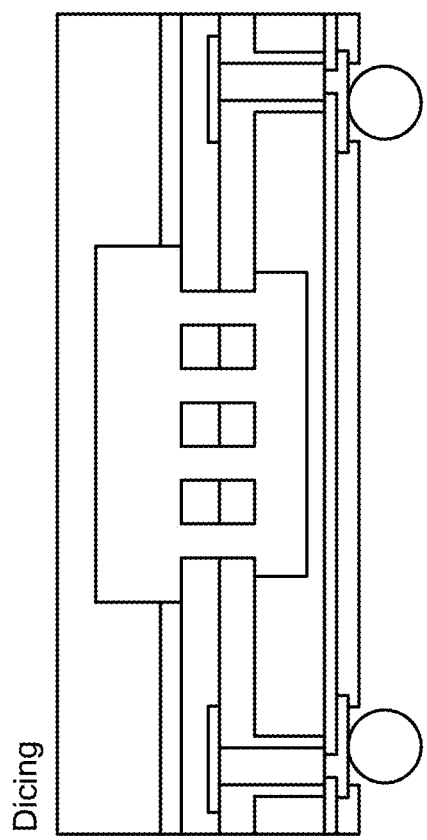

Next, another metal layer is deposited and patterned to form RDL layer 1206 (see FIG. 12F). The RDL layer could be M1 of standard CMOS process. After that, passivation layer 1207 is deposited (see FIG. 12G) to protect the underlying metal layer. The passivation layer is then patterned and etched to form openings 1208 that expose the underlying silicon substrate (see FIG. 12H). After that a cavity 1209 is formed by exposing the substrate to reactive ion etching (see FIG. 12I). At the same time, a chip scale package layer either made of silicon or glass is etched to form cavity 1210 (see FIG. 12J). As shown in FIG. 12K, the chip scale package layer is bonded to the silicon wafer 1201 by adhesion layer 1211. The adhesion layer could be epoxy. The adhesion layer could also be formed by a hermetic, eutectic or metal diffusion bonding at elevated temperature. Both cavity 1210 and 1209 could be pressurized with a gaseous species.

After that, a chemical mechanical polish is performed on the backside of the bonded structure to expose individual TSV interconnects. Next, a passivation layer 1216 is formed over (and covering) the exposed silicon substrate 1201. The passivation layer 1216 is patterned to form via openings to the TSV interconnects 1205 (see FIG. 12M). As a non-limiting example, the passivation material may be epoxy, SU-8 (from Shell Chemical), polyimide, solder mask or benzocyclobutene (BCB). Next, a metal layer is deposited and patterned to form a RDL layer 1212 (see FIG. 12N) followed by another passivation layer 1213 (see FIG. 12O). The passivation layer is patterned to form openings 1214 to the RDL layer 1212. Next bumping (see FIG. 12P) and dicing (see FIG. 12Q) is performed.

As described above, various embodiments provide a method, apparatus and computer program(s) to manufacture an integrated circuit device.

Figure 13:
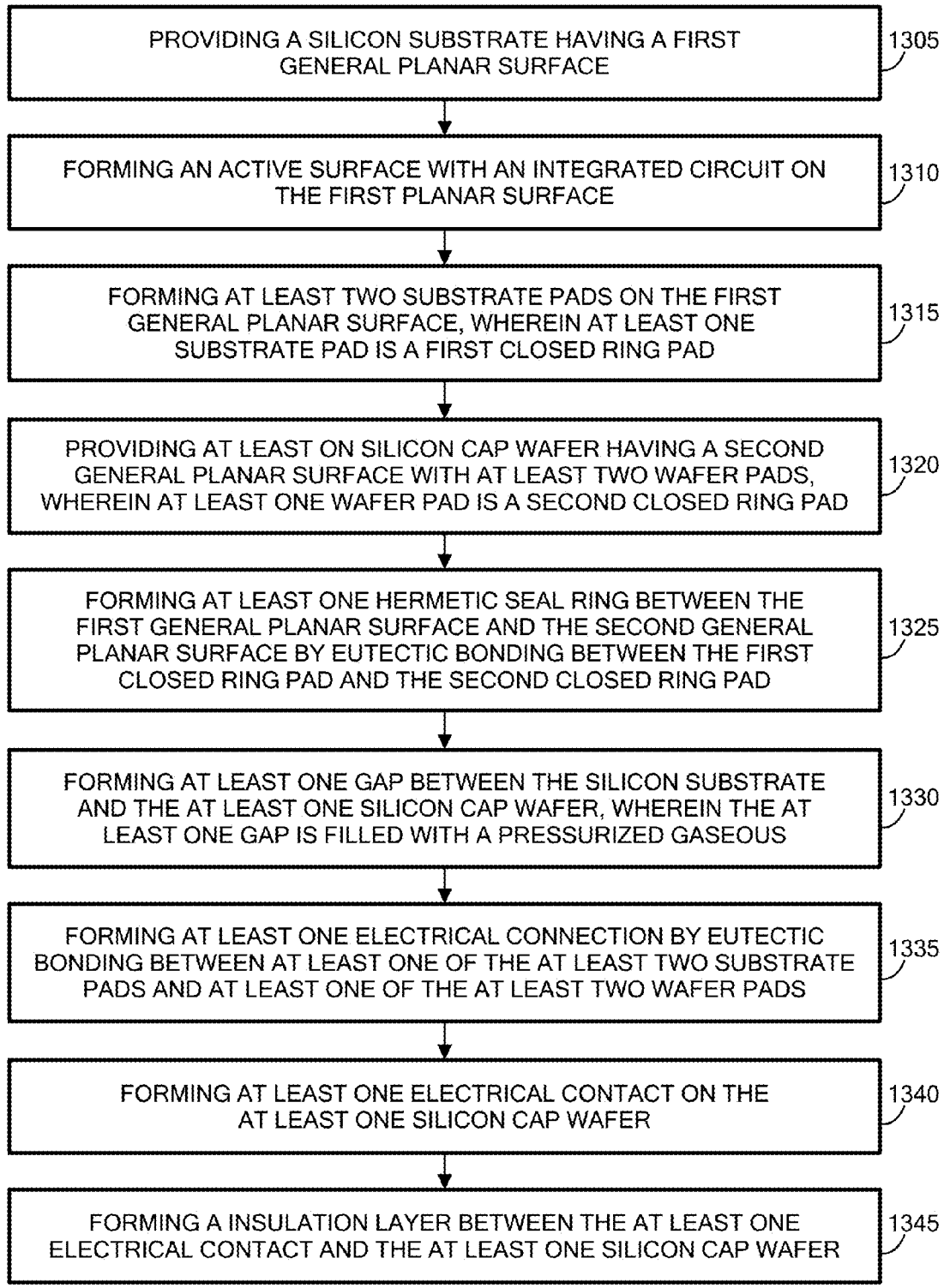
FIG. 13 is a logic flow diagram that illustrates the operation of a first method, and a result of execution of computer program instructions embodied on a computer readable memory, in accordance with various embodiments.

FIG. 13 is a logic flow diagram that illustrates a method, and a result of execution of computer program instructions, in accordance with embodiments. In accordance with this embodiment a method performs, at Block 1305, a step of providing a silicon substrate having a first general planar surface. A step of forming an active surface with an integrated circuit on the first general planar surface is performed at Block 1310. At Block 1315 the method performs a step of forming at least two substrate pads on the first general planar surface, wherein at least one substrate pad is a first closed ring pad.

A step of providing at least one silicon cap wafer having a second general planar surface with at least two wafer pads, wherein at least one wafer pad is a second closed ring pad is performed at Block 1320. The at least one silicon cap wafer also has a third slanted surface with an angle to the second general planar surface and has a fourth general planar surface. The method performs, at Block 1325, a step of forming at least one hermetic seal ring between the first general planar surface and the second general planar surface by eutectic or metal diffusion bonding between the first closed ring pad and the second closed ring pad. A step of forming at least one gap between the silicon substrate and the at least one silicon cap wafer, wherein the at least one gap is filled with a pressurized gaseous species is performed at Block 1330. Alternatively, the gap may be formed between the silicon substrate, the third slanted surface and the at least one silicon cap wafer. The third slanted surface may be internal to the packaged MEMS device.

At Block 1335 the method performs a step of forming at least one electrical connection by eutectic or metal diffusion bonding between at least one of the at least two substrate pads and at least one of the at least two wafer pads. A step of forming at least one electrical contact on the at least one silicon cap wafer is performed at Block 1340. A first portion of the at least one electrical contact is formed over the fourth general planar surface, a second portion of the at least one electrical contact is formed over the third slanted surface, and a third portion of the at least one electrical contact is formed over the at least one electrical connection. The method performs, at Block 1345, a step of forming an insulation layer between the at least one electrical contact and the at least one silicon cap wafer.

Figure 14:
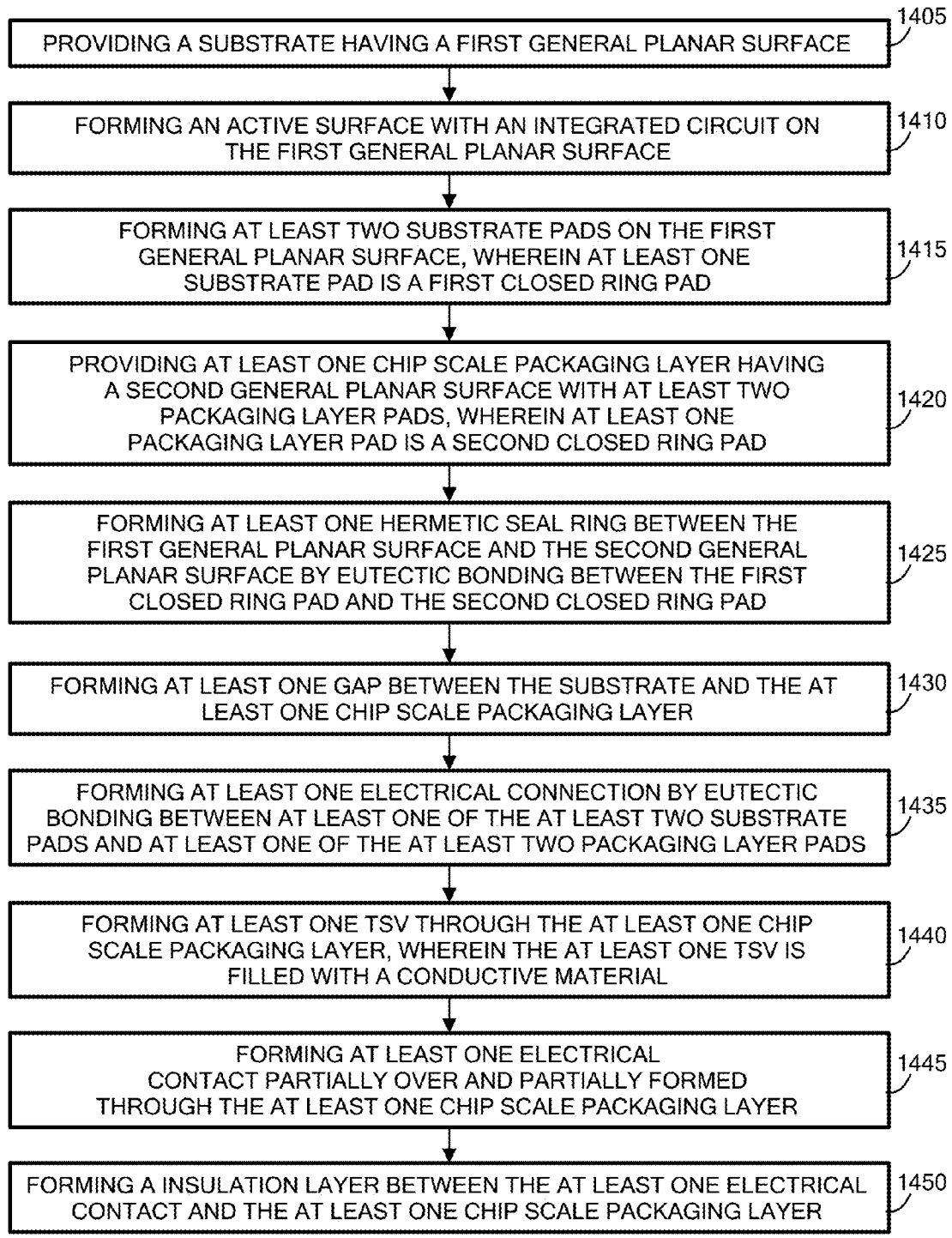
FIG. 14 is another logic flow diagram that illustrates the operation of a second method, and a result of execution of computer program instructions embodied on a computer readable memory, in accordance with various embodiments.

FIG. 14 is a logic flow diagram that illustrates a method, and a result of execution of computer program instructions, in accordance with embodiments. In accordance with this further embodiment a method performs, at Block 1405, a step of providing a substrate having a first general planar surface. A step of forming an active surface with an integrated circuit on the first general planar surface is performed at Block 1410. At Block 1415 the method performs a step of forming at least two substrate pads on the first general planar surface, wherein at least one substrate pad is a first closed ring pad.

A step of providing at least one chip scale packaging layer having a second general planar surface with at least two packaging layer pads, wherein at least one packaging layer pad is a second closed ring pad is performed at Block 1420. The at least one chip scale packaging layer also has a third slanted surface with an angle to the second general planar surface and has a fourth general planar surface. The method performs, at Block 1425, a step of forming at least one hermetic seal ring between the first general planar surface and the second general planar surface by eutectic or metal diffusion bonding between the first closed ring pad and the second closed ring pad. A step of forming at least one gap between the substrate and the at least one chip scale packaging layer is performed at Block 1430. At Block 1435 the method performs a step of forming at least one electrical connection by eutectic or metal diffusion bonding between at least one of the at least two substrate pads and at least one of the at least two packaging layer pads.

A step of forming at least one TSV through the at least one chip scale packaging layer, wherein the at least one TSV is filled with a conductive material is performed at Block 1440. The method performs, at Block 1445, a step of forming at least one electrical contact partly over and partly formed through the at least one chip scale packaging layer. A first portion of the at least one electrical contact is formed over the fourth general planar surface, a second portion of the at least one electrical contact is formed over the third slanted surface, a third portion of the at least one electrical contact is formed through the at least one TSV, and a fourth portion of the at least one electrical contact is formed over the at least one electrical connection. A step of forming an insulation layer between the at least one electrical contact and the at least one chip scale packaging layer is performed at Block 1450.

The various blocks shown in FIGS. 12-13 may be viewed as method steps, as operations that result from use of computer program code, and/or as one or more logic circuit elements constructed to carry out the associated function(s), for example, by controlling automated semiconductor manufacturing machinery.

Any of the operations described that form part of the presently disclosed embodiments may be useful machine operations. Various embodiments also relate to a device or an apparatus for performing these operations. The apparatus can be specially constructed for the required purpose, or the apparatus can be a general-purpose computer selectively activated or configured by a computer program stored in the computer. In particular, various general-purpose machines employing one or more processors coupled to one or more computer readable medium, described below, can be used with computer programs written in accordance with the teachings herein, or it may be more convenient to construct a more specialized apparatus to perform the required operations.

The procedures, processes, and/or modules described herein may be implemented in hardware, software, embodied as a computer-readable medium having program instructions, firmware, or a combination thereof. For example, the functions described herein may be performed by a processor executing program instructions out of a memory or other storage device.

The foregoing description has been directed to particular embodiments. However, other variations and modifications may be made to the described embodiments, with the attainment of some or all of their advantages. It will be further appreciated by those of ordinary skill in the art that modifications to the above-described systems and methods may be made without departing from the concepts disclosed herein. Accordingly, the invention should not be viewed as limited by the disclosed embodiments. Furthermore, various features of the described embodiments may be used without the corresponding use of other features. Thus, this description should be read as merely illustrative of various principles, and not in limitation of the invention.

What is claimed is:

1. A packaged micro-electro-mechanical-system (MEMS) device comprising:
   a silicon substrate having a first surface, and a second surface, wherein the second surface is on a side opposite the first surface;
   at least one top substrate pad formed on said first surface;
   an integrated circuit substrate having at least one bottom substrate pad bonded to the at least one top substrate pad;
   at least one recess in the silicon substrate;
   at least one other recess in the integrated circuit substrate, wherein the at least one recess in the silicon substrate and the at least one other recess in the integrated circuit substrate define at least one cavity, wherein the at least one cavity is filled with a pressurized gaseous species and a pressure of the gaseous species ranges from one of: 1 bar to 10 bar; 1 bar to 5 bar; and 1 bar to 3 bar;
   at least one through silicon via (TSV) formed through the silicon substrate, the at least one TSV being connected to the at least one top substrate pad, wherein said at least one TSV comprises a linear passivation layer, a conductive material, and a filling material, wherein the linear passivation layer is disposed on the silicon substrate along sidewalls of the at least one TSV, and the conductive material is disposed on the linear passivation layer in the at least one TSV;
   a metal layer formed over the second surface and disposed over the at least one TSV;
   at least one electrical bump formed over the metal layer on the second surface of said silicon substrate, wherein each of the at least one electrical bump is in electrical contact with the metal layer, the conductive material in the at least one TSV, and the at least one top substrate pad; and a substrate passivation layer formed between the metal layer and said silicon substrate.

2. The packaged MEMS device according to claim 1, wherein the conductive material comprises one of: in-situ doped polysilicon and copper.

3. The packaged MEMS device according to claim 1, wherein the at least one top substrate pad is a first-level metal layer of a standard complementary metal-oxide-semiconductor (CMOS) process.

4. The packaged MEMS device according to claim 1, wherein the at least one bottom substrate pad is bonded to the at least one top substrate pad using one of: a eutectic bonding and a metal diffusion bonding.

5. The packaged MEMS device according to claim 1, wherein the at least one bottom substrate pad is bonded to the at least one top substrate pad using an adhesion layer bonding.

6. The packaged MEMS device according to claim 5, wherein the adhesion layer bonding comprises an epoxy.

7. The packaged MEMS device according to claim 1, wherein the conductive material comprises in-situ doped polysilicon and copper.

8. The packaged MEMS device according to claim 1, wherein the pressure of the gaseous species ranges from 1 bar to 10 bar.

9. The packaged MEMS device according to claim 1, wherein the pressure of the gaseous species ranges from 1 bar to 3 bar.

10. The packaged MEMS device according to claim 1, wherein the linear passivation layer is further disposed on the first surface of the silicon substrate.

11. The packaged MEMS device according to claim 1, wherein the at least one TSV has a depth from 10 um to 600 um.

12. The packaged MEMS device according to claim 1, wherein the filling material in the at least one TSV comprising a non-conductive filling material.

13. The packaged MEMS device according to claim 1, wherein the filling material in the at least one TSV comprising a conductive filling material.

14. The packaged MEMS device according to claim 1, wherein the at least one top substrate pad forms an electrical interconnect.

15. The packaged MEMS device according to claim 1, wherein the metal layer formed over the second surface is at least a part of a redistribution layer.

* * * * *